(12) United States Patent
Morikawa et al.

(10) Patent No.: US 8,000,126 B2
(45) Date of Patent: Aug. 16, 2011

(54) SEMICONDUCTOR DEVICE WITH RECORDING LAYER CONTAINING INDIUM, GERMANIUM, ANTIMONY AND TELLURIUM

(75) Inventors: Takahiro Morikawa, Hachioji (JP); Motoyasu Terao, Hinode (JP); Norikatsu Takaura, Tokyo (JP); Kenzo Kurotsuchi, Kodaira (JP); Nozomu Matsuzaki, Kodaira (JP); Yoshihisa Fujisaki, Hachioji (JP); Masaharu Kinoshita, Kokubunji (JP); Yuichi Matsui, Kawasaki (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 210 days.

(21) Appl. No.: 12/522,744

(22) PCT Filed: Jan. 11, 2007

(86) PCT No.: PCT/JP2007/050269
§ 371 (c)(1),
(2), (4) Date: Jul. 10, 2009

(87) PCT Pub. No.: WO2008/084545
PCT Pub. Date: Jul. 17, 2008

(65) Prior Publication Data
US 2010/0096613 A1    Apr. 22, 2010

(51) Int. Cl.
*G11C 11/00* (2006.01)
*H01L 29/66* (2006.01)
(52) U.S. Cl. .............. 365/148; 257/2; 257/E27.047
(58) Field of Classification Search ............ 365/148; 257/2, E27.047
See application file for complete search history.

(56) References Cited

U.S. PATENT DOCUMENTS

| 5,254,382 A | 10/1993 | Ueno et al. |
| 5,883,827 A | 3/1999 | Morgan |
| 2004/0233748 A1 | 11/2004 | Terao et al. |
| 2009/0108247 A1 | 4/2009 | Takaura et al. |

FOREIGN PATENT DOCUMENTS

| JP | 2002-109797 A | 4/2002 |
| JP | 2003-100991 A | 4/2003 |
| JP | 2004-289029 A | 10/2004 |
| JP | 2005-117030 A | 4/2005 |

OTHER PUBLICATIONS

Lai et al, "OUM-A 180 nm Nonvolatile Memory Cell Element Technology for Stand Alone and embedded Applications", IEEE International Electron Devices Meeting, Technical Digest, 2001, pp. 803-806.
Lankhorst et al, "Low-cost and nanoscale non-volatile memory concept for future silicon chips", Nature Materials, vol. 4, Apr. 2005, pp. 347-352, Nature Publishing Group.
Non-published U.S. Appl. No. 12/094,403.

*Primary Examiner* — Evan Pert
(74) *Attorney, Agent, or Firm* — Miles & Stockbridge P.C.

(57) ABSTRACT

A phase change memory is formed of a plug buried within a through-hole in an insulating film formed on a semiconductor substrate, an interface layer formed on the insulating film in which the plug is buried, a recording layer formed of a chalcogenide layer formed on the interface layer, and an upper contact electrode formed on the recording layer. The recording layer storing information according to resistance value change is made of chalcogenide material containing indium in an amount range from 20 atomic % to 38 atomic %, germanium in a range from 9 atomic % to 28 atomic %, antimony in a range from 3 atomic % to 18 atomic %, and tellurium in a range from 42 atomic % to 63 atomic %, where the content of germanium larger than or equal to the content of antimony.

19 Claims, 23 Drawing Sheets

| STATE OF RECORDING LAYER 52 | AMORPHOUS PHASE | CRYSTALLINE PHASE |
|---|---|---|
| RESISTANCE OF RECORDING LAYER 52 | HIGH RESISTANCE | LOW RESISTANCE |

SEMICONDUCTOR DEVICE WITH RECORDING LAYER CONTAINING INDIUM, GERMANIUM, ANTIMONY AND TELLURIUM

TECHNICAL FIELD

The present invention relates to a semiconductor device, and, in particular, to a technique effectively applied to a semiconductor device provided with a memory element including phase change material.

BACKGROUND ART

As a recording technique utilizing solid state properties of chalcogenide material, a phase change memory and a phase-change optical disk are given. As phase change material used for the phase change memory and the phase-change optical disk, chalcogenide material containing Te (tellurium) is known.

U.S. Pat. No. 5,254,382 (Patent Document 1) discloses an optical disk medium using chalcogenide material expressed by $\{(Ge_yTe_{1-y})_a (Sb_zTe_{1-z})_{1-a}\}_{1-b} (In_{1-x}Te_x)_b$ (here, $0.4 \leq y \leq 0.6$, $0.3 \leq x \leq 0.6$, $0.4 \leq z \leq 0.6$, $0.1 \leq a \leq 0.5$, $0.01 \leq b \leq 0.3$) as a recording layer. The chalcogenide material is obtained by adding In to Ge—Sb—Te in order to enhance stability of an amorphous state to improve long-term data storage property while maintaining such characteristic that crystallization can be obtained at a high speed.

On the other hand, U.S. Pat. No. 5,883,827 (Patent Document 2) describes a non-volatile memory using a chalcogenide material film in detail. The non-volatile memory is a phase change memory where the atomic arrangement of a phase change material film changes according to Joule heat generated by current flowing in the phase change material film itself and a cooling rate so that storage information is written. For example, operating current tends to increase in order to apply a temperature exceeding 600° C. obtained by Joule heat to a phase change material layer to once melt the phase change material film upon amorphizing the phase change material layer, where a resistance value of the phase change material film changes in a range from two digits to three digits according to a state of the phase change material film.

In the electric phase change memory, research has been advanced centering around one using $Ge_2Sb_2Te_5$, for example, Japanese Patent Application Laid-Open Publication No. 2002-109797 (Patent Document 3) discloses a recording element using GeSbTe. In addition, Japanese Patent Application Laid-Open Publication No. 2003-100991 (Patent Document 4) discloses a technique regarding a memory using chalcogenide material. Further, it has been reported that rewrite can be performed $10^{12}$ times in a phase change memory using a phase-change film made of $Ge_2Sb_2Te_5$ (see Non-Patent Document 1). Moreover, a technique regarding a phase change memory using a crystal-growth-dominant material has been reported (see Non-Patent Document 2).

Patent Document 1: U.S. Pat. No. 5,254,382
Patent Document 2: U.S. Pat. No. 5,883,827
Patent Document 3: Japanese Patent Application Laid-Open Publication No. 2002-109797
Patent Document 4: Japanese Patent Application Laid-Open Publication No. 2003-100991
Non-Patent Document 1: "IEEE International Electron Devices meeting, TECHNICAL DIGEST", (USA), 2001, p. 803-806
Non-Patent Document 2: "Nature Materials", (USA), 2005, Vol. 4, p. 347-351

DISCLOSURE OF THE INVENTION

Problems to be Solved by the Invention

The following matter has been found in studies made by the present inventors.

For example, according to a configuration of a memory shown in FIG. 12 of U.S. Pat. No. 5,883,827 (Patent Document 1), the memory includes a memory cell array, a row decoder XDEC, a bit (column) decoder YDEC, a read circuit RC, and a write circuit WC. The memory cell array is configured such that memory cells MCpr are disposed at respective intersecting points between word lines WLp (p=1, ..., n) and data lines DLr (r=1, ..., m). Each memory cell has such a configuration that a storage element RM' and a selection transistor QM connected in series are inserted between a bit line DL and a ground potential. The word line WL is connected to the gate of a selection transistor, and a bit selection line YSr (r=1, ..., m) is connected to a corresponding bit selection switch QAr, respectively.

With such a configuration, a selection transistor on a word line selected by the row decoder XDEC is made conductive and a bit selection switch corresponding to a bit selection line selected by the bit decoder YDEC is further made conductive so that a current path is formed within the selected memory cell and a read signal is generated in a common bit line I/O. Since a resistance value within the selected memory cell varies depending on storage information, voltage outputted to the common bit line I/O varies depending on the storage information. By discriminating the variation in the read circuit RC, the storage information in the selected memory cell is read.

In such a phase change memory, phase change material which is also used for an optical disk is used as a recording layer, but the phase change memory is different from the optical disk and it is required to endure high temperatures in a manufacturing process or a usage environment in some cases. However, when a memory is configured using a standard phase change material, for example, $Ge_2Sb_2Te_5$ as a recording layer, there are the following problems to be solved in order to use the memory at high temperatures.

A first problem lies in instability of an amorphous state. That is, since the amorphous state is a semi-stable phase, crystallization proceeds rapidly in a high temperature environment. For example, a memory embedded in a microcomputer for an automobile control must withstand the use under high-temperature environment such as that at a temperature of about 140° C., but when $Ge_2Sb_2Te_5$ is used for a recording layer of the memory, amorphia changes to crystal in a relatively short time (for example, about several hours), namely, it changes to a low-resistance state, so that data storage property of the memory is insufficient at such high temperatures, and the memory is unsuitable for use at the high temperatures.

In a memory-mounting microcomputer, since soldering or crimping of a chip is performed in a step of mounting the microcomputer chip, a memory element is exposed to high temperature environment. In the case of the microcomputer, it is common to perform the mounting after a program is recorded in a memory portion, but in such a memory that data is erased under high temperature environment in a mounting step, data must be written after mounting, where a process different from an ordinary process must be adopted. Since heat load is imparted on the memory for several minutes at a temperature of 260° C. in the soldering, and heat load is imparted on the memory for several hours at a temperature of 180° C. in the crimping, it is necessary to ensure data storage property under high temperature environment further higher than an operation temperature even for a short time. Therefore, a non-volatile memory for a microcomputer must be provided with data preserving property withstanding heat load in such a manufacturing process, and it is required to have heat resistance considerably higher than that of an optical disk.

A second problem is a problem of a resistance value in an amorphous state under a high temperature. Since chalcogenide containing Tellurium (Te) as a primary component is semiconductor with a narrow band gap, resistance thereof generally decreases exponentially according to temperature rising. The degree of the change of the resistance is larger in an amorphous state than in a crystalline state, so that, even when a resistance ratio is large in the room temperature, the resistance ratio becomes small when the temperature of the chalcogenide reaches a high temperature equal to or higher than 100°, which results in such a problem that a read margin cannot be taken. For example, in a case of $Ge_2Sb_2Te_5$, a ratio of reset resistance/set resistance at the room temperature is about 100 times, but the reset resistance lowers considerably when the temperature of the chalcogenide reaches about 100° C. or higher, so that the resistance ratio lowers to about 30 times. Therefore, a large read margin which is a merit of the phase change memory cannot be obtained, so that the reading system may be changed depending on environmental temperatures in some cases.

The problems occur in the memory using the phase change material in this manner, especially, since the resistance value at a high temperature which is the second problem is a problem peculiar to an electric chalcogenide material memory, it is not considered in chalcogenide material for an optical recording medium. Therefore, even in a usage environment or a manufacturing process where the temperature of the chalcogenide reaches a high temperature, a phase change memory element using a chalcogenide material which has a proper resistance value and which can realize stable data preserving property is required.

On the other hand, it is considered to add indium (In) to a composition of a chalcogenide recording layer in a phase change memory element in order to improve data storage property (namely, heat resistance) in a high temperature state as described above.

FIG. 32 is an explanatory diagram schematically illustrating a sectional configuration example of a portion positioned near a phase change memory element in a semiconductor device studied as a premise of the present invention by the present inventors. Incidentally, FIG. 32 is a sectional view but hatching is omitted for facilitating viewing of the figure.

In FIG. 32, for example, a memory element 154 is formed on a plug 143 (a bottom contact electrode BCE) formed of a main conductor film 143b made of tungsten (W) or the like and a conductive barrier film 143a such as a titanium (Ti)/titanium nitride (TiN) stacked film. For example, the memory element 154 is composed of an interface layer 151 having a peeling prevention function made of tantalum oxide (for example, $Ta_2O_5$) or the like, a recording layer (storage layer) 152 made of an In—Ge—Sb—Te chalcogenide layer, and an upper contact electrode 153 made of tungsten (W) or the like. By adding indium (In) to the chalcogenide layer and providing an adhesion layer (the interface layer 151) made of oxide such as $Ta_2O_5$ or nitride in this manner, heat resistance is improved. That is, a temperature where transition from an amorphous state to a crystalline state occurs can be raised, so that a phenomenon that unintentional change from an amorphous state to a crystalline state occurring when the temperature of a semiconductor device having a phase change memory reaches a high temperature can be prevented.

In such a phase change memory element, the shapes of the bottom contact electrode BCE and the upper contact electrode 153 are different from each other in most cases. Since an electrode side (namely, the bottom contact electrode BCE side) where an area contacting with the chalcogenide layer is generally small easily reaches a high temperature, an electrode side (namely, the upper contact electrode 153 side) where the contact area is large does not melt in reset, or, even if it melts, it is recrystallized during cooling to be crystallized. An amorphization region 155 is formed near the electrode (the bottom contact electrode BCE) positioned on the side where the contact area is small, and a region (a crystalline region) 156 which is crystallized during a manufacturing process and remains in the crystallized state is present outside the amorphization region 155. In the present specification, the term "contact" includes not only direct contact but also contact through a layer or a region made of insulating material, semiconductor, or the like thinly formed to such an extent that current flows.

The shortest distance between the bottom contact electrode BCE and the crystallized region 156 positioned nearest to the bottom contact electrode BCE changes according to magnitude and duration of a current flow in reset. When an area of a transistor designating an element is made small, current decreases, and a distance L1 between the bottom contact electrode BCE and a portion of the crystallized region 153 closest to the bottom contact electrode BCE in a film surface direction of the chalcogenide layer (the recording layer 152) becomes smaller than a distance L2 between the bottom contact electrode BCE and the upper contact electrode 153 in the film thickness direction (or a distance L3 between the bottom contact electrode BCE and the crystalline region 156a positioned before the upper contact electrode 153). Therefore, when the resistance of a portion having been crystallized from the initial stage is low, a possibility that much current flows in the closest spacing (namely, in the film thickness direction) is high in set. However, the closest spacing becomes unstable due to process variation or process defect of the recording layer, or the like. Thereby, there is a possibility that such a drawback as a difference in heat resistance characteristics among elements or decrease of cycles until failure occurs.

The term "heat resistance (retention temperature)" indicates a retention temperature at which not only lowering of resistance due to high temperature holding but also resistance increase due to the high temperature holding or rising of set voltage at the next set operation can be suppressed to very small values. However, there is a possibility that an atomic arrangement in the recording layer 152 changes at a high temperature, and there is a possibility that further increase of resistance from the resistance of the reset state occurs in the recording layer 152 due to the change so that a relatively high voltage (set voltage) is required for the next set operation. That is, especially, when the adhesion film (the interface layer 151) is formed as a relatively thick film and when the region 155 illustrated in FIG. 32 is in an amorphous state, high electric field is applied to the vicinity of the interface near the bottom contact electrode BCE, so that change of the atomic arrangement occurs at a high temperature, for example, from considerably fine composition variation (composition unevenness) originally present over the whole region, and movement of carrier becomes difficult due to increase of a cycle of the composition unevenness, and when further increase of resistance occurs, the next set operation may also become difficult. Such a change is a change which progresses irreversibly unless the film is set to the vicinity of a melting temperature.

Further, in the phase change memory element, especially, in the case of forming the adhesion film (the interface layer 151), high electric field is applied to the vicinity of the interface, so that, when ions, or easily-ionized elements or components are present in a film between the electrodes (the upper contact electrode 153 and the bottom contact electrode BCE), these ions, or easily-ionized elements or components may be moved by the electric field. That is, in FIG. 32, since resistance is low in the crystalline region 156 from the initial stage, when In—Ge—Sb—Te has an even composition in a film thickness direction of the recording layer 152, a potential gradient between an outer edge portion of the bottom contact electrode BCE and the crystalline region 156a from the initial stage is the maximum in set, and a set operation involving impact ionization starts. At this time, movement of ions (positive ions) tends to take place and segregation or disturbance of the structure occurs when the temperature becomes high, which causes change of the resistance to a high resistance side. Incidentally, since high voltage is ordinarily applied to the side of the upper contact electrode based upon the side of the bottom contact electrode in a set/reset operation, positive ions are easy to move to the side of the bottom contact electrode. As the positive ions, ions of Ti diffused from a Ti layer around the bottom contact electrode BCE, or elements constituting the recording layer 152, or ions of tungsten in some cases are considered.

By adding In to the chalcogenide layer and providing the adhesion layer (the interface layer) of oxide such as $Ta_2O_5$ in the phase change memory, as described above, heat resistance is improved and relatively low reset (amorphization) current is achieved, but further increase of resistance which is considered to be caused by change of the atomic arrangement takes place at a high temperature, or relatively high voltage is required for the next set operation.

Accordingly, it is desired to improve performance of a semiconductor device having a phase change memory and to further increase heat resistance.

An object of the present invention is to provide a technique which can achieve further higher heat resistance of a semiconductor device and can achieve both high heat resistance and high performance of the semiconductor device.

The above and other objects and novel characteristics of the present invention will be apparent from the description of this specification and the accompanying drawings.

Means for Solving the Problems

The typical ones of the inventions disclosed in this application will be briefly described as follows.

The present invention uses chalcogenide material containing indium in a range from 20 atomic % to 38 atomic %, germanium in a range from 9 atomic % to 28 atomic %, antimony in a range from 3 atomic % to 18 atomic %, and tellurium in a range from 42 atomic % to 63 atomic % as a recording layer in a memory element.

In addition, the present invention uses chalcogenide material whose average composition in a film thickness direction is represented by $In_\alpha Ge_x Sb_Y Te_Z$, where $0.20 \leq \alpha \leq 0.38$, $0.09 \leq x \leq 0.28$, $0.03 \leq Y \leq 0.18$, and $0.42 \leq Z \leq 0.63$ are satisfied, as the recording layer in the memory element.

Effects of the Invention

The effects obtained by typical aspects of the present invention will be briefly described below.

Heat resistance of a semiconductor device can be improved.

Further, performance of a semiconductor device can be improved.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that, components having the same function are denoted by the same reference symbols throughout the drawings for describing the embodiment, and the repetitive description thereof will be omitted. In addition, the description of the same or similar portions is not repeated in principle unless particularly required in the following embodiments.

Also, in some drawings used in the embodiments, hatching is used even in a plan view so as to make the drawings easy to see.

A semiconductor device and a manufacturing method thereof of an embodiment will be described with reference to the drawings.

The semiconductor device of the embodiment is provided with a memory element including phase change material, where recording layer material of the memory element is a main feature, as described later.

First, descriptions will be made from a configuration example of the whole of the semiconductor device of the embodiment including this memory element.

Figure 1:
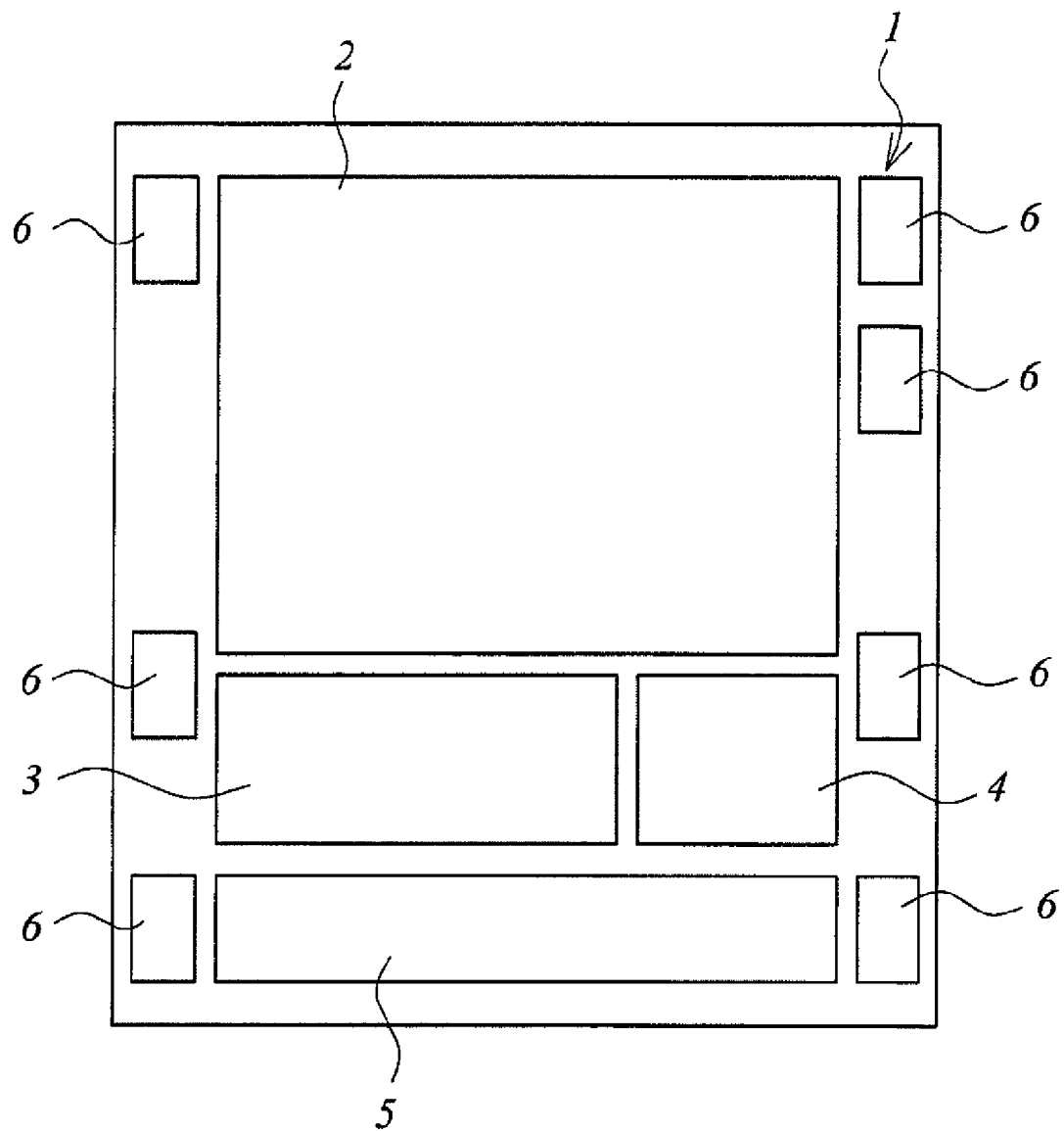
FIG. 1 is a plan view illustrating a schematic configuration of a semiconductor device according to an embodiment of the present invention.

FIG. 1 is a plan view (plan layout diagram, chip layout diagram) illustrating one example of a schematic configuration of the semiconductor device of the embodiment.

A semiconductor device (semiconductor chip) 1 of the embodiment is a semiconductor device (semiconductor storage device, non-volatile semiconductor storage device) including a phase change memory (phase-change type non-volatile memory, PCM (Phase Change Memory), OUM (Ovonic Unified Memory)) which is a phase-change type non-volatile memory (non-volatile storage element).

As illustrated in FIG. 1, the semiconductor device 1 of the embodiment includes a memory element, here, a phase change memory region 2 formed with a memory cell array of phase-change memories. Further, the semiconductor device 1 includes a RAM region 3 formed with a RAM (Random Access Memory) circuit such as a DRAM (Dynamic RAM) or SRAM (Static RAM), a CPU region 4 formed with a logic circuit such as a CPU or an MPU, an analog circuit region 5 formed with an analog circuit, an I/O region 6 formed with an input/output circuit, and the like, as necessary.

A non-volatile memory storing a relatively large volume of information is formed in the phase change memory region 2 by a memory element, here, a phase change memory which is a phase-change type non-volatile memory as one of main circuits of the semiconductor device 1. The phase change memory is a non-volatile memory in which storage information is stored (written) according to change of an atomic arrangement of a recording layer (corresponding to a recording layer 52 described later) of each memory cell. The phase change memory is configured such that, by causing atomic arrangement change such as phase change between a crystalline state (crystalline phase) and an amorphous state (amorphous phase) in a recording layer (corresponding to the recording layer 52 described later) of each memory cell to change a resistivity (a resistance value) of the recording layer, passing current in each memory cell in accessing is changed according to storage information. In the phase change memory, the atomic arrangement state in the recording layer (for example, whether the recording layer is in the amorphous state or in the crystalline state) is utilized as storage information, namely, whether the recording layer is in a high-resistance state (an electric resistance value is in a high state) or in a low-resistance state (the electric resistance value is in a low state) according to the atomic arrangement state is utilized as storage information, so that storage information of a selected memory cell can be read in accessing according to passing current in the selected memory cell to be accessed. Therefore, the phase change memory is a kind of memory element, and it can be regarded as a kind of memory element (resistance memory element) in which, by causing change of an atomic arrangement state (for example, a phase change between a crystalline state and an amorphous state) in a recording layer (the recording layer 52 described later) to change a resistance value of the recording layer, a high-resistance state where an electric resistance value is high and a low-resistance state where the electric resistance value is low can be stored so that resistance value change is utilized as storage information.

Figure 2:
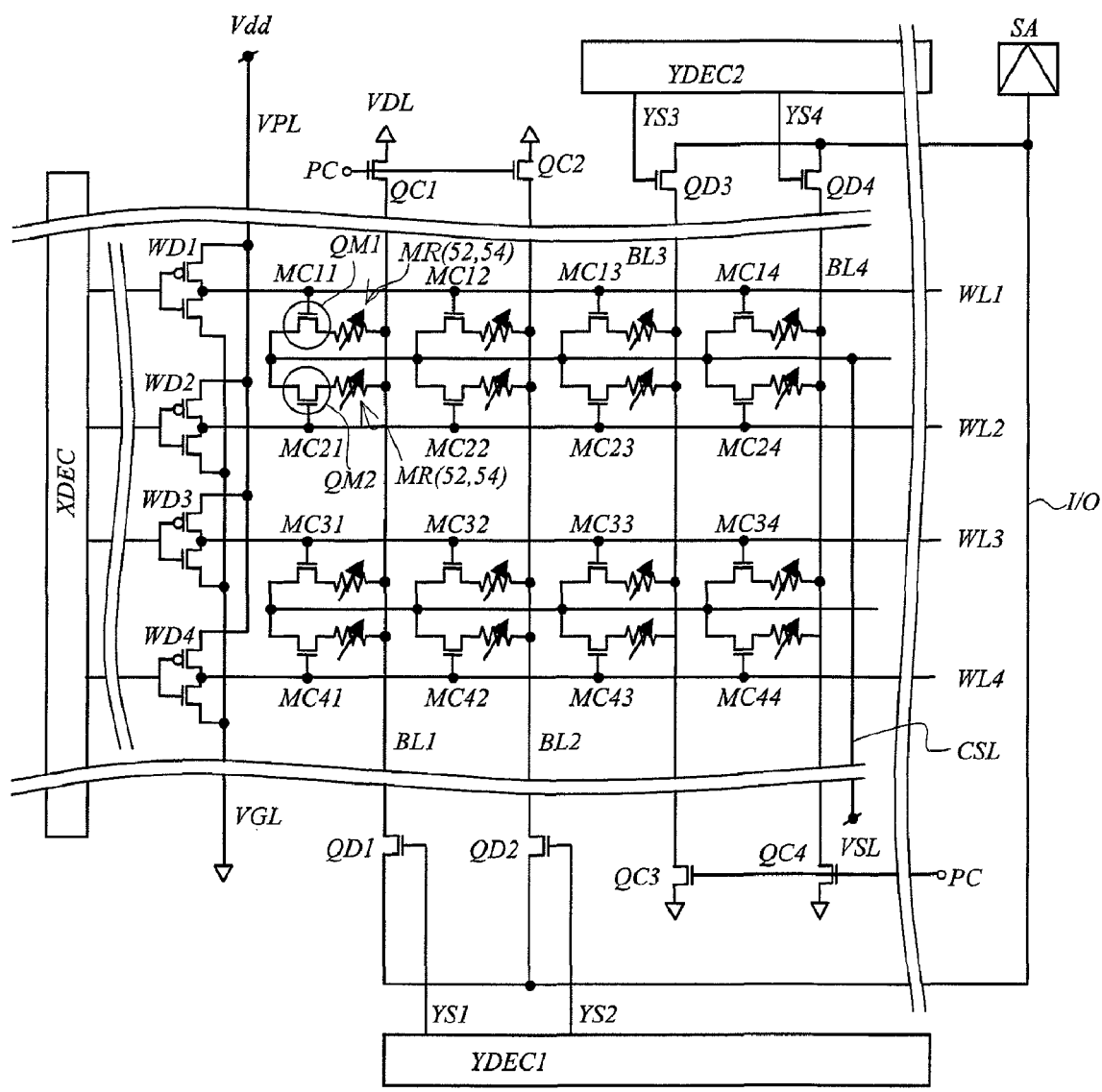
FIG. 2 is a circuit diagram illustrating an example of a structure of a memory array in a phase change memory region of the semiconductor device according to the embodiment of the present invention.

Next, a configuration example of a memory array of the phase change memory region 2 in the semiconductor device 1 will be described with reference to a circuit diagram shown in FIG. 2. FIG. 2 is a circuit diagram illustrating a configuration example of a memory array of the phase change memory region 2 in the semiconductor device 1 of the embodiment.

A structure of the memory array shown in FIG. 2 is known as a NOR type, and because the memory array can perform read at a high speed, it is suitable for storing system program, for example, it is used as a stand-alone memory chip or for embedding such a logic LSI as a microcomputer. In FIG. 2, many word lines and bit lines which are generally included are simplified in order to prevent complication of the drawings and the descriptions, where four word lines WL1 to WL4 and four bit lines BL1 to BL4 are illustrated and a portion of an array is only illustrated.

In FIG. 2, memory cells MC11, MC12, MC13, and MC14 are electrically connected to the word line WL1. Similarly, memory cells MC21 to MC24, MC31 to MC34, and MC41 to MC44 are electrically connected to the word Lines WL2, WL3, and WL4, respectively. The memory cells MC11, MC21, MC31, and MC41 are electrically connected to the bit line BL1. Similarly, memory cells MC12 to MC42, MC13 to MC43, and MC14 to MC44 are electrically connected to the bit lines BL2, BL3, and BL4, respectively.

Each of the memory cells MC11 to MC44 is configured by one memory cell transistor (corresponding to one of MIS-FETs QM1 and QM2 described later) formed of a MISFET (metal oxide semiconductor field effect transistor) and memory material or a memory element MR (corresponding to the recording layer 52 or a resistance element 54 that includes the recording layer 52 described later) connected to the memory cell transistor in series. Each of the word lines (WL1 to WL4) is electrically connected to a gate electrode of the memory cell transistor configuring each of the memory cells (MC11 to MC44). Each of the bit lines (BL1 to BL4) is electrically connected to a memory element (storage element) MR configuring each of the memory cells (MC11 to MC44). One end of each memory cell transistor positioned opposite to the side connected to the memory element MR is electrically connected to a source line CSL.

The word lines WL1 to WL4 are driven by word drivers WD1 to WD4, respectively. One of the word drivers DW1 to DW4 to be selected is determined according to a signal from an X address decoder (row decoder) XDEC. Here, the reference symbol VPL denotes a power source supplying line to each of the word drivers WD1 to WD4, Vdd denotes a source voltage, and VGL denotes a potential extracting line of each of the word drivers WD1 to WD4. Incidentally, the potential extracting line VGL is fixed to a ground voltage (ground potential) here.

The reference symbol QD1 denotes a selection transistor which precharges the bit line BL1. Similarly, the reference symbols QD2 to QD4 denote selection transistors which precharge BL2 to BL4, respectively. One ends of the respective bit lines BL1 to BL4 are connected to a sense amplifier SA via the selection transistors QD1 to QD4 formed of an MISFET, respectively. Each of the selection transistors QD1 to QD4 is selected via a Y address decoder (bit decoder) YDEC1 or YDEC2 according to an address input. In the embodiment, such a configuration is adopted that the selection transistors QD1 and QD2 are selected by the Y address decoder YDEC1, while the selection transistors QD3 and QD4 are selected by the Y address decoder YDEC2. The sense amplifier SA detects and amplifies signals read from the memory cells (MC11 to MC44) through the selection transistors QD1 to QD4. Incidentally, though not illustrated, a circuit supplying voltage or current for reading or writing is connected to each of the selection transistors QD1 to QD4 in addition to the sense amplifier SA.

Figure 3:
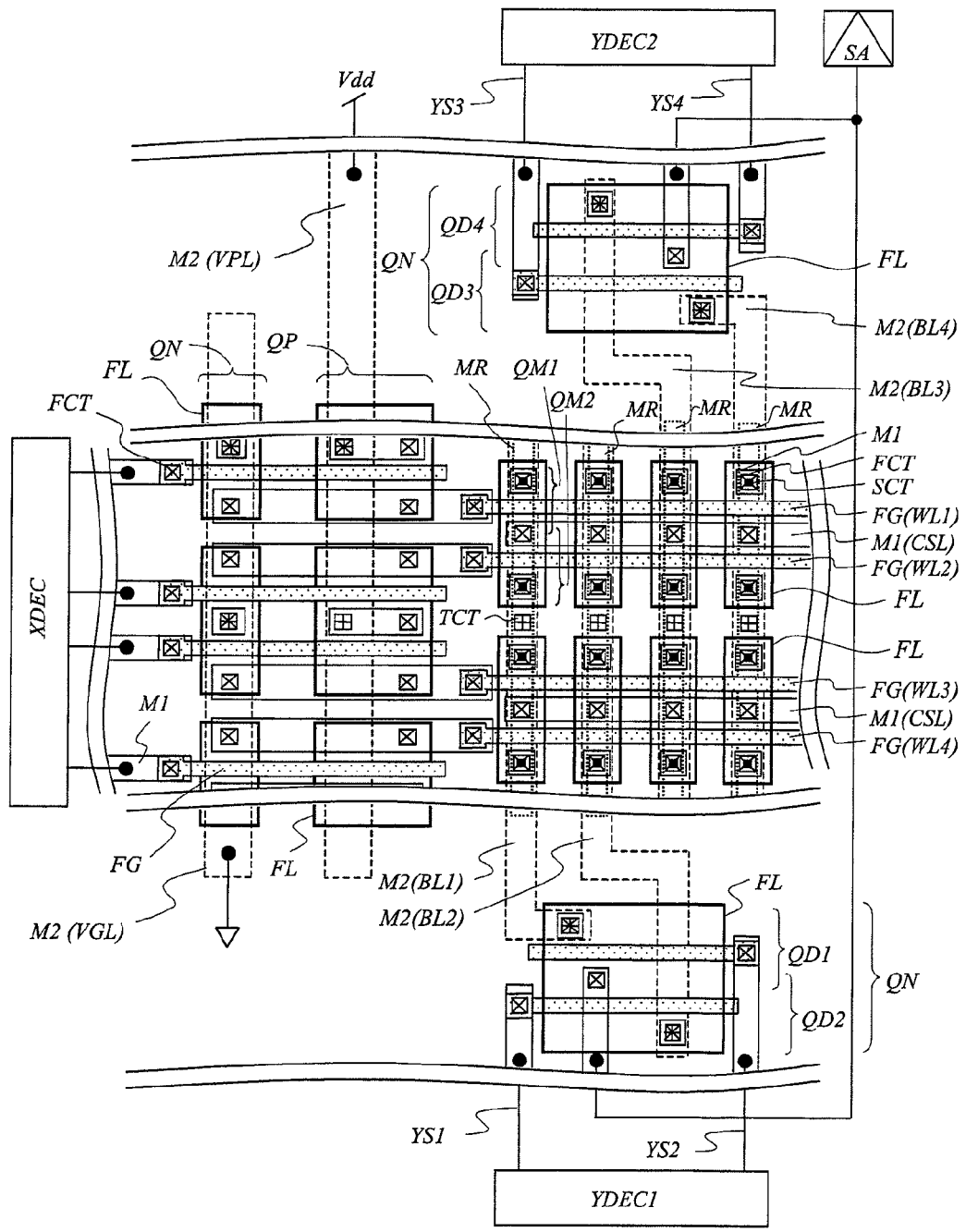
FIG. 3 is a plan view illustrating a plan layout corresponding to the array configuration of FIG. 2.

In FIG. 3, a plan layout (plan view) corresponding to the array configuration illustrated in FIG. 2 is illustrated.

In FIG. 3, the reference symbol FL denotes an active region, M1 denotes a first layer wiring (corresponding to a wiring 37 described later), M2 denotes a second layer wiring (corresponding to a wiring 72 described later), and FG denotes a gate electrode layer (corresponding to a conductor film pattern configuring gate electrodes 16a, 16b, 16c, and the like described later) used as a gate of a MISFET formed on a silicon substrate. The reference symbol FCT denotes a contact hole (corresponding to a contact hole 32 described later) connecting an upper surface of the active region FL and a lower surface of the first layer wiring M1, SCT denotes a contact hole (corresponding to a through hole 42 described later) connecting an upper surface of the first layer wiring M1 and a lower surface of the memory element MR, and TCT denotes a contact hole (corresponding to a through hole 65 described later) connecting an upper surface of the first layer wiring M1 and a lower surface of the second layer wiring M2.

The memory element MR is drawn up to the second layer wiring M2 through a contact hole TCT between memory cells (MC) electrically connected to the same bit line (BL). The second layer wiring M2 is used as each bit line (BL). The word lines WL1 to WL4 are formed using the gate electrode layer FG. A stacked layer formed of polysilicon and silicide (alloy of silicon and high melting temperature metal) or the like is used as the gate electrode layer FG. For example, the memory transistor QM1 configuring the memory cell MC11 and the memory transistor QM2 configuring the memory cell MC21 share a source region, and the source region is connected to the source line CSL formed of the first layer wiring M1 through the contact hole FCT. As illustrated in FIG. 3, other memory cell transistors configuring memory cells follow this manner.

The bit lines BL1 to BL4 are connected to the source sides of the selection transistors QD1 to QD4 arranged at an outer periphery of the memory cell array. Drain regions of the selection transistors QD1 and QD2 are common, and drain regions of the selection transistors QD3 and QD4 are common. These selection transistors QD1 to QD4 receive signals from the Y address recorder YDEC1 or YDEC2 to serve to select designated bit lines. Incidentally, the selection transistors QD1 to QD4 are, for example, n-channel type ones in the embodiment.

A circuit element configuring each block is not limited to a specific one, but it is formed on a semiconductor substrate such as a monocrystalline silicon by a semiconductor integrated circuit technique such as, typically, CMISFET (complementary MISFET: complementary MIS transistor). Further, chalcogenide material exhibiting phase change, or the like is produced in a hybrid manner with a fabrication technique of an integrated circuit. Well-known photolithography and dry etching can be used for forming these patterns. These manufacturing steps will be described in detail later.

Next, a structure of the semiconductor device of the embodiment will be described in more detail.

Figure 4:
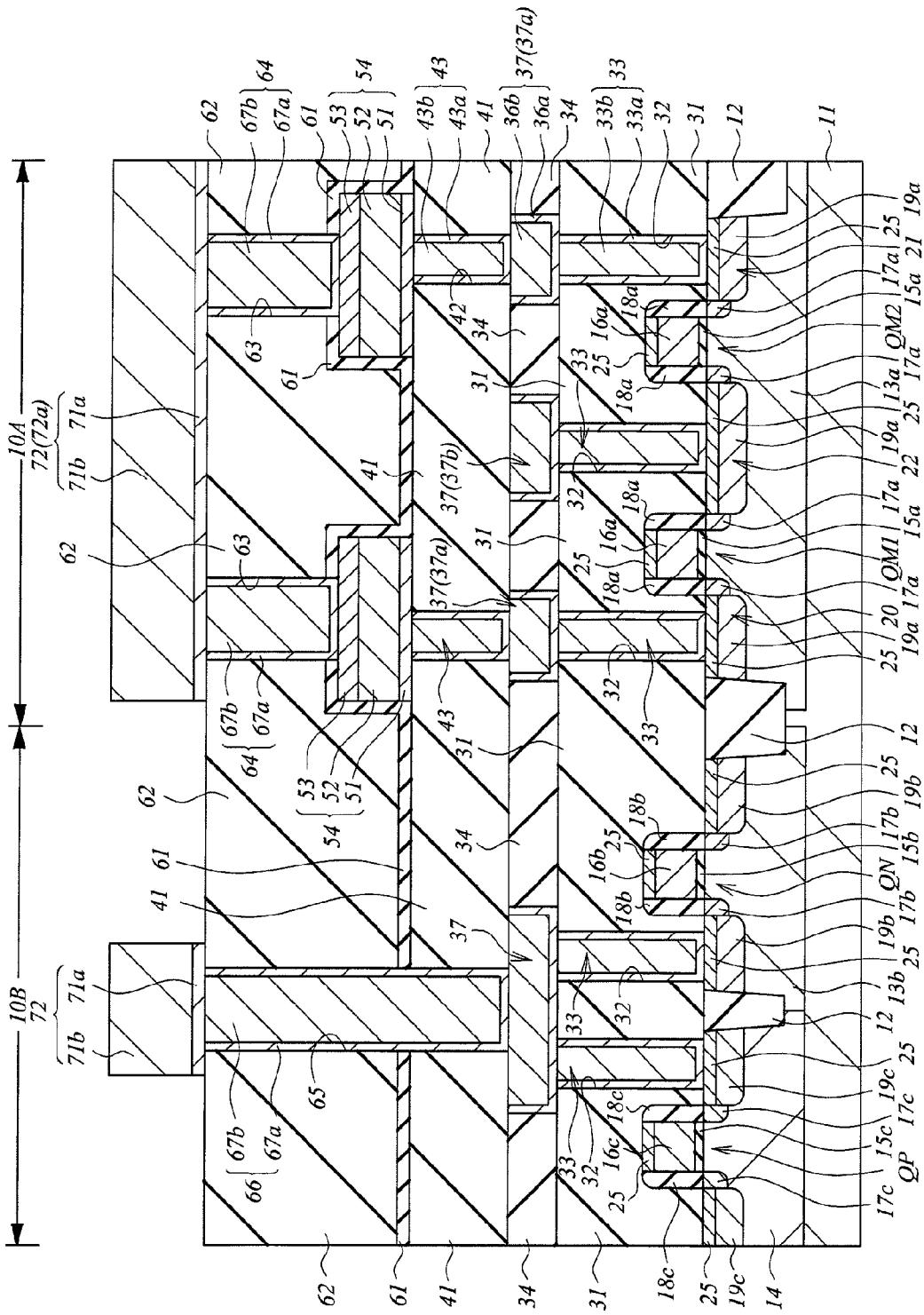
FIG. 4 is a sectional view of main parts of the semiconductor device according to the embodiment of the present invention.

FIG. 4 is a sectional view of main parts of the semiconductor device 1 of the embodiment. In FIG. 4, a section (main part section) of a phase change memory region 10A and a section (main part section) of a peripheral circuit region 10B are illustrated. The phase change memory region 10A corresponds to a portion of the phase change memory region 2 of the semiconductor device 1. The peripheral circuit region 10B corresponds to a portion (a region formed with an n-channel type MISFET and a p-channel type MISFET) of a peripheral circuit region of the semiconductor device 1, where an X decoder circuit, a Y decoder circuit, a sense amplifier circuit of a memory cell, an input/output circuit (an input/output circuit of the I/O region 6), a logic circuit (a logic circuit for the CPU region 4) of logic, and so forth are formed by MISFETs (MISFETs formed on the peripheral circuit region 10B) configuring a peripheral circuit. Incidentally, in FIG. 4, the section of the phase change memory region 10A and the peripheral circuit region 10B are illustrated such that they are positioned adjacent to each other for simplifying understanding, but the positional relationship between the section of the phase change memory region 10A and the peripheral circuit region 10B may be changed as may be necessary.

As illustrated in FIG. 4, device isolation regions 12 are formed in a main surface of a semiconductor substrate (semiconductor wafer) 11 made of, for example, p-type monocrystalline silicon, and p-type wells 13a and 13b and an n-type well 14 are formed in active regions isolated by the device isolation regions 12. The p-type well 13a of these wells is formed in the phase change memory region 10A, and the p-type well 13b and the n-type well 14 are formed in the peripheral circuit region 10B.

N-channel type MISFETs (Metal Insulator Semiconductor Field Effect Transistors) QM1 and QM2 are formed on the p-type well 13a of the phase change memory region 10A. An n-channel type MISFET (Metal Insulator Semiconductor Field Effect Transistor) QN is formed on the p-type well 13b of the peripheral circuit region 10B, and a p-channel type MISFET (Metal Insulator Semiconductor Field Effect Transistor) QP is formed on the n-type well 14 of the peripheral circuit region 10B.

The MISFETs QM1 and QM2 in the phase change memory region 10A are MISFETs (memory cell transistors) for memory cell selection in the phase change memory region 10A. The MISFETs QM1 and QM2 are formed on an upper portion of the p-type well 13a so as to be separated from each other, and they include a gate insulating film 15a on a surface of the p-type well 13a and a gate electrode 16a on the gate insulating film 15a. Sidewalls (sidewall spacers) 18a made of silicon oxide, a silicon nitride film, or a stacked film thereof are formed on sidewalls of the gate electrode 16a. A semiconductor region (n-type impurity diffusion layer) 20 serving as a drain region of the MISFET QM1, a semiconductor region (n-type impurity diffusion layer) 21 serving as a drain region of the MISFET QM2, a semiconductor region (n-type impurity diffusion layer) 22 serving as a source region of the MISFETs QM1 and QM2 are formed within the p-type well 13a. Each of the semiconductor regions 20, 21, and 22 has an LDD (lightly doped drain) structure and it is formed of an $n^-$-type semiconductor region 17a and an $n^+$-type semiconductor region 19a having an impurity concentration higher than that of the semiconductor region 17a. The $n^-$-type semiconductor region 17a is formed in the p-type well 13a below the sidewall 18a, the $n^+$-type semiconductor region 19a is formed in the p-type well 13a outside the gate electrode 16a and the sidewall 18a, and the $n^+$-type semiconductor region 19a is formed at a position in the p-type well 13a separated from the channel region by the size of the $n^-$-type semiconductor region 17a. The semiconductor region 22 is shared by the MISFETs QM1 and QM2 formed adjacent to each other on the same device active region to be a common source region. Incidentally, in the embodiment, a case that the source region is shared by the MISFETs QM1 and QM2 will be described, but such a configuration can be used as another aspect that a drain region is shared by the MISFETs QM1 and QM2, where the semiconductor region 22 is the drain region and the semiconductor regions 20 and 21 are the source regions.

The MISFET QN formed in the peripheral circuit region 10B also has a configuration substantially similar to those of the MISFETs QM1 and QM2. That is, the MISFET QN includes a gate insulating film 15b on a surface of the p-type well 13b and a gate electrode 16b on the gate insulating film 15b, and sidewalls (sidewall spacers) 18b made of silicon oxide or the like are formed on sidewalls of the gate electrode 16b. An $n^-$-type semiconductor region 17b is formed within the p-type well 13b below the sidewall 18b, and an $n^+$-type semiconductor region 19b having an impurity concentration higher than that of the $n^-$-type semiconductor region 17b is formed outside the $n^-$-type semiconductor region 17b. A source-drain region having an LDD structure of the MISFET QN is formed by the $n^-$-type semiconductor region 17b and the $n^+$-type semiconductor region 19b.

The MISFET QP formed in the peripheral circuit region 10B includes a gate insulating film 15c on a surface of the n-type well 14 and a gate electrode 16c on the gate insulating film 15c, and sidewalls (sidewall spacers) 18c made of silicon oxide or the like are formed on sidewalls of the gate electrode 16c. A $p^-$-type semiconductor region 17c is formed within the n-type well 14 below the sidewall 18c, and a $p^+$-type semiconductor region 19c having an impurity concentration higher than that of the $p^-$-type semiconductor region 17c is formed outside the $p^-$-type semiconductor region 17c. A source-drain region having an LDD structure of the MISFET QP is formed by the $p^-$-type semiconductor region 17c and the $p^+$-type semiconductor region 19c.

Metal silicide layers (for example, cobalt silicide ($CoSi_2$) layers) 25 are formed on surfaces of the gate electrodes 16a, 16b, and 16c, $n^+$-type semiconductor regions 19a and 19b, and $p^+$-type semiconductor region 19c, respectively. Thereby, diffusion resistances and contact resistances of the $n^+$-type semiconductor regions 19a and 19b and the $p^+$-type semiconductor region 19c, and the like can be made low.

An insulating film (interlayer insulating film) 31 is formed on the semiconductor substrate 11 so as to cover the gate electrodes 16a, 16b, and 16c. The insulating film 31 is made of, for example, a silicon oxide film or the like and an upper surface of the insulating film 31 is formed flatly such that its heights in the phase change memory region 10A and in the peripheral circuit region 10B substantially coincide with each other.

Contact holes (opening portions, connection holes) 32 are formed in the insulating film 31, and plugs (contact electrodes) 33 are formed in the contact holes 32. The plug 33 includes a conductive barrier film 33a made of a titanium film, a titanium nitride film, a stacked film thereof, or the like formed on a bottom portion and a sidewall of the contact hole 32, and a tungsten (W) film (main conductor film) 33b formed on the conductive barrier film 33a so as to be filled in the contact hole 32. The contact holes 32 and the plugs 33 are formed on the $n^+$-type semiconductor regions 19a and 19b and the $p^+$-type semiconductor region 19c or on the gate electrodes 16a, 16b, and 16c.

An insulating film 34 made of, for example, a silicon oxide film or the like is formed on the insulating film 31 having the plugs 33 buried therein, and wirings (first wiring layers) 37 serving as the first layer wirings are formed in wiring trenches (openings) formed in the insulating film 34. The wiring 37 is made of a conductive barrier film 36a formed of a titanium film, a titanium nitride film, a stacked film thereof, or the like formed on a bottom portion and a sidewall of the wiring trench, and a main conductor film 36b made of a tungsten film or the like formed on the conductive barrier film 36a so as to be buried in the wiring trench. The wiring 37 is electrically connected to the n$^+$-type semiconductor region 19a, 19b, the p$^+$-type semiconductor region 19c, or the gate electrode 16a, 16b, 16c, or others through the plug 33. In the phase change memory region 10A, a source wiring 37b is formed of the wiring 37 connected to the semiconductor region 22 (n$^+$-type semiconductor region 19a) for the source of the MISFETs QM1 and QM2 through the plug 33.

An insulating film (interlayer insulating film) 41 made of, for example, silicon oxide film or the like is formed on the insulating film 34 having the wirings 37 buried therein. In the phase change memory region 10A, through-holes (openings, holes, connection holes) 42 are formed in the insulating film 41, and plugs (contact electrodes, bottom contact electrodes) 43 are formed in the through-holes 42. The plug 43 includes a conductive barrier film 43a made of a titanium film, a titanium nitride film, a stacked film thereof, or the like formed on a bottom portion and a sidewall of the through-hole 42, and a tungsten (W) film (main conductor film) 43b formed on the conductive barrier film 43a so as to be buried in the through-hole 42. Therefore, the plug 43 is a (buried) conductor portion formed in the opening (through-hole 42) of the insulating film 41 which is an interlayer insulating film. The through-hole 42 and the plug 43 are formed on the wirings 37a of the wirings 37 which are connected to the semiconductor regions 20 and 21 (n$^+$-type semiconductor region 19a) for the drains of the MISFETs QM1 and QM2 through the plug 33 and they are electrically connected to the wiring 37a.

In the phase change memory region 10A, a resistance element (variable resistance element) 54 including a thin interface layer (phase change material adhesion film, an insulating film) 51, a recording layer (recording layer, recording material layer, phase change film, phase change recording material film) 52 on the interface layer 51, and an upper contact electrode film (upper contact electrode, metal film) 53 on the recording layer 52 is formed on the insulating film 41 having the plugs 43 buried therein. That is, the resistance element 54 is formed of a stacked layer pattern including the interface layer 51, the recording layer 52, and the upper contact electrode film 53. The resistance element 54 (or the recording layer 52 therein) configures the abovementioned memory element MR. The resistance element 54 is formed on the insulating film 41 in an island shape by removing a film between elements. Incidentally, a combination of the resistance element 54 and the plug 43 (bottom contact electrode) connected thereto can be regarded as a resistance element (variable resistance element). Since the combination of the resistance element 54 and the plug 43 (the bottom contact electrode) connected thereto functions as the memory element, a combination of the resistance element 54 (the interface layer 51, recording layer 52, and upper contact electrode film 53) and the plug 43 connected thereto can be regarded as a memory element (resistance memory element).

The interface layer 51 is interposed between the insulating film 41 having the plug 43 buried therein and the recording layer 53 so that it can function to improve adhesiveness (adherence property) between the two to prevent peeling of the recording layer 52. That is, the interface layer 51 can function as an adhesion film or a phase change material adhesion film. Since the interface layer 51 has a thermal conductivity smaller than that of the plug 43, it can function to prevent heat of the recording layer 52 (Joule heat generated at a reset operation or a set operation) from escaping (being conducted) to the plug 43 side, so that thermal efficiency of the phase change memory can be improved and low current rewriting of the phase change memory can be made possible. The interface layer 51 can also function as a resistive layer for heat generation which heats the recording layer 52. The interface layer 51 is preferably made of metal oxide (especially, oxide of transition metal) or metal nitride (especially, nitride of transition metal), more preferably, is made of tantalum oxide or chromium oxide, is further preferably made of tantalum oxide (for example, $Ta_2O_5$ or material having a composition close to $Ta_2O_5$), so that the above-mentioned functions of the interface layer 51 can be developed adequately. A film thickness of the interface layer 51 can be set in a range from about 0.05 to 5 nm, for example.

However, since an adhesiveness-improved film such as tantalum oxide has a large potential gradient in the vicinity of the interface and tends to generate minute composition variation (composition unevenness) which causes resistance change at a high temperature, when an average film thickness of the interface layer 51 (tantalum oxide film) is thinned to fall within a range from 0.05 nm to 0.8 nm, especially, to about 0.2 nm, the change at a high temperature can be made small to a non-problematic extent while the adhesiveness is maintained. In this case, it is considered that the interface layer 51 is separated in a fine island shape, but since whether or not peeling occurs depends on a process apparatus to some extent, it is considered that there is such a case that peeling does not occur even when the interface layer 51 is not formed at all. Therefore, it is preferable to form the interface layer 51, but formation of the interface layer 51 can be omitted if unnecessary.

The recording layer 52 is a recording layer (storage layer) which stores information by being caused change of its atomic arrangement, and it is a recording layer (storage layer) which changes its resistance value (resistivity) according to atomic arrangement change such as, for example, phase change between a crystalline phase and an amorphous phase to store a high-resistance state where an electric resistance value is high and a low-resistance state where the electric resistance value is low. That is, the recording layer 52 is a recording layer (storage layer, storage element) for information in a memory element (here, a phase change memory), and it can function as a storage element. Therefore, the recording layer 52 is a phase-change film made of phase change material (phase-change substance), and it is a material film (semiconductor film) which can transit (phase change) between two states of a crystalline state and an amorphous state (amorphous state, non-crystalline state).

While the recording layer 52 is formed of material (semiconductor) containing chalcogenide element (S, Se, Te), namely, chalcogenide material (chalcogenide, chalcogenide semiconductor), in the embodiment, the recording layer 52 is made of chalcogenide material (In—Ge—Sb—Te-based chalcogenide material) containing indium (In), germanium (Ge), antimony (Sb), and tellurium (Te) at a proper composition ratio. In the embodiment, therefore, the recording layer 52 contains indium (In), germanium (Ge), antimony (Sb), and tellurium (Te) as constituent elements. Incidentally, the term "chalcogenide" means material containing at least one element of sulfur (S), selenium (Se), and tellurium (Te). The composition of the recording layer 52 will be described in detail later. The film thickness of the recording layer 52 can be set so as to fall within a range from about 10 to 200 nm, for example.

The upper contact electrode film 53 functions as an upper contact electrode of the phase change memory, and it is made of conductor (preferably, metal), and it can be formed of, for example, a tungsten (W) film, a tungsten alloy film, or the like, where the film thickness of the upper contact electrode film 53 can be set to fall within a range from about 10 to 200 nm, for example. A preferable range of the thickness of the resistance element 54 (namely, the total thickness of the stacked layer film of the interface layer 51, the recording layer 52, and the upper contact electrode film 53) is in a range from 30 nm to 150 nm.

The upper contact electrode film 53 can function to prevent the recording layer 52 from subliming when the conductive barrier film 67a is formed after reduction of contact resistance between the plug 64 and the resistance element 54 described later or formation of the through-hole 63. It is preferable that the upper contact electrode film 53 is formed, but the plug 64 functions as the upper contact electrode of the phase change memory when the plug 64 described later is connected to an upper surface of the recording layer 52 while formation of the upper contact electrode film 53 is omitted.

The plug 43 is made of conductor (preferably, metal) and functions as a bottom contact electrode (lower contact electrode) of the phase change memory, where a lower portion (lower surface of the interface layer 51) of the resistance element 54 contacts with the plug 43 to be electrically connected thereto. Accordingly, the lower portion (the lower surface of the interface layer 51) of the resistance element 54 is electrically connected to the drain regions 20 and 21 (the n$^+$-type semiconductor regions 19a) of the MISFETs QM1 and QM2 of the phase change memory region 10A via the plugs 43, the wiring 37a, and the plug 33.

As illustrated in FIG. 4, an insulating film 61 and an insulating film (interface insulating film) 62 on the insulating film 61 are formed on the insulating film 41 so as to cover the resistance element 54. That is, the insulating film 61 is formed on the insulating film 41 including an upper surface of the upper contact electrode film 53 and a sidewall of the resistance element 54 (recording layer 52), and the insulating film 62 is formed as an interlayer insulating film on the insulating film 61. The film thickness of the insulating film 61 is smaller than that (for example, several hundreds nm) of the insulating film 62 and it may be set to fall within a range from 5 to 20 nm, for example. The insulating film 61 is made of, for example, a silicon nitride film, while the insulating film 62 is made of, for example, a silicon oxide film. An upper surface of the insulating film 62 is formed flatly such that heights thereof in the phase change memory region 10A and the peripheral circuit region 10B substantially coincides with each other.

In the phase change memory region 10A, a through-hole (an opening, a connection hole) 63 is formed in the insulating films 61 and 62, where at least a portion of the upper contact electrode film 53 of the resistance element 54 is exposed at a bottom portion of the through-hole 63. A plug (a contact electrode, an upper contact electrode contact) 64 is formed within the through-hole 63. The plug 64 includes a conductive barrier film 67a made of a titanium film, a titanium nitride film, a stacked layer film thereof, or the like formed on a bottom portion and a sidewall of the through-hole 63, and a tungsten (W) film (a main conductor film) 67b formed on the conductive barrier film 67a so as to be buried in the through-hole 63. An aluminum film or the like can be used instead of the tungsten film 67b. The through-hole 63 and the plug 64 are formed on an upper portion of the resistance element 54 and the plug 64 is electrically connected to the upper contact electrode film 53 of the resistance element 54. Accordingly, the plug 64 is a conductor portion formed (buried) within an opening (the through-hole 63) of the insulating film 62 which is the interlayer insulating film and electrically connected to the upper contact electrode film 53.

In the peripheral circuit region 10B, a through-hole (an opening, a connection hole) 65 is formed in the insulating films 41, 61, and 62, and an upper surface of the wiring 37 is exposed at a bottom portion of the through-hole 65. A plug (a contact electrode) 66 is formed within the through-hole 65. The plug 66 includes a conductive barrier film 67a made of a titanium film, a titanium nitride film, a stacked layer film thereof, or the like formed on a bottom portion and a sidewall of the through-hole 65, and a tungsten film (a main conductor film) 67b formed on the conductive barrier film 67a so as to be buried in the through-hole 65. The through-hole 65 and the plug 66 are electrically connected to the wiring 37.

A wiring (a second wiring layer) 72 serving as a second layer wiring is formed on the insulating film 62 having the plugs 64 and 66 buried therein. The wiring 72 includes a conductive barrier film 71a made of, for example, a titanium film, a titanium nitride film, a stacked layer film thereof, or the like, and an aluminum (Al) film or an aluminum alloy film (a main conductor film) 71b on the conductive barrier film 71a. The wiring 72 can be configured by further forming a conductive barrier film similar to the conductive barrier film 71a on the aluminum alloy film 71b.

In the phase change memory region 10A, a wiring (a bit line) 72a of the wiring 72 is electrically connected to the upper contact electrode film 53 of the resistance element 54 through the plug 64. Therefore, the wiring 72a configuring the bit line in the phase change memory region 10A is electrically connected to the drain regions 20 and 21 (n$^+$-type semiconductor regions 19a) of the MISFETs QM1 and QM2 in the phase change memory region 10A via the plugs 64, the resistance elements 54, the plugs 43, the wirings 37a, and the plugs 33.

In the peripheral circuit region 10B, the wiring 72 is electrically connected to the wiring 37 via the plug 66 and it is further electrically connected to the n$^+$-type semiconductor region 19b of the MISFET QN or the p$^+$-type semiconductor region 19c of the MISFET QP via the plug 33.

An insulating film (not illustrated) serving as an interlayer insulating film is formed on the insulating film 62 so as to cover the wiring 72, and a wiring layer(s) which is (are) a further upper layer(s) (a third layer wiring and wirings subsequent thereto) and the like are formed, but illustration and descriptions thereof will be omitted here.

A semiconductor integrated circuit including the phase change memory (a phase-change type non-volatile memory) in the phase change memory region 10A and the MISFET in the peripheral circuit region 10B is formed on the semiconductor substrate 11 in this manner, so that the semiconductor device of the embodiment is configured.

As described above, the memory cell of the phase change memory is configured by the recording layers 52 (or the resistance elements 54 including the recording layer 52) and the MISFETs QM1 and QM2 serving as the memory cell transistors (transistors for memory cell selection) and connected to the recording layers 52 (the resistance element 54). The gate electrodes 16a of the MISFETs QM1 and QM2 are electrically connected to word lines (corresponding to the abovementioned word lines WL1 to WL4). The upper surface sides (the upper contact electrode films 53) of the resistance elements 54 are electrically connected to the bit lines (corresponding to the abovementioned bit lines BL1 to BL4) formed of the abovementioned wiring 72a via the plugs 64. The lower surface sides (the lower surface sides of the recording layers 52, namely, the interface layers 51) of the resistance elements 54 are electrically connected to the semiconductor regions 20 and 21 for the drains of the MISFETs QM1 and QM2 via the plugs 43, the wirings 37a, and the plugs 33. The semiconductor region 22 for the sources of the MISFETs QM1 and QM2 is electrically connected to the source wiring 37b (the source line) via the plug 33.

Incidentally, in the embodiment, the case that the n-channel type MISFETs QM1 and QM2 are used as the memory transistors (transistors for memory cell selection) of the phase change memory has been described, but as another aspect, other field effect transistors, for example, p-channel type MISFETs or the like can be used instead of the n-channel type MISFETs QM1 and QM2. Meanwhile, as the memory cell transistors of the phase change memory, it is preferable that MISFETs are used in view of high integration, and it is more preferable that the n-channel type MISFETs QM1 and QM2 having ON-state channel resistances smaller than those of the p-channel type MISFETs are used.

In the embodiment, the resistance elements 54 are electrically connected to the drains (the semiconductor regions 20 and 21) of the MISFETs QM1 and QM2 in the memory region 10A through the plugs 43, the wirings 37 (37a), and the plugs 33, but as another aspect, the resistance elements 54 can be electrically connected to the source of the MISFETs QM1 and QM2 in the memory region 10A through the plugs 43, the wirings 37 (37a), and the plugs 33. That is, the resistance elements 54 may be electrically connected to either of the source or drains of the MISFETs QM1 and QM2 in the memory region 10A through the plugs 43, the wirings 37 (37a), and the plugs 33. Meanwhile, it is more preferable in view of a function of the non-volatile memory that the drains of the MISFETs QM1 and QM2 in the memory region 10A rather than the source thereof are electrically connected to the resistance elements 54 through the plugs 33, the wirings 37 (37a), and the plugs 43.

Next, an operation of the phase change memory (the phase change memory formed in the phase change memory region 2, 10A) will be described.

Figures 5, 6:
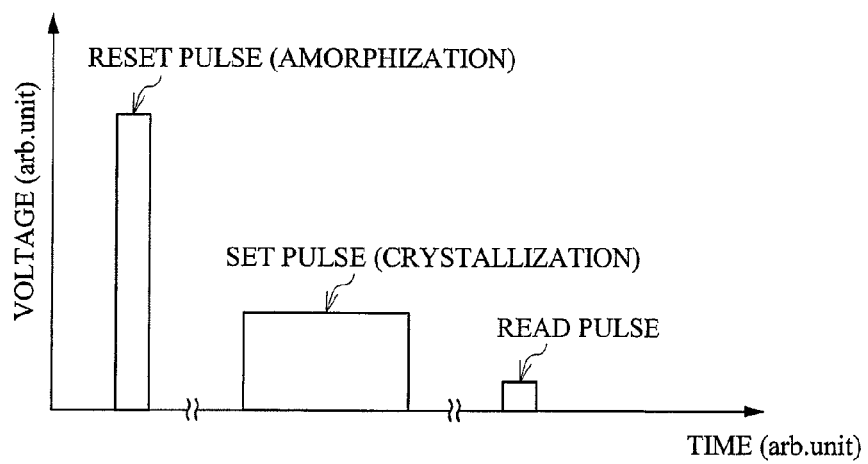
FIG. 5 is an explanatory diagram illustrating correlation between a state of a phase-change film and resistance of the phase-change film of a phase change memory.
FIG. 6 is a graph for describing an operation of the phase change memory.

FIG. 5 is an explanatory diagram (table) illustrating correlation between a state (phase state) of the recording layer 52 and resistance (resistivity) of the recording layer 52. As also illustrated in FIG. 5, in the recording layer 52, resistivity in an amorphous state thereof and resistivity in a crystalline state thereof are different from each other, where the resistivity of the recording layer 52 becomes high resistance (high resistivity) in the amorphous state while it becomes low resistance (low resistivity) in the crystalline state. For example, the resistivity of the recording layer 52 in the amorphous state becomes larger than the resistivity of the recording layer 52 in the crystalline state by about 10 to 10000 times. Therefore, the recording layer 52 can transit (phase change) between two states of the crystalline state and the amorphous state, and it can function as a resistance element whose resistance value changes according to transition between the two states. As described later, the recording layer 52 can be caused to transit (phase-change) between the two states of the crystalline state and the amorphous state by heating process (heating process utilizing Joule heat). Accordingly, the recording layer 52 is made of phase change material whose resistance value changes according to heat process and it can function as a resistance element whose resistance value changes according to heat process.

Figure 7:
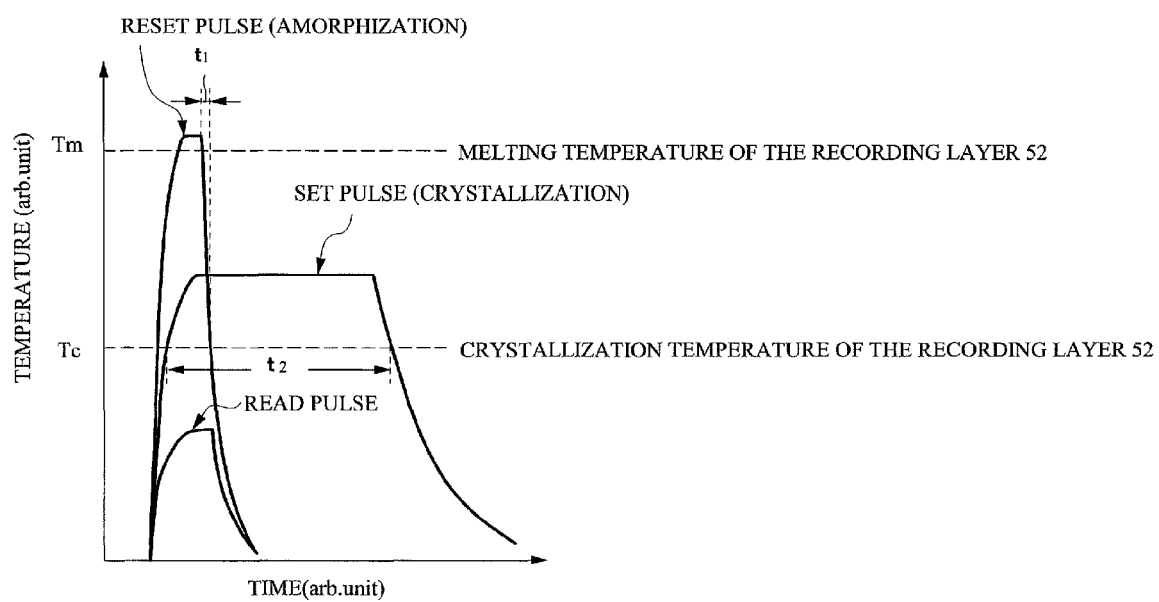
FIG. 7 is a graph for describing an operation of the phase change memory.

FIG. 6 and FIG. 7 are graphs for describing an operation of a phase change memory. A vertical axis in the graph of FIG. 6 corresponds to voltages (arbitrary unit) of a reset pulse, a set pulse, and read pulse applied to a phase change memory, while a horizontal axis in the same corresponds to time (arbitrary unit). A vertical axis in the graph of FIG. 7 corresponds to temperature (arbitrary unit) of the recoding layer 52 when the reset pulse, the set pulse, or the read pulse is applied to the phase change memory, while a horizontal axis in the same corresponds to time (arbitrary unit).

To write storage information '0' in the storage element (the memory cell of the phase change memory), namely, upon a reset operation (amorphization of the recording layer 52) of the phase change memory, a reset pulse (a reset voltage pulse) such as that shown in FIG. 6 is applied to the resistance element 54 (the recording layer 52) via the bit line (the wiring 72a) and the plug 64. A fixed potential (for example, 0 V) is supplied to the source (the semiconductor region 22) of the MISFETs QM1 and QM2 through the source wiring 37b and the plug 33, and a predetermined voltage is applied to the gate electrode 16a of the selected MISFET through the word line. The reset pulse is such a voltage pulse as to heat the recording layer 52 to its melting temperature (the melting temperature of the chalcogenide material composing the recording layer 52) $T_m$ or higher and to rapidly cool the same down to its amorphization temperature $T_a$ or lower, and it applies a relatively high voltage (for example, about 1.5 V) to the recording layer 52 for a relatively short time. Upon the reset pulse application, relatively large current flows so that the temperature of the recording layer 52 rises up to the melting temperature $T_m$ or higher and the recording layer 52 melts as illustrated in FIG. 7, and the recording layer 52 is rapidly cooled down to the amorphization temperature $T_a$ or lower so that the recording layer 52 becomes the amorphous state (the reset state) when application of the reset pulse is terminated. By shortening an application time of a reset pulse to reduce total application energy, and shorting a cooling time $t_1$, for example, setting the cooling time to about 1 ns, the recording layer 52 (the chalcogenide material) becomes the amorphous state having high resistance. In this manner, the reset operation is an operation for changing a section between the plug 43 and the upper contact electrode film 53 to a high resistance for rewriting of the memory element (the phase change memory element) formed of the plug 43 (the bottom contact electrode) and the resistance element 54.

On the contrary, to write storage information '1', namely, upon a set operation (crystallization of the recording layer 52) of the phase change memory, a set pulse (a set voltage pulse) such as that illustrated in FIG. 6 is applied to the resistance element 54 (the recording layer 52) through the bit line (the wiring 72a) and the plug 64. A fixed potential (for example, 0 V) is supplied to the source (the semiconductor region 22) of the MISFETs QM1 and QM2 via the source wirings 37b and the plugs 33, and a predetermined voltage is applied to the gate electrode 16a of the selected MISFET via the word line. The set pulse is such a voltage pulse as to maintain the temperature of the recording layer 52 in a temperature which is equal to a glass transition point or a temperature higher than a crystallization temperature $T_c$ that is higher than the glass transition point, where voltage (for example, about 0.8 V) lower than that of the reset pulse is applied to the resistance element 54 for a time period (equal to or longer than the crystallization time) longer than that of the reset pulse. Upon the set pulse application, current lower than that at the reset time flows for a relatively long time, and the temperature of the recording layer 52 rises to a temperature equal to or higher than the crystallization temperature $T_c$ of the recording layer 52 as shown in FIG. 7, so that the recording layer 52 is crystallized, and, when application of the set pulse is terminated, the recording layer 52 is cooled down to reach the crystalline state (polycrystalline state) with low resistance (the set state). A time $t_2$ required for crystallization varies according to the composition of the chalcogenide material composing the recording layer 52, and for example, it is about 50 ns. The temperature of the recording layer 52 (the resistance element 54) illustrated in FIG. 7 depends on Joule heat generated by the recording layer 52 itself, heat diffusion to the surrounding, or the like. Thus, the set operation is an operation for changing a section between the plug 43 and the upper contact electrode film 53 to low resistance for rewriting of the memory element (the phase change memory element) formed of the plug 43 (the bottom contact electrode) and the resistance element 54.

In a read operation of the phase change memory, a read pulse (a read voltage pulse) such as that illustrated in FIG. 6 is applied to the resistance element 54 (the recording layer 52) via the bit line (the wiring 72a) and the plug 64. A fixed potential (for example, 0 V) is supplied to the source (the semiconductor region 22) of the MISFETs QM1 and QM2 via the source wiring 37b and the plug 33, and a predetermined voltage is applied to the gate electrode 16a of the selected MISFET via the word line. The read pulse applies voltage (for example, about 0.3 V) which is further lower than that of the set pulse for a time shorter than that of the set pulse. The voltage of the read pulse is relatively low, and even if application of the read pulse is performed, the temperature of the recording layer 52 does not rise to the crystallization temperature $T_c$ of the recording layer 52 or higher as illustrated in FIG. 7, so that the phase state of the recording layer 52 does not change. When the recording layer 52 is in the crystalline state, the recording layer 52 (the resistance element 54) has a relatively low resistance, and when the recording layer 52 is in the amorphous state, the recording layer 52 (the resistance element 54) has a relatively high resistance. Therefore, when the read pulse is applied to the recording layer 52, current flowing in the MISFET (QM1 or QM2) connected with the recording layer 52 (the resistance element 54) becomes relatively large when the recording layer 52 is in the crystalline state, while it becomes relatively small when the recording layer 52 is in the amorphous state. Accordingly, data (whether the recording layer 52 between the plug 43 and the upper contact electrode film 53 is in the crystalline state (the low-resistance state) or in the amorphous state (the high-resistance state) can be discriminated according to magnitude of flowing current.

By changing the atomic arrangement of the recording layer 52 according to the reset operation and the set operation in this manner, for example, transition about whether the recording layer 52 is in the amorphous state or it is in the crystalline state is performed so that the resistance of the resistance element 54 (the recording layer 52) can be changed to record (memorize, store, write) data in the phase change memory. Data (storage information) recorded in the phase change memory can be read according to the read operation utilizing whether the recording layer 52 is in the high-resistance state (the amorphous state) or in the low-resistance state (the crystalline state) as the storage information of the phase change memory. Therefore, the recording layer 52 is a recording layer for information of the phase change memory.

Figure 8:
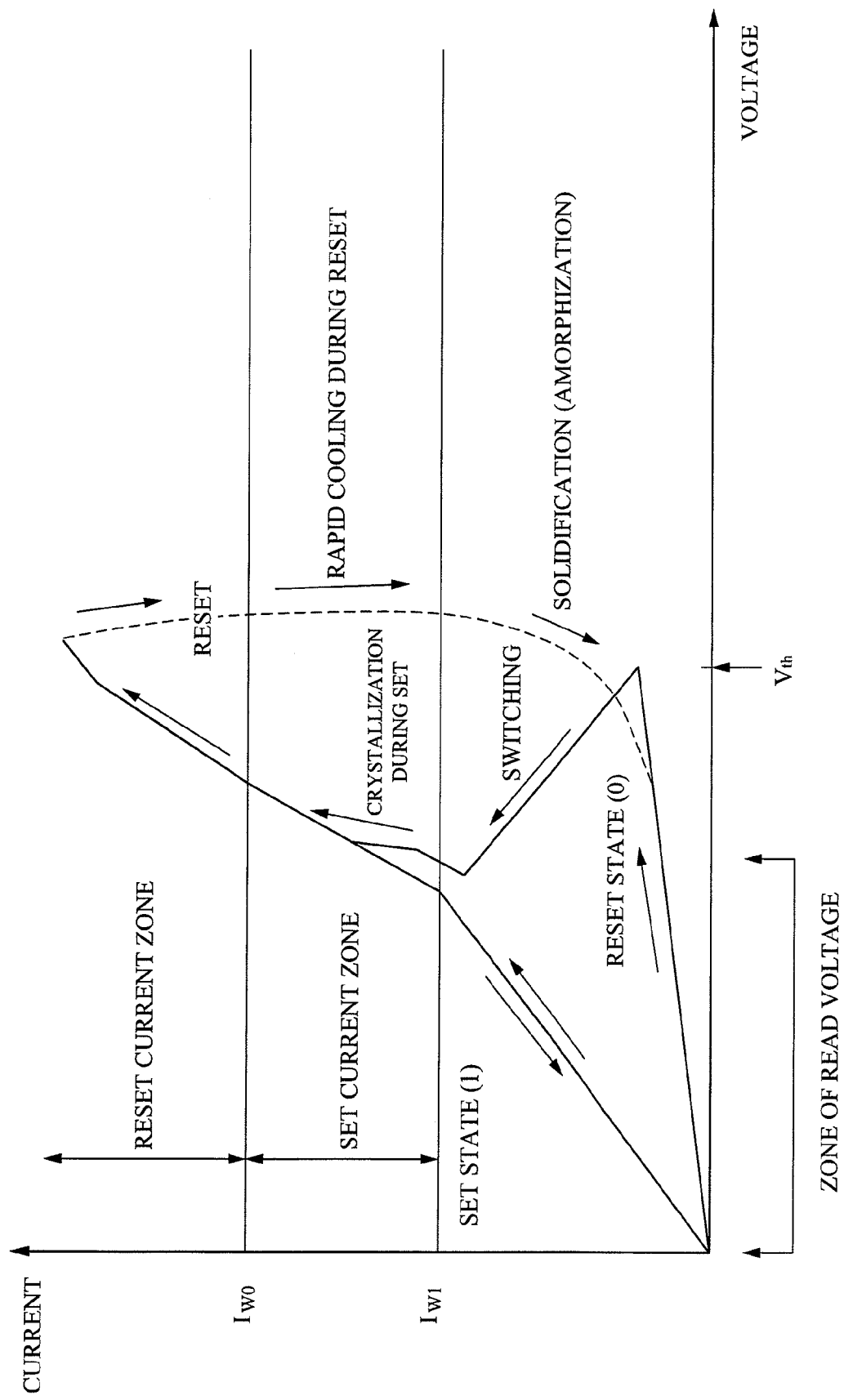
FIG. 8 is an explanatory diagram schematically illustrating an operation principle of a storage element using chalcogenide material.

FIG. 8 is an explanatory diagram (a graph) schematically illustrating an operation principle of the storage element (the recording layer 52) using chalcogenide material, where I-V characteristic of the storage element is illustrated. A horizontal axis in the graph of FIG. 8 corresponds to applied voltage to the storage element (the recording layer 52), and a vertical axis in the same corresponds to current flowing in the storage element (the recording layer 52). In FIG. 8, such a fact that, when application of set current within a range from $I_{W1}$ to $I_{W0}$ is performed, storage information '1' is written, and when application of reset current equal to $I_{W0}$ or more is performed, storage information '0' is written is illustrated. As illustrated by the I-V characteristic in FIG. 8, by applying a current pulse having a value corresponding to the writing information to the storage element (the recording layer 52), the crystalline state of the storage element is controlled. Incidentally, it doesn't matter which crystalline state is set to '0' and the other is set to '1'. In the following, four write operations will be described in more detail following FIG. 8.

As also understood from FIG. 8, first, in the case of writing '1' in the storage element (the recording layer 52) in an initial state '1', when application of set current (set pulse) is performed, reciprocation between the initial state and a set zone tracing a low-resistance curve of the set (crystal) state is performed, so that the state is maintained. Second, in the case of writing '0' in the storage element (the recording layer 52) in an initial state '1', when application of reset current (reset pulse) is performed, the current traces the low-resistance curve in the set state to reach the reset current. Next, since partial melting due to Joule heat starts, the electric conductivity of the storage element (the recording layer 52) gradually lowers. When the pulse is cut off so that the storage element in a liquid phase is rapidly cooled, the state is changed to the amorphous state, so that the storage element (the recording layer 52) traces a high-resistance curve in the reset (amorphous) state to return to the initial state. The portion indicated by a dotted line in FIG. 8 is a virtual line indicating that, if application of voltage is continued as it is, current should be changed in this manner according to change of the resistance value though the reset pulse has been already cut off. Third, in the case of writing '1' in the storage element (the recording layer 52) in the initial state '0', when application of set current (set pulse) is performed, the state is switched to a low-resistance state when a terminal voltage of the storage element exceeds a threshold voltage Vth. After the switching, crystallization progresses due to Joule heat. When the current value reaches the set current, the crystalline region spreads to pose phase change, and the resistance value lowers, so that the storage element (the recording layer 52) traces the low-resistance curve to return to the initial state. The reason why a slope of the voltage-current curve becomes mild in the middle of the curve is that a region which has been switched to the low-resistance state is switched OFF so that only resistance lowering due to crystallization remains. Fourth, in the case of writing '0' in the storage element (the recording layer 52) in the initial state '0', there is little time for crystallization after the abovementioned switching, and the storage element (the recording layer 52) traces the low-resistance curve according to the switching to reach the reset zone, thereby being melted, rapidly cooled, and solidified to return to the initial state.

In view of such an operation principle of the storage element, operation must be performed so as not to destroy storage information in the read operation with suppressing the voltage to a voltage lower than the threshold voltage Vth at most. In practice, since the threshold Vth depends on a voltage application time and it tends to lower when the application time is long, it is necessary to set the voltage not causing switching to a low-resistance state exceeding the threshold voltage Vth within the read time. Accordingly, operation based upon these principles and achieving the memory array configuration illustrated in FIG. 2 will be described below.

Figure 9:
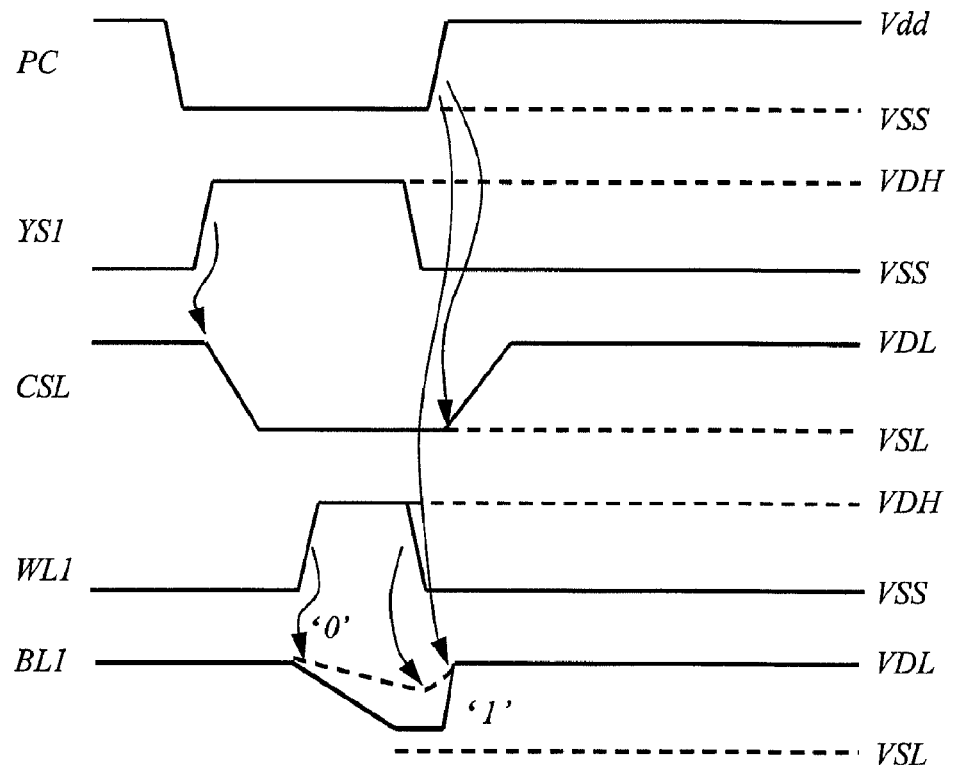
FIG. 9 is an explanatory diagram illustrating read operation timing of a memory array.

Next, read operation of a memory cell using the array configuration illustrated in FIG. 2 will be described with reference to FIG. 9 and above described FIG. 2. Here, FIG. 9 illustrates one example of operation waveforms (voltage application waveforms) in the case of selecting the memory cell MC11.

First, as a precharge enable signal PC is being retained at the source voltage Vdd (for example, 1.5 V) in a standby state, the bit line BL1 is maintained in a precharge voltage VDL by n-type channel type MIS transistors (MISFETs) QC1 to QC4. Here, the precharge voltage VDL has a value which has been lowered from Vdd by a threshold voltage of the transistor, and it is, for example, 1.0 V. A common bit line I/O is also precharged to the precharge voltage VDL by a read circuit.

When the read operation starts, the precharge enable signal PC being held at the source voltage Vdd is driven to a ground potential GND (corresponding to VSS), and the bit selection line (the column selection line) YS1 being put in the ground potential GND (corresponding to VSS) is driven to a boost potential VDH (for example, 1.5 V or higher), so that the transistor (MISFET) QD1 is made conductive. At this time, since the bit line BL1 is at a potential equal to that of the common bit line I/O, it is held in the precharge voltage VDL, but the source line CSL is driven to a source voltage VSL (for example, 0 V). Regarding the source voltage VSL and the precharge voltage VDL, the precharge voltage VDL is higher than the source voltage VSL, and a difference between the two voltages is set to have such a relationship that the terminal voltage of the memory element MR falls in a range of a read voltage zone such as that illustrated in FIG. 8.

Next, since the word line WL1 in the ground potential GND (corresponding to VSS) is driven to the boost potential VDH, the transistors (MISFETs) QMp (p=1, 2, . . . , m) in all the memory cells on the word line WL1 are made conductive. At this time, a current path is generated within the memory cell MC11 where a potential difference has occurred in the memory element MR, so that the bit line BL1 is discharged toward the source voltage VSL at a speed corresponding to the resistance value of the memory element MR. In FIG. 9, since a case that the storage information '1' is held is smaller in resistance value than a case that the storage information '0' is held, the former has a discharge speed faster than the latter. Accordingly, signal voltage corresponding to the storage information is generated. Since potential differences in the memory elements MR are 0 in non-selected memory cells MC12 to MC1m, the non-selected bit lines BL2 to BL4 are held at the precharge voltage VDL. That is, only the memory cell MC11 selected by the word line WL1 and the bit line BL1 causes to read current to flow through the bit line BL1. Here, after the read information is discriminated by the read circuit, the word line WL1 can be turned off. Incidentally, in case that the discrimination is slow, when turning on of the word line WL1 is continued, the selected bit line BL1 is discharged to a value close to the source voltage VSL even in the case of reading the storage information '0', and a difference between a signal voltage for '0' read and a signal voltage for '1' read is decreased, so that the storage information may not be read correctly. In such a case, as illustrated in FIG. 9, malfunction can be prevented by turning off the word line WL1 at timing before a bit line voltage in the case of '0' read exceeds a reference voltage VDR. Since signal voltage on the common bit line (common data line) I/O is held by turning off the word line to cut off the current path, the read circuit can discriminate a positive or negative signal generated based upon the reference voltage VDR as a reference. When the abovementioned read operation is terminated, the common bit line (common data line) I/O is driven to the precharge voltage VDL to return back to a standby state.

Incidentally, in the standby state, when assuming that the bit line or the source line of the memory array is put in a floating state, a capacitor of the bit line whose voltage is unstable is charged from the common bit line upon connecting the bit line and the common bit line to each other at the time of starting the read operation. Therefore, in FIG. 9, the bit selection line (column selection line) YS1 is also turned off corresponding to the word line WL1, and the bit line and the source line are driven to the precharge potential VDL by driving the precharge enable signal PC put in the ground potential GND (corresponding to VSS) to the source voltage Vdd so that they are put in a standby state. The boost potential VDH is a voltage such as that widely used in the conventional DRAM, and it is set so as to satisfy a relationship of VDH>Vdd+VTN using the source voltage Vdd and a threshold voltage VTN of the n-channel type MIS transistor. For example, in a write operation in the phase change memory, as described later, current larger than that in the read operation is necessary to be flowed. In the embodiment, therefore, correct write can be performed by driving the word line and the bit selection line to the boost potential VDH to lower the resistance of the n-channel type MIS transistor. A voltage between the gate and the source of the transistor can be assured by setting the precharge voltage VDL to be higher than the source voltage VSL to utilize the selected source line as the source of the transistor (MISFET) QMm in the selected memory cell without depending on the resistance of the memory element MR. Incidentally, even in a reversed potential relationship, similar selection operation can be performed when a difference between the gate and the source is set to fall within a range of a zone of read voltage such as shown in FIG. 8.

Incidentally, FIG. 9 shows an example where the word line WL1 is driven after the source line CSL is driven, but such a configuration can be used for certain reasons of design that the source line CSL is driven after the word line WL1 is driven. In this case, since the word line WL1 is first driven so that the selected transistor QM1 is made conductive, the terminal voltage of the memory element MR is secured in 0 V. Thereafter, when the source line CSL is driven, the terminal voltage of the memory element MR increases from 0 V, but a value thereof can be controlled by a driving speed of the source line CSL, so that it can be set to fall within the range of above-mentioned read region. Similarly, the word line WL1 and the source line CSL can be substantially simultaneously driven. By driving the bit selection line (the column selection line) YS1 prior to a pulse of pulses of the word line WL1 and the source line CSL which is outputted at a later driving timing, an output waiting time to the I/O can be reduced so that the access time is reduced.

The example in which the memory cell MC11 is selected has been described in the in the foregoing, but the memory cells on the same bit line are not selected because their word line voltages are fixed to the ground potential GND (corresponding to VSS). Since the other bit lines and source lines are in the same potential VDL, the remaining memory cells are maintained in a state of non-selected cells.

In the above description, the word line in the standby state is set to the ground potential GND (corresponding to VSS), and the source line in the selected state is set to a positive source voltage VSL such as 0.5 V. The voltage relationship is set such that current flowing through the non-selected memory cell does not affect the operation. That is, setting can be made such that a source line is selected, and when a word line selects a non-selected memory cell, for example, the memory cell MC11, the transistors (MISFETs) QM of the non-selected memory cells MC21 to MCn1 become sufficiently OFF. As described here, by setting the word line voltage in the standby state to the ground potential GND (corresponding to VSS) and setting the source voltage VSL to a positive voltage, the threshold voltage of the transistor QM can be made low. According to the circumstances, it is possible to set the selected source line to the ground potential 0 V and set the word line in the standby state to a negative voltage. Even in the case, the threshold voltage of the transistor QM can be made low. It is necessary to generate a negative voltage for the word line in the standby state, but since the voltage of the source line at a selection time is the ground potential GND (corresponding to VSS) applied from the outside, it can be made stable easily. When the threshold voltage of the transistor QM is made sufficiently high, the source line at the selection time and the word line in the standby state may be set to the ground potential 0 V. In this case, since the voltage of the source line at the selection time is the ground potential GND (corresponding to VSS) applied from the outside and the capacitance of the word line in the standby state serves as a stabilizing capacitance, the voltage of the source line at the selection time can be further stabilized.

Further, the operation for discriminating a signal voltage read to the common bit line (common data line) I/O by the read circuit has been here described, but an operation for discriminating current flowing in the common bit line (common data line) I/O may be used. In that case, a sense circuit with small input impedance, such as that described in the abovementioned U.S. Pat. No. 5,883,827, can be used in the read circuit. By using such a system for sensing current, influence of a wiring capacitance of the common bit line (common data line) becomes small, so that a read time can be shortened.

Figure 10:
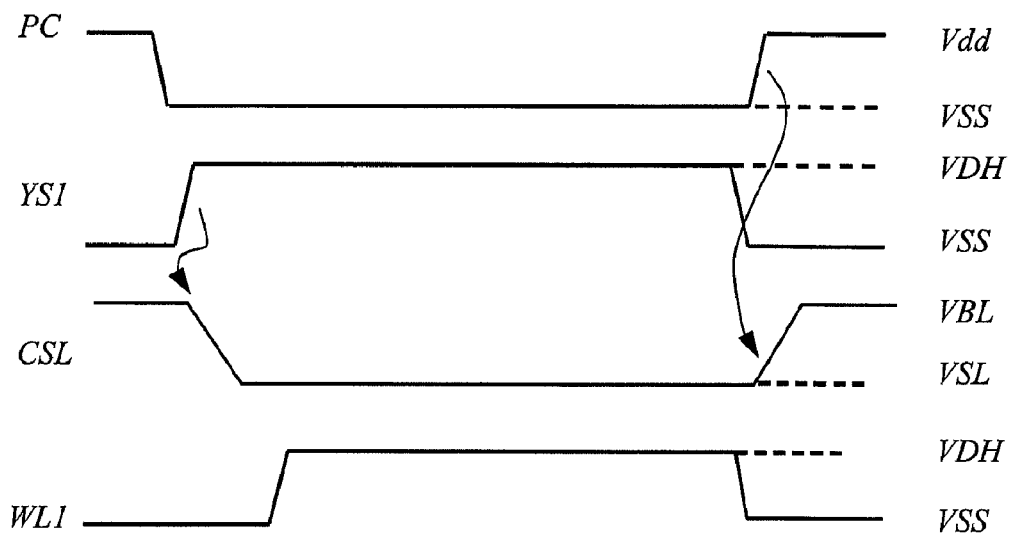
FIG. 10 is an explanatory diagram illustrating write operation timing of the memory array.

Further, a write operation of the memory cell using the array configuration illustrated in FIG. 2 will be described with reference to FIG. 10. Incidentally, FIG. 10 depicts waveforms in the case of selecting the memory cell MC11.

First, a selecting operation of the memory cell MC11 is performed in the same manner as the read operation. When the memory cell MC11 is selected, a write circuit drives the common bit line (common data line) I/O so that write current IWC is generated. When '0' is written, the reset current set to a value falling within the range illustrated in FIG. 8 is applied to the memory cell MC11. A pulse width of the reset current is short and the common bit line (common data line) I/O returns back to the standby state just after being driven so that a current value becomes 0. The same Joule heat as a reset pulse such as those illustrated in FIG. 6 and FIG. 7 is generated by such reset current. On the contrary, when '1' is written, application of set current that is set to a value falling within the range illustrated in FIG. 8 is performed. A pulse width of the set current is about 50 ns. The same Joule heat as a set pulse such as those shown in FIG. 6 and FIG. 7 is generated by such set current. Since an application time and a current value of the write pulse are controlled by the write circuit, the memory cell is in a state of being selected by the pulse width of the set current when writing either storage information.

Next, manufacturing steps of the semiconductor device 1 of the embodiment will be described with reference to the drawings. FIG. 11 through FIG. 20 are cross-sectional views of main parts during manufacturing steps of the semiconductor device 1 of the embodiment, where a region corresponding to the above-described FIG. 4 is illustrated. Incidentally, for simplifying understanding, in FIG. 15 to FIG. 20, illustration of a portion corresponding to the insulating film 31 in FIG. 14 and the structure positioned below the insulating film 31 is omitted.

Figure 11:
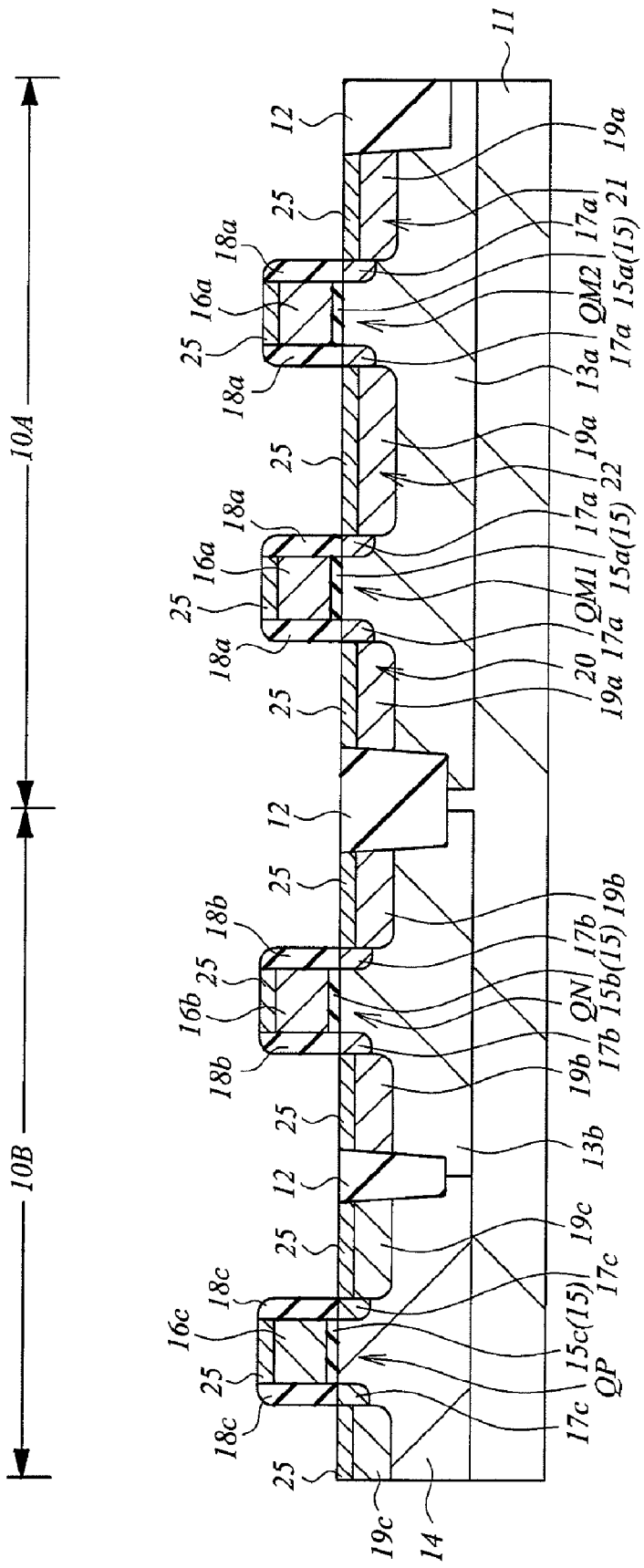
FIG. 11 is a sectional view of main parts of the semiconductor device of the embodiment of the present invention during a manufacturing step thereof.

As illustrated in FIG. 11, first, a semiconductor substrate (semiconductor wafer) 11 made of, for example, p-type monocrystalline silicon is prepared. Then, device isolation regions 12 made of insulator are formed on a main surface of the semiconductor substrate 11 by, for example, STI (shallow trench isolation) method or LOCOS (local oxidization of silicon) method, or the like. By forming the device isolation regions 12, active regions whose peripheries are defined by the device isolation regions 12 are formed on the main surface of the semiconductor substrate 11.

Next, p-type wells 13a and 13b, and an n-type well 14 are formed on the main surface of the semiconductor substrate 11. The p-type well 13a of these wells is formed in the phase-change region 10A, and the p-type well 13b and the n-type well 14 are formed in the peripheral circuit region 10B. For example, the p-type wells 13a and 13b can be formed by ion-implanting p-type impurities (for example, boron (B)) in portions of the semiconductor substrate 11, and the n-type well 14 can be formed by ion-implanting n-type impurities (for example, phosphor (P) or arsenic (As)) into another portion of the semiconductor substrate 11.

Next, an insulating film 15 for a gate insulating film made of a thin silicon oxide film or the like is formed on the surfaces of the p-type wells 13a and 13b and the n-type well 14 of the semiconductor substrate 11. An oxynitride silicon film or the like can be used as the insulating film 15. A film thickness of the insulating film 15 can be set to, for example, about 1.5 to 10 nm.

Next, gate electrodes 16a, 16b, and 16c are formed on the insulating films 15 of the p-type wells 13a and 13b, and the n-type well 14. For example, the gate electrodes 16a, 16b, and 16c made of patterned polycrystal silicon film (a conductor film) can be formed by forming a polycrystal silicon film having a low resistance on a whole surface of the main surface of the semiconductor substrate 11 including the insulating films 15 as a conductor film and patterning the polycrystal silicon film using photoresist method, dry-etching method, or the like. The insulating film 15 remaining under the gate electrode 16a constitutes a gate insulating film 15a, the insulating film 15 remaining under the gate electrode 16b constitutes a gate insulating film 15b, and the insulating film 15 remaining under the gate electrode 16c constitutes a gate insulating film 15c. Incidentally, by doping impurities at the film formation time or after the film formation, the gate electrodes 16a and 16b are formed of polysilicon films (doped polysilicon films) introduced with n-type impurities, while the gate electrode 16c is formed of a polysilicon film (doped polysilicon film) introduced with p-type impurities.

Next, by ion-implanting n-type impurities such as phosphor (P) or arsenic (As), n$^-$-type semiconductor regions 17a are formed in regions at both sides of the gate electrode 16a of the p-type well 13a and n$^-$-type semiconductor regions 17b are formed in regions at both sides of the gate electrode 16b of the p-type well 13b. By ion-implanting p-type impurities such as boron (B), p$^-$-type semiconductor regions 17c are formed in regions at both sides of the gate electrode 16c of the n-type well 14.

Next, sidewalls 18a, 18b, and 18c are formed on sidewalls of the gate electrodes 16a, 16b, and 16c. The sidewalls 18a, 18b, and 18c can be formed, for example, by depositing an insulating film made of a silicon oxide film, silicon nitride film, a stacked film thereof, or the like on the semiconductor substrate 11 and performing anisotropic etching to the insulating film.

Next, by ion-implanting n-type impurities such as phosphor (P) or arsenic (As), n$^+$-type semiconductor regions 19a are formed in regions at both sides of the gate electrode 16a and the sidewalls 18a of the p-type well 13a, and n$^+$-type semiconductor regions 19b are formed in regions at both sides of the gate electrode 16b and the sidewalls 18b of the p-type well 13b. By ion-implanting p-type impurities such as boron (B), p$^+$-type semiconductor regions 19c are formed in regions at both sides of the gate electrode 16c and the sidewalls 18c of the n-type well 14. After ion implantation, an annealing process (thermal treatment) can be performed for activation of the introduced impurities.

Thereby, the n-type semiconductor regions 20 and 21 functioning as the drain regions of the MISFETs QM1 and QM2 in the phase change memory region 10A and the semiconductor region 22 functioning as the common source region of the MISFETs QM1 and QM2 are formed by the n$^+$-type semiconductor regions 19a and the n$^-$-type semiconductor regions 17a, respectively. An n-type semiconductor region functioning as the drain region of the MISFET QN in the peripheral circuit region 10B and an n-type semiconductor region functioning as the source region of the MISFET QN are formed by the n$^+$-type semiconductor region 19b and the n$^-$-type semiconductor region 17b, respectively, and a p-type semiconductor region functioning as the drain region of the MISFET QP and a p-type semiconductor region functioning as the source region of the MISFET QP are formed by the p$^+$-type semiconductor region 19c and the p$^-$-type semiconductor region 17c, respectively.

Next, metal silicide layers 25 are formed on surfaces of the gate electrodes 16a, 16b, and 16c, n$^+$-type semiconductor regions 19a and 19b, and the p$^+$-type semiconductor region 19c by exposing the surfaces of the gate electrodes 16a, 16b, and 16c, n$^+$-type semiconductor regions 19a and 19b, and the p$^+$-type semiconductor region 19c, depositing a metal film such as, for example, a cobalt (Co) film on the surfaces, and performing heat treatment. Thereafter, unreacted part of the cobalt film (metal film) is removed.

The structure illustrated in FIG. 11 is obtained in this manner. According to the steps described above, n-channel type MISFETs QM1 and QM2 are formed in the phase-change region 10A, and an n-channel type MISFET QN and a p-channel type MISFET QP are formed in the peripheral circuit region 10B. Accordingly, the MISFETs QM1 and QM2 in the phase change memory region 10A and the MISFETs QN and QP in the peripheral circuit region 10B are formed with the same manufacturing steps.

Figure 12:
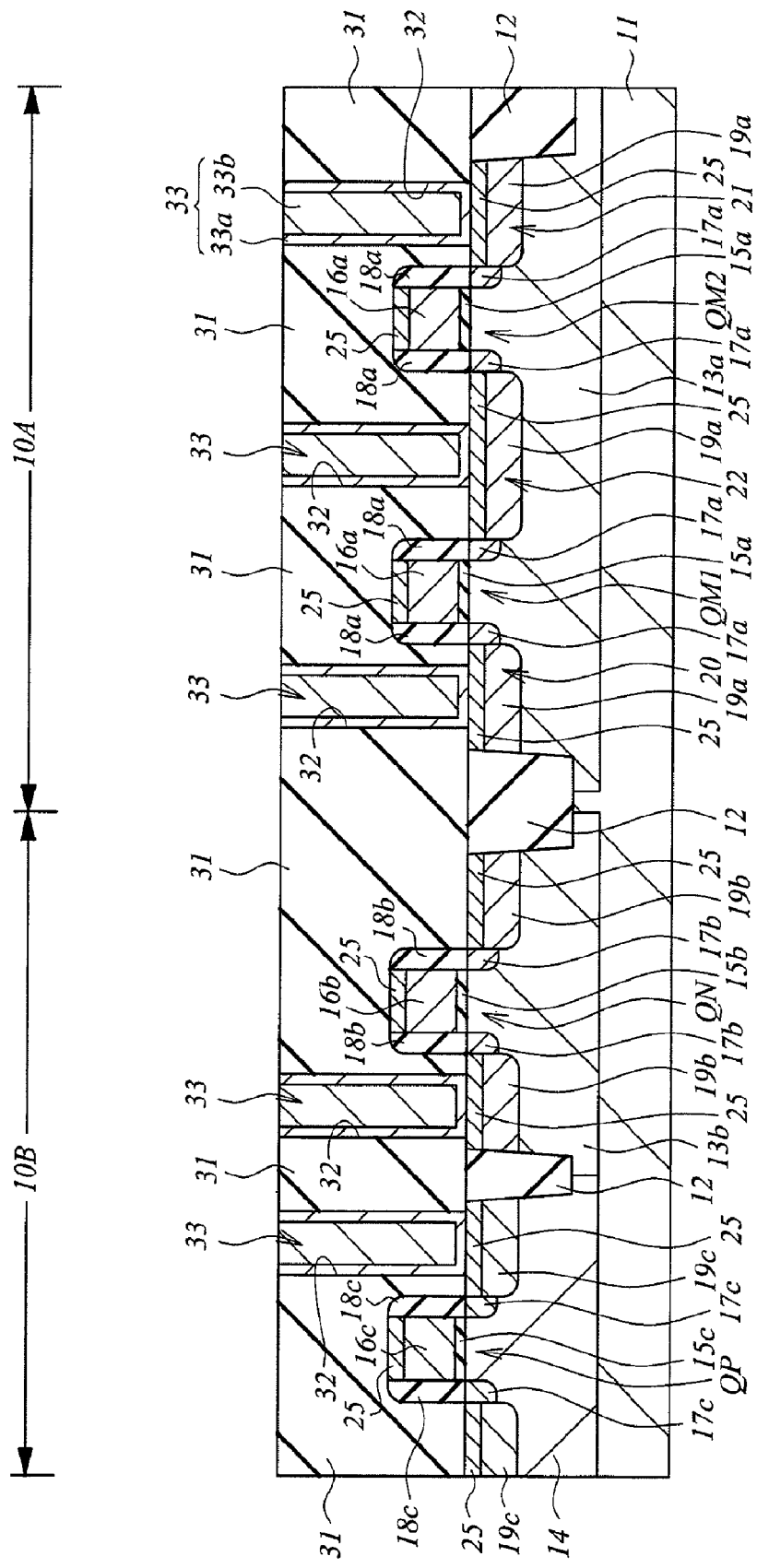
FIG. 12 is a sectional view of main parts of the semiconductor device during a manufacturing process continued from FIG. 11.

Next, as illustrated in FIG. 12, an insulating film (an interlayer insulating film) 31 is formed on the semiconductor substrate 11 so as to cover the gate electrodes 16a, 16b, and 16c. The insulating film 31 is made of a silicon oxide film, for example. The insulating film 31 may be formed of a stacked film formed of a plurality of insulating films. After forming the insulating film 31, an upper surface of the insulating film 31 is planarized by conducting CMP process or the like, as necessary. Thereby, heights of upper surfaces of the insulating films 31 in the phase change memory region 10A and the peripheral circuit region 10B substantially coincide with each other.

Next, contact holes 32 are formed in the insulating film 31 by dry-etching the insulating film 31 with using a photoresist pattern (not illustrated), which is formed on the insulating film 31 by using photolithography method, as an etching mask. Portions of the main surface of the semiconductor substrate 11, for example, portions of (the metal silicide layer 25 on the surfaces of) the n$^+$-type semiconductor regions 19a and 19b and the p$^+$-type semiconductor region 19c and portions of (the metal silicide layer 25 on the surfaces of) the gate electrodes 16a, 16b, and 16c, or the like are exposed at bottom portions of the contact holes 32.

Next, plugs 33 are formed in the contact holes 32. At this time, for example, after a conductive barrier film 33a is formed on the insulating film 31 including inside of the contact hole 32 by sputtering method or the like, a tungsten film 33b is formed on the conductive barrier film 33a so as to be buried in the contact hole 32 by CVD method or the like, and unnecessary tungsten film 33b and conductive barrier film 33a on the insulating film 31 are removed by CMP method, etch-back method, or the like. Thereby, the plug 33 formed of the tungsten film 33b and the conductive barrier film 33a remaining and buried in the contact hole 32 can be formed.

Figure 13:
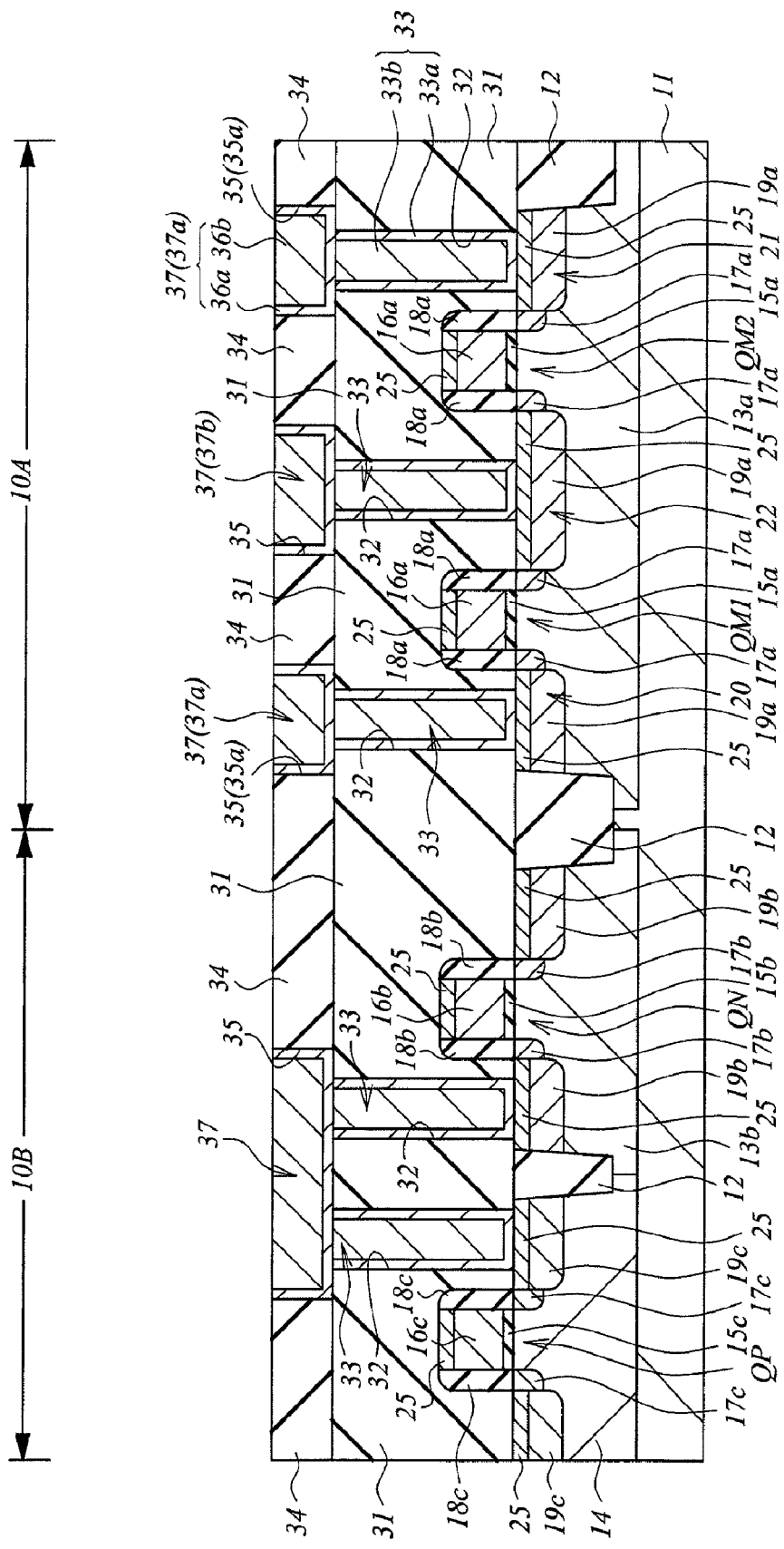
FIG. 13 is a sectional view of main parts of the semiconductor device during the manufacturing process continued from FIG. 12.

Next, as illustrated in FIG. 13, an insulating film 34 is formed on the insulating film 31 having the plugs 33 buried therein. Thereafter, wiring trenches (openings) 35 are formed in the insulating film 34 by dry-etching the insulating film 34 with using a photoresist pattern (not illustrated) that is formed on the insulating film 34 by using photolithography method as an etching mask. Upper surfaces of the plugs 33 are exposed at bottom portions of the wiring trenches 35. Incidentally, some wiring trenches 35 of the wiring trenches 35 through which the plugs 33 formed on the drain regions (the semiconductor regions 20 and 21) of the MISFETs QM1 and QM2 in the phase change memory region 10A are exposed, namely, openings 35a can be formed as hole (connection hole)-like patterns having sizes larger than planar sizes of the plugs 33 exposed through the patterns instead of groove-like patterns. In the embodiment, the openings 35a are formed simultaneously with the other wiring trenches 35, but the openings 35a and the other wiring trenches 35 can also be formed in different steps by using a photoresist pattern for formation of the openings 35a and a photoresist pattern for formation of the other wiring trenches 35 separately.

Next, wirings (first layer wirings) 37 are formed in the wiring trenches 35. At this time, for example, a conductive barrier film 36a is formed on the insulating film 34 including the inside (a bottom portion and a side wall) of the wiring trench 35 by sputtering method or the like, and then a main conductor film 36b made of a tungsten film or the like is formed on the conductive barrier film 36a so as to be buried in the wiring trench 35 by CVD method or the like, and unnecessary part of the main conductor film 36b and conductive barrier film 36a on the insulating film 34 are removed by CMP method, etch-back method, or the like. Thereby, the wiring 37 formed of the main conductor film 36b and the conductive barrier film 36a remaining and buried in the wiring trench 35 can be formed.

Some wirings 37a of the wirings 37, which are formed in the openings 35a in the phase change memory region 10A, are electrically connected to the drain regions (the semiconductor regions 20 and 21) of the MISFETs QM1 and QM2 in the phase change memory region 10A through the plugs 33. The wiring 37a does not extend on the insulating film 31 so as to connect semiconductor elements formed on the semiconductor substrate 11 but it locally extends in the insulating film 31 so as to electrically connect the plug 43 and the plug 33 being interposed between the plug 43 and the plug 33. Therefore, the wiring 37a can be regarded as a conductor portion for connection (a contact electrode) instead of the wiring. In the phase change memory region 10A, a source wiring 37b connected to the semiconductor region 22 (the n$^+$-type semiconductor region 19a) for the source of the MISFETs QM1 and QM2 through the plug 33 is formed from the wiring 37.

The wiring 37 is not limited to the buried tungsten wiring such as that described above and it may be modified variously, for example, may be tungsten wiring other than buried type, or aluminum wiring.

Figure 14:
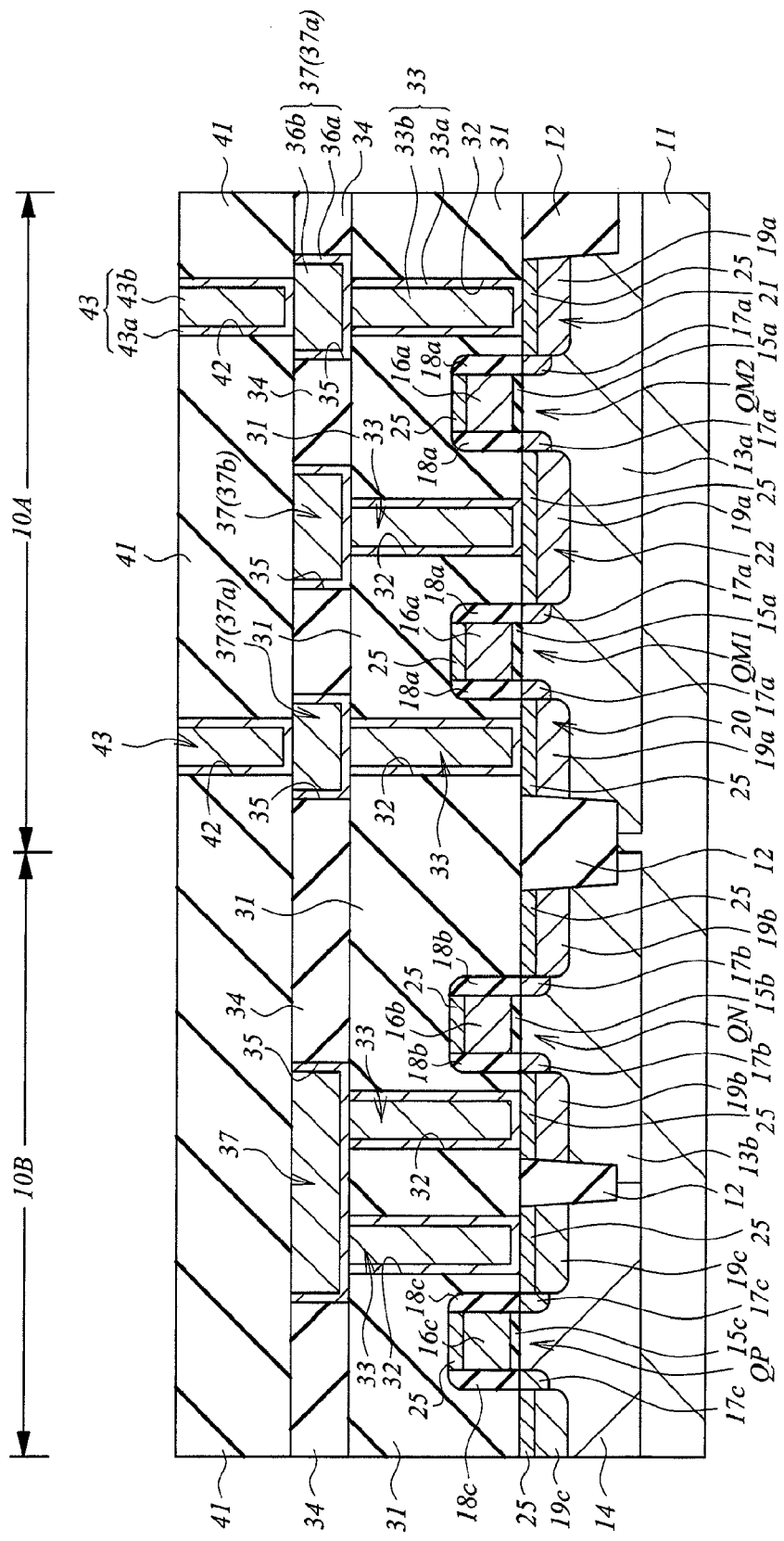
FIG. 14 is a sectional view of main parts of the semiconductor device during the manufacturing process continued from FIG. 13.

Next, as shown in FIG. 14, an insulating film (an interlayer insulating film) 41 is formed on the insulating film 34 having the wirings 37 buried therein.

Next, through-holes (openings, connection holes) 42 are formed in the insulating film 41 by dry-etching the insulating film 41 with using a photoresist pattern (not illustrated), which is formed on the insulating film 41 by using photolithography method, as an etching mask. The through-holes 42 are formed in the phase change memory region 10A and upper surfaces of the wirings 37a are exposed at bottom portions of the through-holes 42.

Next, plugs 43 are formed in the through-holes 42. At this time, for example, after a conductive barrier film 43a is formed on the insulating film 41 including inside of the through-hole 42 by sputtering method or the like, a tungsten film 43b is formed on the conductive barrier film 43a so as to be buried in the contact hole 42 by CVD method or the like, and unnecessary tungsten film 43b and conductive barrier film 43a on the insulating film 41 are removed by CMP method, etch-back method, or the like. Thereby, the plug 43 formed of the tungsten film 43b and the conductive barrier film 43a remaining and buried in the contact hole 42 can be formed. Thus, the plug 43 is formed by filling conductor material into an opening (the through-hole 42) formed in the insulating film 41.

In the embodiment, the plug 43 is buried in the through-hole 42 using the tungsten film 43b, but metal which is excellent in CMP flatness such that an upper film of the plug 43 becomes flat can be used instead of the tungsten film 43b. For example, Mo (molybdenum) which is small in crystalline grain size can be used. The metal which is excellent in CMP flatness has an effect of suppressing local phase change due to electric field concentration caused at an uneven portion of an upper surface of the plug 43. As a result, uniformity of electric characteristic of a memory cell element of a phase change memory, reliability of the number of rewriting cycles thereof, and high-temperature-tolerant operation characteristic are improved.

Figure 15:
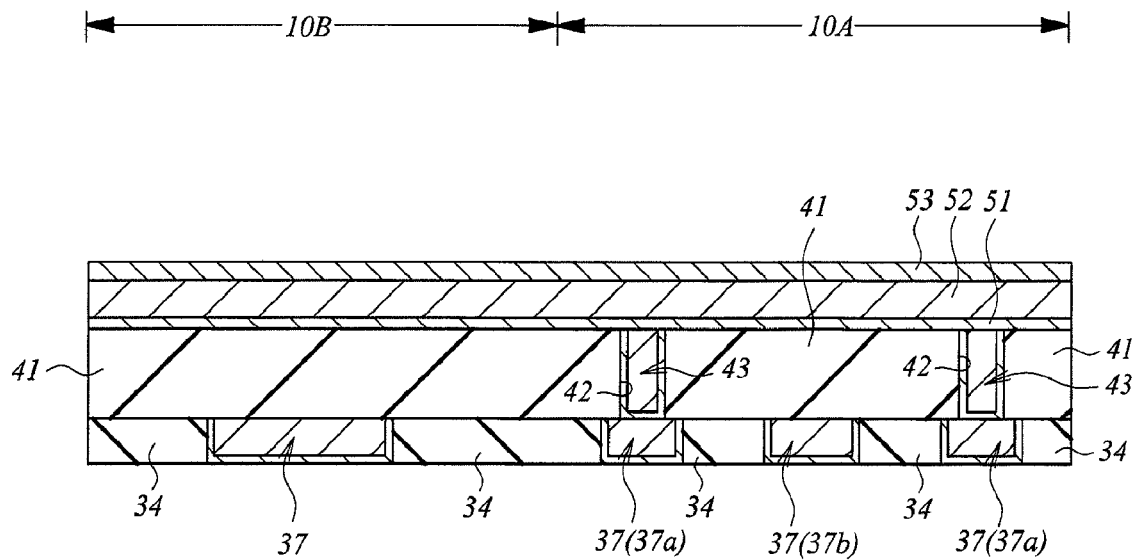
FIG. 15 is a sectional view of main parts of the semiconductor device during the manufacturing process continued from FIG. 14.

Next, as shown in FIG. 15, an interface layer 51, a recording layer 52, and an upper contact electrode film 53 are sequentially formed (deposited) on the insulating film 41 in which the plugs 43 is buried. Incidentally, as described above, in FIG. 15 to FIG. 20, illustration of a portion corresponding to the insulating film 31 in FIG. 14 and the structure positioned below the insulating film 31 is omitted. A film thickness (a deposition film thickness) of the interface layer 51 is, for example, about 0.05 to 5 nm, a film thickness (a deposition film thickness) of the recording layer 52 is, for example, about 10 to 200 nm, and a film thickness (a deposition film thickness) of the upper contact electrode film 53 is, for example, about 10 to 200 nm. It is more preferable that a total thickness of a stacked layer film of the interface layer 51, the recording layer 52, and the upper contact electrode film 53 is in a range from 30 nm to 150 nm.

Figure 16:
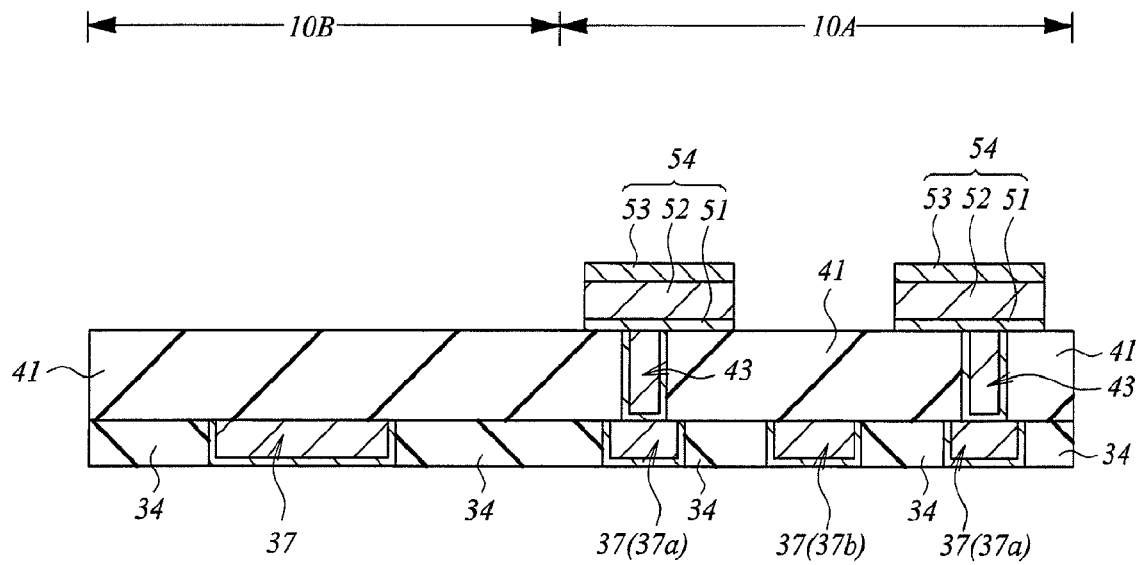
FIG. 16 is a sectional view of main parts of the semiconductor device during the manufacturing process continued from FIG. 15.

Next, as shown in FIG. 16, the stacked layer film comprising the interface layer 51, the recording layer 52, and the upper contact electrode film 53 is patterned by using photolithography method and dry-etching method. Thereby, a resistance element 54 formed of a stacked layer pattern of the upper contact electrode film 53, the recording layer 52, and the interface layer 51 is formed on the insulating film 41 having the plugs 43 buried therein. The interface layer 51 can be used as an etching stopper film to be used when the upper contact electrode film 53 and the recording layer 52 are dry-etched.

Incidentally, when the resistance element 54 is formed by patterning the stacked layer film formed of the interface layer 51, the recording layer 52, and the upper contact electrode film 53, processing can be performed using an insulating film as a hard mask. In this case, after the upper contact electrode film 53 has been formed, an insulating film (for example, a silicon oxide film) is formed on the upper contact electrode film 53. After the insulating film is dry-etched using a photoresist pattern formed on the insulating film on the upper contact electrode film 53 as an etching mask, and the photoresist pattern is removed by asking or the like, the upper contact electrode film 53, the recording layer 52, and the interface layer 51 are dry-etched to be patterned with using the insulating film remaining on the recording layer 53 as a hard mask. Thereby, residue of etching reaction product of photoresist and chalcogenide material can be prevented from adhering to the processed sidewall.

Figure 17:
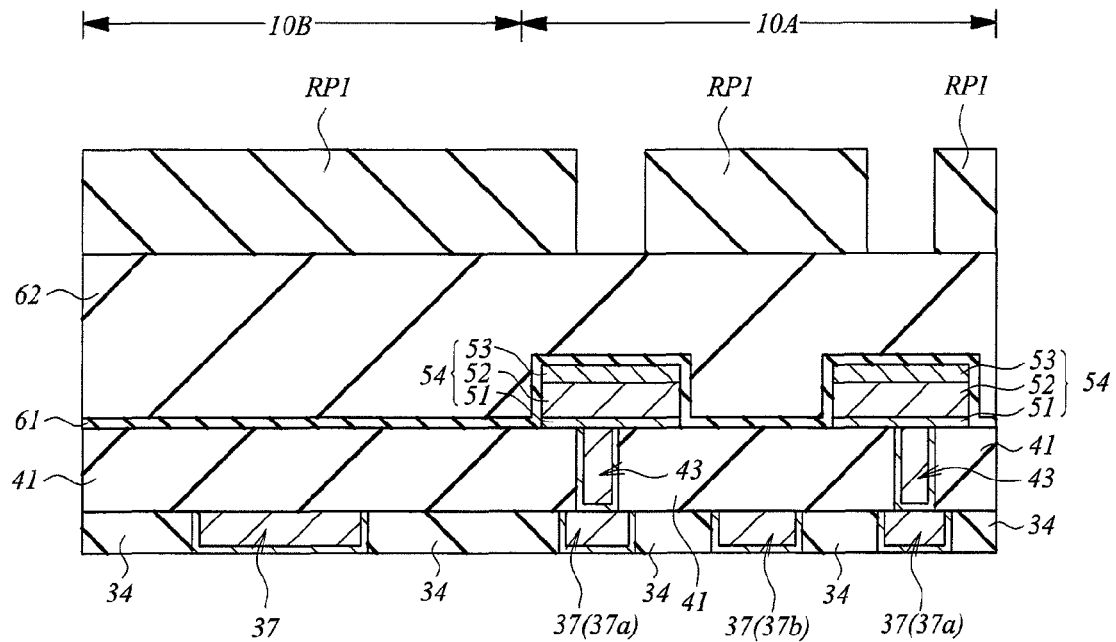
FIG. 17 is a sectional view of main parts of the semiconductor device during the manufacturing process continued from FIG. 16.

Next, as shown in FIG. 17, an insulating film (an etching stopper film) 61 is formed on the insulating film 41 so as to cover the resistance elements 54. A film thickness (a deposition film thickness) of the insulating film 61 can be about 5 to 20 nm, for example.

It is preferable that a material film which can be formed at a temperature (for example, 400° C. or lower) at which the recording film 52 does not sublime. When a silicon nitride film is used as the insulating film 61, it is more preferable because a film can be formed at a temperature (for example, 400° C. or lower) at which the recording film 52 does not sublime using, for example, plasma CVD method, so that sublimation of the recording layer 52 at a film formation time of the insulating film 61 can be prevented.

Next, an insulating film (an interlayer insulating film) 62 is formed on the insulating film 61. The insulating film 62 is thicker than the insulating film 61 and it can function as an interlayer insulating film. After formation of the insulating film 62, an upper surface of the insulating film 62 can be planarized by performing CMP process or the like, as necessary.

Next, a photoresist pattern RP1 is formed on the insulating film 62 using photolithography method. The photoresist pattern RP1 has openings in regions where a through-hole 63 is to be formed.

Figure 18:
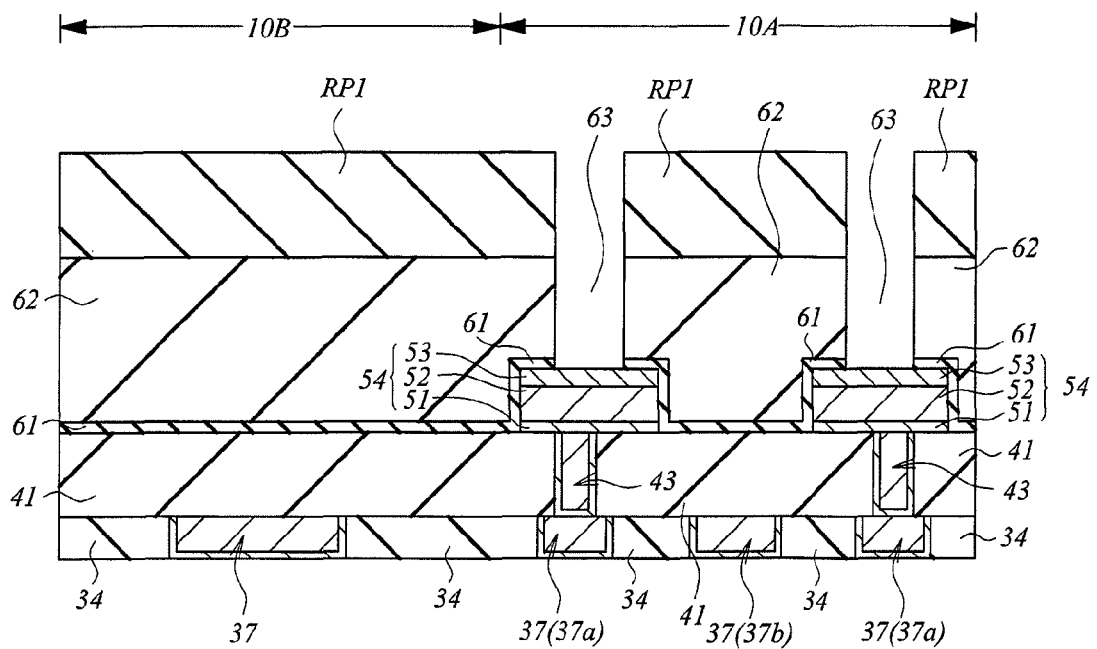
FIG. 18 is a sectional view of main parts of the semiconductor device during the manufacturing process continued from FIG. 17.

Next, as shown in FIG. 18, through-holes (openings, connection holes, through-holes) 63 are formed in the insulating films 61 and 62 by dry-etching the insulating film 62 with using the photoresist pattern RP1 as an etching mask. At this time, first, the through-hole 63 can be formed in the insulating films 61 and 62 by dry-etching the insulating film 62 until the insulating film 61 is exposed under such a condition that the insulating film 62 is etched more easily than the insulating film 61 to cause the insulating film 61 to function as an etching stopper film and then dry-etching the insulating film 61 at the bottom portions of the through-hole 63 under such a condition that the insulating film 61 is etched more easily than the insulating film 62. Thereafter, the photoresist pattern RP1 is removed. When dry-etching of the insulating film 62 is performed with using the insulating film 61 as the etching stopper film, it is preferable that an etching method having a large selectivity, for example, an etching method having a selectivity of 10 or higher (an etching rate of the insulating film 62 is at least 10 times an etching rate of the insulating film 61) is used. When the insulating film 62 at the bottom portion of the through-hole 63 is etched, it is preferable that such a method that foreign matter is not generated at the bottom portion of the through-hole 63 or foreign matter can be removed easily by cleaning even if foreign matter is generated is used. Thereby, foreign matter generation is prevented, so that characteristic degradation of a phase change memory due to parasitic resistance of foreign matter can be prevented, reliability can be improved, and manufacturing yield of semiconductor devices can be improved.

At least one portion of the upper contact electrode film 53 of the resistance element 54 is exposed at the bottom portion of the through-hole 63. Since the insulating film 61 serving as the etching stopper film when the insulating film 62 is dry-etched is used, over-etching of the upper contact electrode film 53 is prevented, etching damage during the dry-etching for the through-hole 63 formation, or thermal load damage at an electrical conductor film formation time is suppressed and change of characteristics of the recording layer 52 in the region just below the plug 64 is suppressed or prevented, so that reliability of electric characteristics of a phase change memory can be made excellent. Since the sidewall of the recording layer 52 is covered with the insulating film 61, even if deviation occurs at the through-hole 63, the recording layer 52 can be prevented from being exposed from the through-hole 63 and from sublimation of the recording layer 52 can be prevented during an electric conductor film formation for the plug 64. That is, the chalcogenide material constituting the recording layer 52 has such characteristics that its sublimation temperature is low and it sublimes easily due to heat history when a conductor film for the plug 64 is formed in the through-hole 63, but even if deviation occurs in the through-hole 63, the insulating film 61 is protected by the sidewall of the recording layer 52 so that sublimation of the recording layer 52 is suppressed and a phase change memory with high integration excellent in yield can be manufactured. Since sublimation of the recording layer 52 can be prevented by the insulating film 61, foreign matter is not formed near the lower portion of the through-hole 63 during the through-hole 63 formation, or, it can be removed easily by cleaning even if foreign matter is formed at the time. Since the insulating film 61 (the protective film) is formed on the upper portion of the upper contact electrode film 53 and the sidewall of the recording layer 52 by the same manufacturing process, the number of manufacturing steps can be reduced and a manufacturing cost of a semiconductor device can be reduced as compared with a case that a protective film on the upper contact electrode film 53 and a protective film on the sidewall of the recording layer 52 are formed by different manufacturing processes.

Thus, since the insulating film is caused to function as an etching stopper film when the insulating film 61 is dry-etched, the insulating film 61 is made of a material film whose etching rate (etching selectivity) can be made different from that of the insulating film 62, where it is more preferable that the insulating film 61 and the insulating film 62 are made of different materials. It is preferable that the film thickness of the insulating film 61 is smaller than that of the upper contact electrode film 53 of the resistance element 54.

Figure 19:
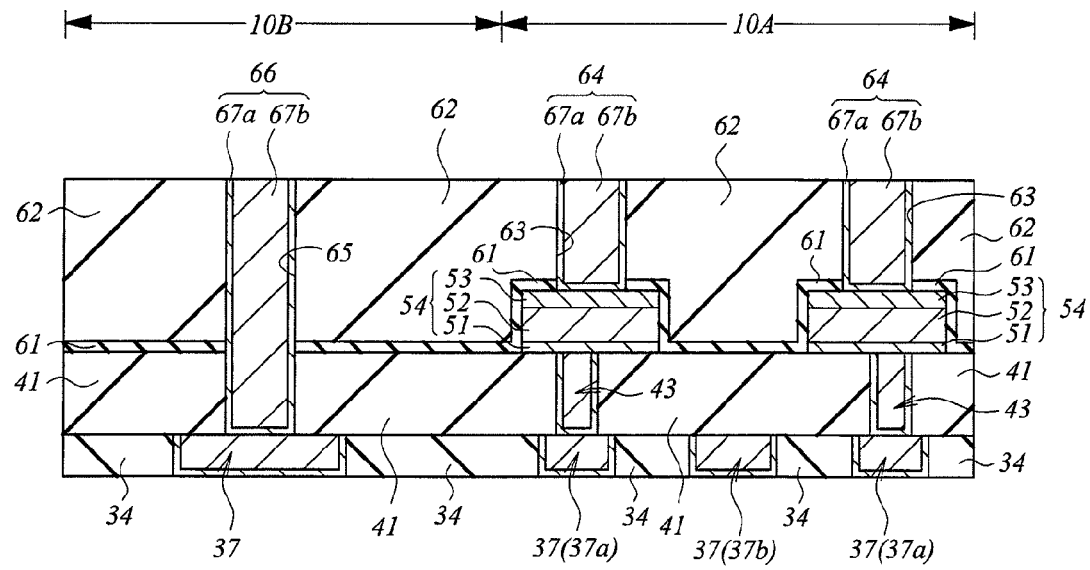
FIG. 19 is a sectional view of main parts of the semiconductor device during the manufacturing process continued from FIG. 18.

Next, as illustrated in FIG. 19, a through-hole (opening, connection hole) 65 is formed in the insulating films 62, 61, and 41 by dry-etching the insulating films 62, 61, and 41 using another photoresist pattern (not illustrated), which is formed on the insulating film 62 by using photolithography method, as an etching mask. The through-hole 65 is formed in the peripheral circuit region 10B and an upper surface of the wiring 37 is exposed at a bottom portion of the through-hole 65. Thereafter, the photoresist pattern is removed. Incidentally, such a configuration can be adopted that the through-hole 65 is first formed and the through-holes 63 are then formed. It is preferable that the through-holes 63 and the through-hole 65 are formed in different steps, but they can be formed in the same step.

Next, plugs 64 and 66 are formed in the through-holes 63 and 65. At this time, for example, after a conductive barrier film 67a is formed on the insulating film 62 including the inside of the through-holes 63 and 65 by sputtering method or the like, a tungsten film 67b is formed on the conductive barrier film 67a so as to be buried in the through-holes 63 and 65 by CVD method or the like, and unnecessary tungsten film 67b and conductive barrier film 67a on the insulating film 62 are removed by CMP method, etch-back method, or the like. Thereby, the plug 64 formed of the tungsten film 67b and the conductive barrier film 67a remaining and buried in the contact hole 63, and the plug 66 formed of the tungsten film 67b and the conductive barrier film 67a remaining and buried in the contact hole 64 can be formed. An aluminum (Al) film or an aluminum alloy film (main conductor film) can be used instead of the tungsten film 67b.

Further, the number of manufacturing steps can be reduced by forming the plugs 64 and 66 in the same step after the through-holes 63 and 65 are formed, but such a configuration can be used as another aspect that one of the through-hole 63 or the through-hole 65 is formed and a plug (either of the plug 64 or the plug 66) to be buried in the one is formed, and the other of the through-hole 63 or the through-hole 65 is then formed, and a plug (the other of the plug 64 or the plug 66) to be buried in the other one is formed.

Figure 20:
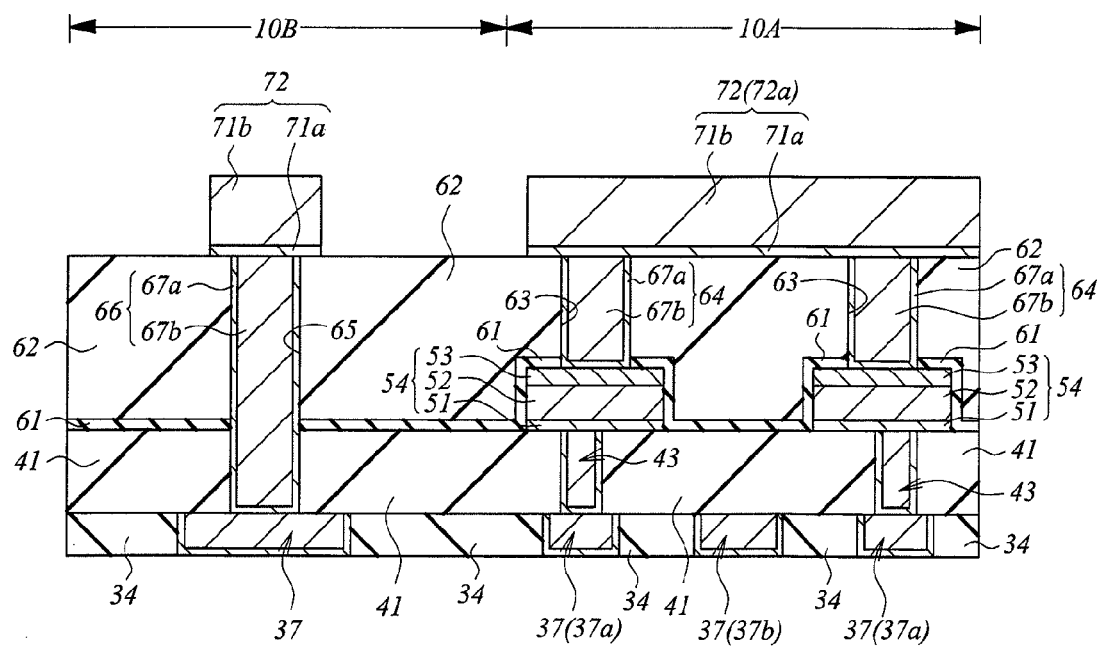
FIG. 20 is a sectional view of main parts of the semiconductor device during the manufacturing process continued from FIG. 19.

Next, as illustrated in FIG. 20, a wiring (a second layer wiring) 72 is formed on the insulating film 62 with the plugs 64 and 66 buried as a second layer wiring. For example, wirings 72 can be formed by sequentially forming a conductive barrier film 71a and an aluminum film or an aluminum alloy film 71b on the insulating film 62 having the plugs 64 and 66 buried therein using spattering method or the like and conducting patterning using photolithography method and dry-etching method, or the like. The wiring 72 is not limited to an aluminum wiring such as that described above but it may be variously changed, for example, it may be a tungsten wiring, a copper wiring (buried copper wiring), or the like.

Thereafter, while an insulating film (not illustrated) serving as an interlayer insulating film is formed on the insulating film 62 so as to cover the wirings 72, and a wiring layer (wiring subsequent to the third layer wiring) which is a further upper layer or the like is formed, illustration and explanation thereof are omitted here. Then, after annealing in hydrogen at a temperature about 400° C. to 450° C. is performed as necessary, a semiconductor device (a semiconductor memory device) is completed.

Figure 21:
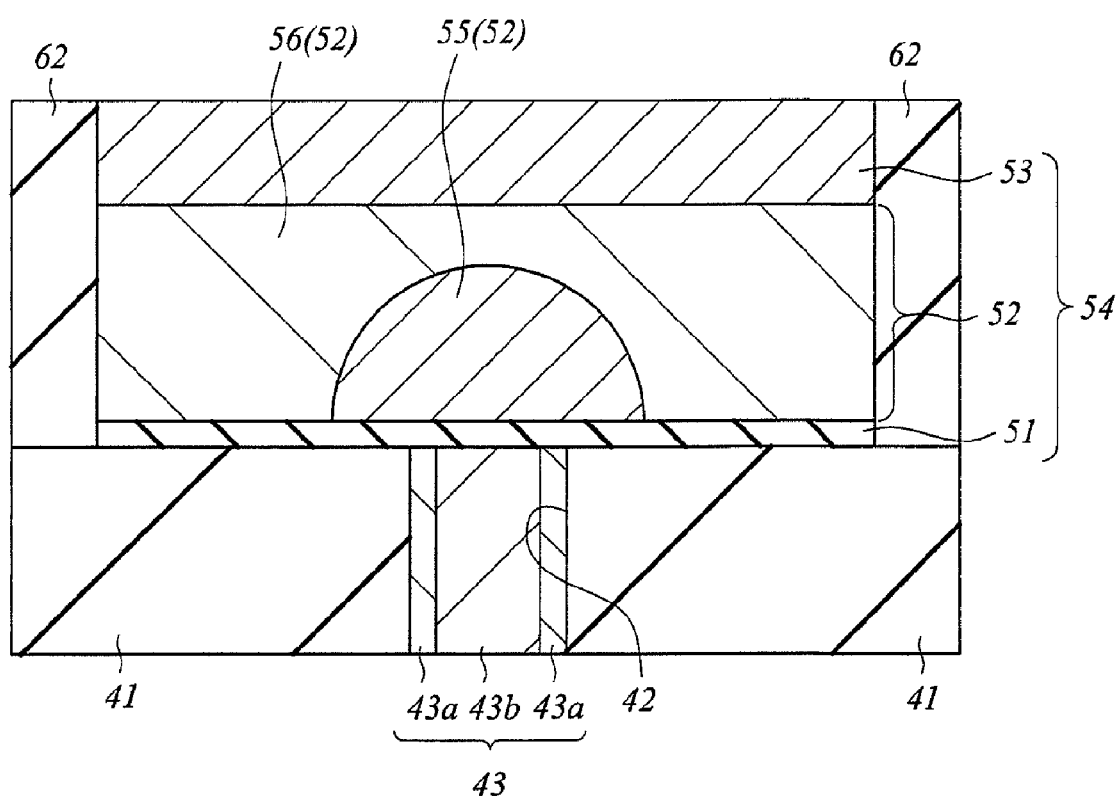
FIG. 21 is a sectional view of main parts illustrating a vicinity of a resistance element of the semiconductor device according to the embodiment of the present invention.

FIG. 21 is a cross-sectional view of main parts illustrating the vicinity of the resistance element 54 (the storage element) of the semiconductor device 1 of the embodiment.

As also illustrated in FIG. 21, a memory element (a storage element, here, a phase change memory) of the embodiment includes a recording layer 52 made of chalcogenide material, and a first electrode (here, the upper contact electrode 53 serving as an upper contact electrode) and a second electrode (here, the plug 43 serving as a bottom contact electrode) which are respectively formed on both faces (faces opposite to each other, here, an upper surface and a lower surface) of the recording layer 53, and such a memory element is formed on the semiconductor substrate 11. That is, the semiconductor device 1 of the embodiment is a semiconductor device provided with a memory element (a resistance memory element, here, a phase change memory element) including the plug 43 functioning as the bottom contact electrode, the recording layer 52 made of a chalcogenide layer formed on the plug 43 (the bottom contact electrode), and the upper contact electrode film 53 formed on the recording layer 52. In addition, though the reason has been explained above, it is preferable that the interface layer 51 is disposed between the plug 43 which is the bottom contact electrode of the memory element and the recording layer 52, as illustrated in FIG. 21, but the plug 43 and the recording layer 52 are caused to directly contact (connect) with each other without interposing the interface layer 51 therebetween.

The plug 43 serving as the bottom contact electrode is buried in the opening (the through-hole 42) in the insulating film 41 formed on the semiconductor substrate 11, the interface layer 51 is formed on the insulating film 41 having the plug 43 buried therein, and the recording layer 52 and the upper contact electrode film 53 are sequentially formed on the interface layer 51 from below. The recording layer 52 partially overlaps with the plug 43 in plan view (as viewed on a plane parallel to the main surface of the semiconductor substrate 11). That is, the upper surface of the plug 43 is formed so as to be included in a planar pattern of the recording layer 52.

The phase change memory (memory element) including the plug 43 and the resistance element 54 can perform a reset operation, a set operation, and a read operation according to voltage pulses such as those shown in FIG. 6, but since Joule heat required for a rewrite operation is generated in a region near the plug 43, a rewrite operation (phase change between a crystalline state and an amorphous state) of the phase change memory (the recording layer 52) take places in a region in the recording layer 52 near the plug 43 where Joule heat is generated easily. That is, since a contact area of the recording layer 52 with the upper contact electrode film 53 is smaller than a contact area thereof with the plug 43, a portion of the recording layer 52 positioned on the plug 43 side reaches a high temperature easily, and a portion of the recording layer 52 positioned on the upper contact electrode 53 side where the contact area is large does not melt in the reset operation, or, even if the portion melts, it is recrystallized during cooling to be crystallized. Here, the term "contact" includes not only direct contact but also contact through a layer or a region made of insulating material, semiconductor, or the like thinly formed to allow current to flow. Therefore, a region in the recording layer 52 where phase change occurs between the crystalline state and the amorphous state in a rewrite operation, namely, the phase-change region 55 has a semi-spherical shape at an upper portion of the plug 43, as schematically illustrated in FIG. 21, and a crystalline region 56 which is crystallized during manufacturing process to remain in a crystallized state is present outside the phase-change region 55. For example, at the reset time, the phase-change region 55 changes to the amorphous state, a region around the phase-change region 55 is the crystalline region 56 in a crystalline state, and a semi-spherical amorphous region (the phase-change region 55 in an amorphous state) is formed in a region in the recording layer 52 positioned near the plug 43, and the phase-change region 55 is changed to the crystalline state and both the phase-change region 55 and the crystalline region 56 (the whole recording layer 52) are changed to the crystalline state at the set time.

Figure 22A:
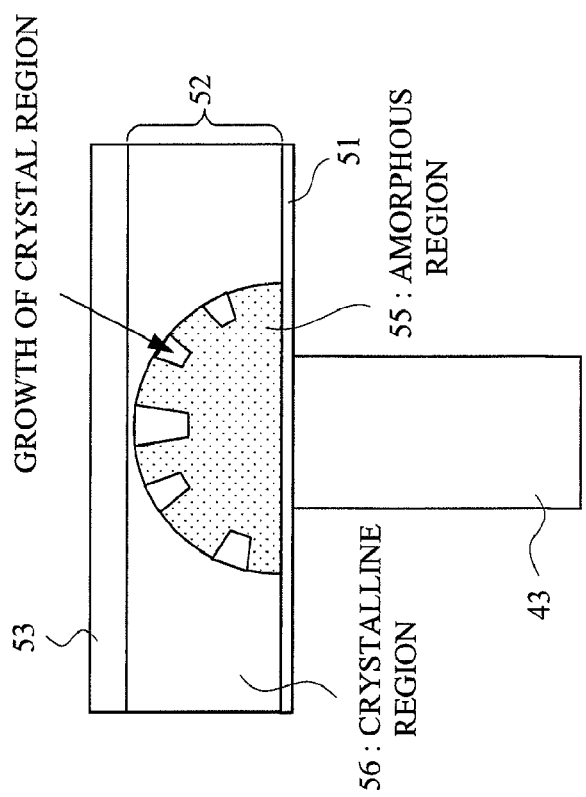
FIGS. 22A-22B are explanatory diagrams schematically illustrating a crystallization process of chalcogenide material, FIG. 22A illustrating a crystalline nucleation type and FIG. 22B showing a crystal-growth-dominant type.
Figure 22B:
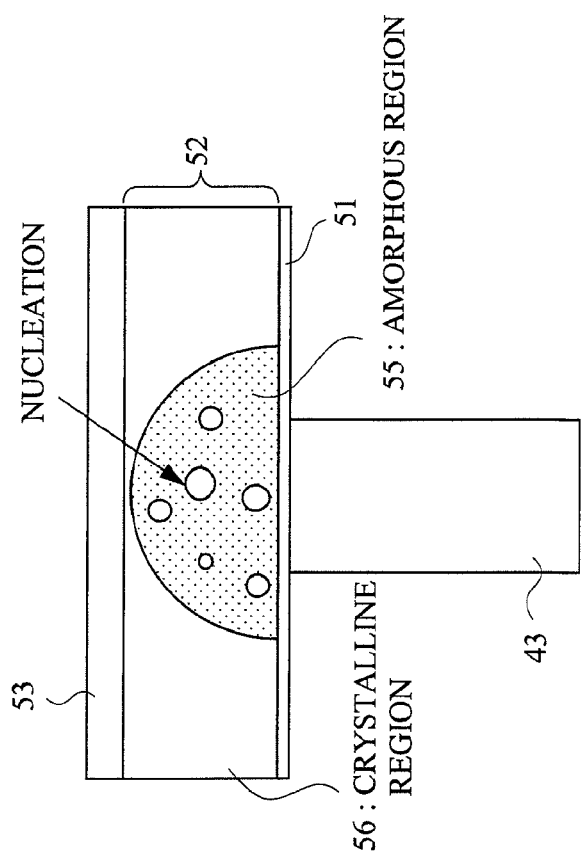

Next, in the case where phase change takes place in chalcogenide material, its mechanism will be described with reference to FIGS. 22A and 22B. FIGS. 22A and 22B are explanatory diagrams schematically illustrating a crystallization process of chalcogenide material, where FIG. 22A illustrating a crystalline nucleation type and FIG. 22B illustrating a crystal-growth-dominant type.

The crystalline nucleation type illustrated in FIG. 22A depicts material of a type in which a growth speed of a crystal core is slow while many crystal cores are generated and many crystal grains are generated therefrom. As typical material of the crystalline nucleation type, there is material based upon a pseudo-binary system composition of GeTe—$Sb_2Te_3$ such as $Ge_2Sb_2Te_5$. On the other hand, the crystal-growth-dominant type illustrated in FIG. 22B depicts material in which new crystal cores are hardly formed and a growth speed of crystals is fast, so that crystal grains extend from a crystal region about an amorphous region and crystallization progresses. Materials belonging to the crystal-growth-dominant material is based upon $Sb_{70}Te_{30}$ eutectic material, and an example is Ag—In—Sb—Te. Both the crystalline nucleation type and the crystal-growth-dominant type contain Sb (antimony) and Te (tellurium), but the former contains Te as a main component while the latter contains Sb as a main component, and the both are greatly different from each other regarding the mechanism for crystallization due to differences in compositions between the two. In a phase-change optical disk, the crystal-growth-dominant type having a fast crystallization speed is most likely used. However, since the crystallization speed is fast, when the crystal-growth-dominant type is put in a high temperature atmosphere, an element in an amorphous state is rapidly crystallized. In the field of the semiconductor memory, use under high temperature must be considered, and thus, the crystalline nucleation type (FIG. 22A), namely, a composition where a Te content rate is larger than Sb content rate is used so that retention at a high temperature is improved.

Since solid state properties of phase change material determines characteristics as a memory in the phase change memory or the phase-change optical disk, many inventions for improving material properties have been made in the past. The material Ag—In—Sb—Te exemplified previously is widely used as phase-change recording material for an optical disk, but the material is material which has been applied with such improvement of adding Ag or In for optical characteristic improvement or the like as using the crystal-growth-dominant type based upon $Sb_{70}Te_{30}$ eutectic alloy.

Next, the composition of the recording layer 52 of the embodiment will be described in more details.

Figure 23:
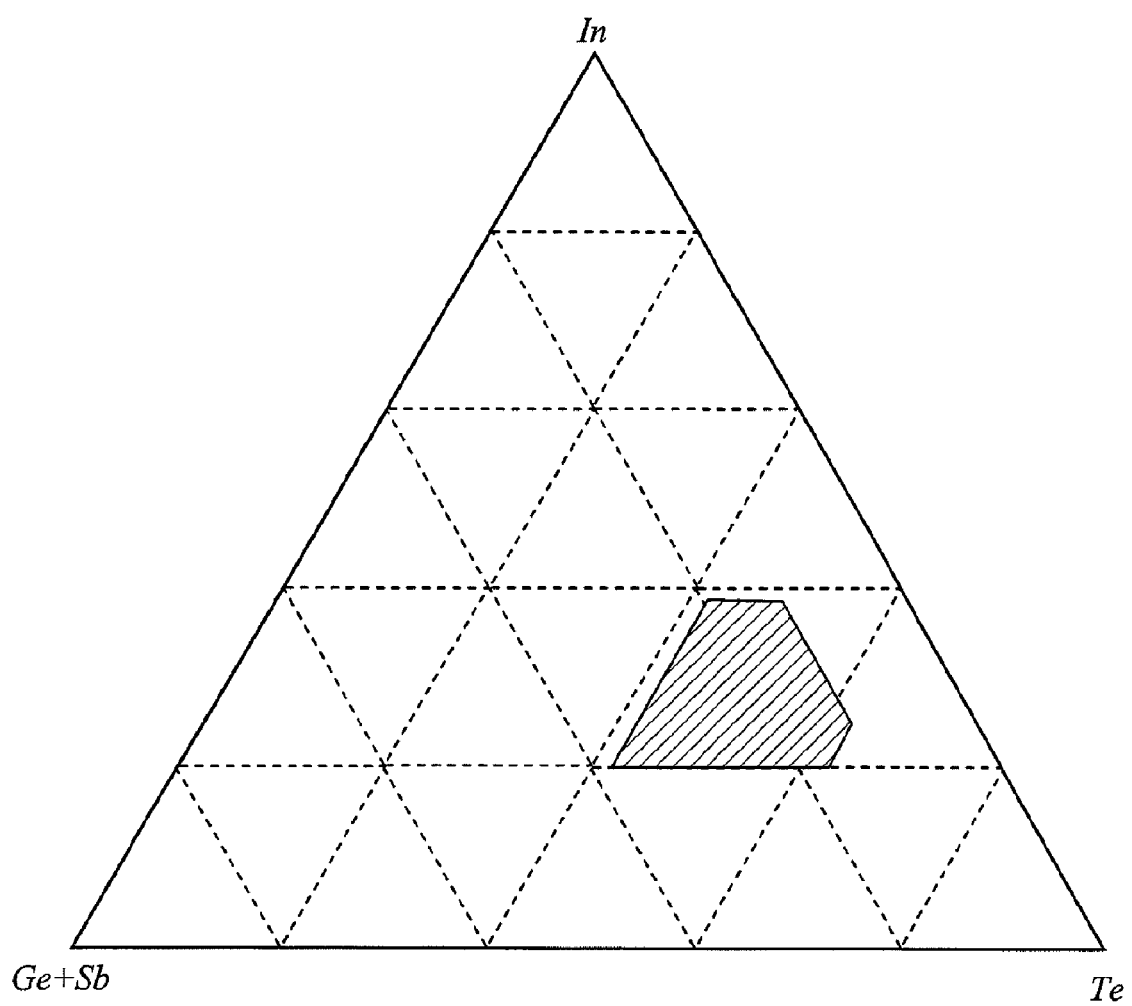
FIG. 23 is an explanatory diagram illustrating a desirable composition range of chalcogenide material configuring a recording layer in the semiconductor device according to the embodiment of the present invention.
Figure 24:
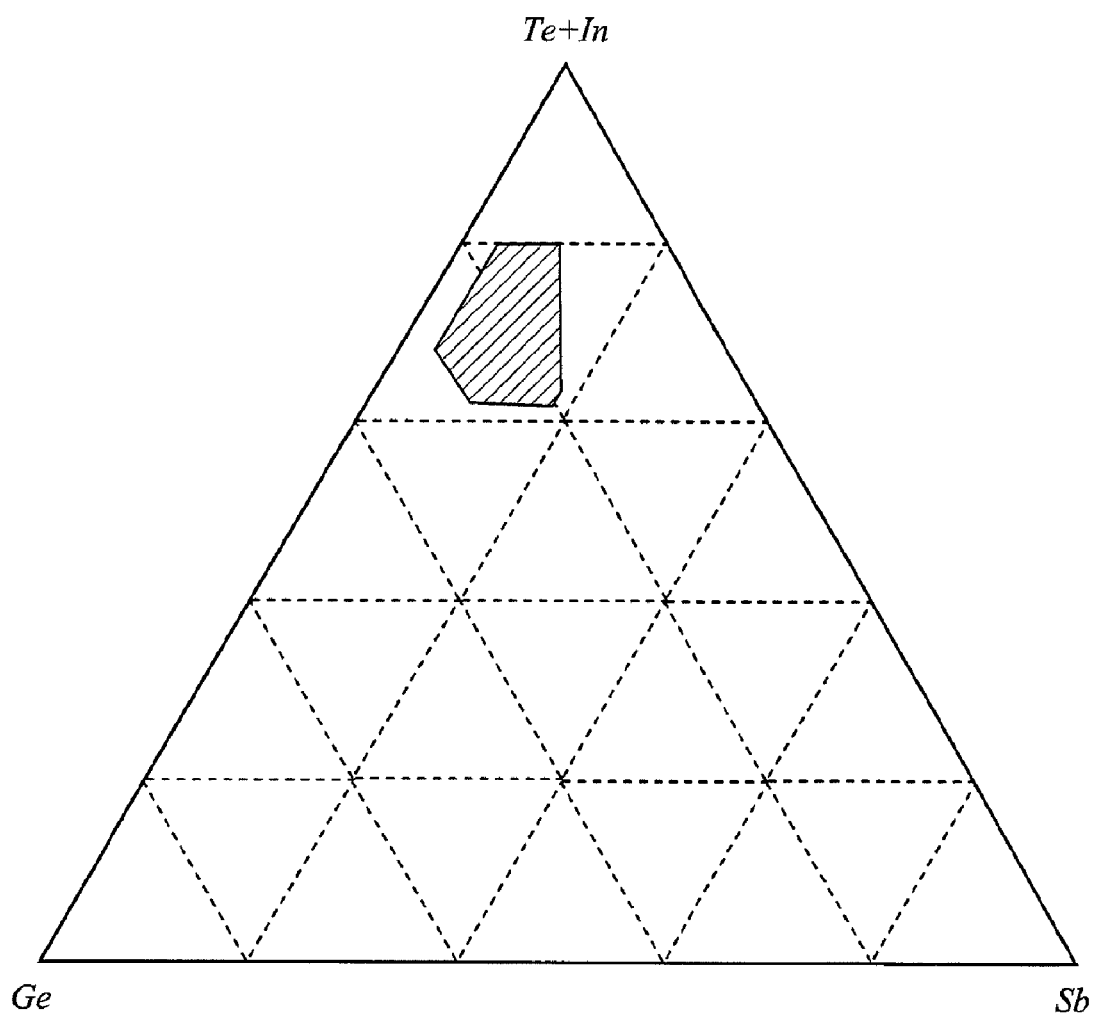
FIG. 24 is an explanatory diagram illustrating a desirable composition range of the chalcogenide material configuring the recording layer in the semiconductor device according to an embodiment of the present invention.

FIG. 23 and FIG. 24 are explanatory diagrams (graphs, ternary diagrams, composition diagrams) each illustrating a desirable composition range of chalcogenide material composing the recording layer 52 of the embodiment.

The present inventors prepared phase-change memories using materials having various compositions as materials for the recording layer 52 and examined various characteristics of the phase-change memories, so that the present inventors have found that it is significantly effective for improving heat resistance or performance of a phase change memory to compose the recording layer 52 using chalcogenide material (phase change material) containing indium (In), germanium (Ge), antimony (Sb), and tellurium (Te) and set the composition (an average composition of the recording layer 52 in the film thickness direction) of the chalcogenide material to $In_\alpha Ge_X Sb_Y Te_Z$, where $0.20 \leq \alpha \leq 0.38$, $0.09 \leq X \leq 0.28$, $0.03 \leq Y \leq 0.18$, $0.42 \leq Z \leq 0.63$, and $\alpha+X+Y+Z=1$. Incidentally, the composition of the recording layer 52 illustrated here is depicted by the average composition of the recording layer 52 (the phase-change film) in the film thickness direction.

That is, the recording layer 52 of the embodiment is made of material (chalcogenide material) containing indium (In) in a range from 20 atomic % to 38 atomic %, germanium (Ge) in a range from 9 atomic % to 28 atomic %, antimony (Sb) in a range from 3 atomic % to 18 atomic %, and tellurium (Te) in a range from 42 atomic % to 63 atomic %.

Regarding a relationship between contained amounts of germanium (Ge) and antimony (Sb) in the recording layer 52, it is preferable that both the contained amounts are equal to each other or the content amount of germanium (Ge) is larger. That is, a composition range obtained by adding the condition of $X \geq Y$ to the composition formula $In_\alpha Ge_X Sb_Y Te_Z$ is preferable, where $X > Y$ is particularly preferable.

Such a desirable composition range of the recording layer 52 of the embodiment is illustrated in FIG. 23 and FIG. 24 with hatching. In the embodiment, since the recording layer 52 contains four constituent elements of indium (In), germanium (Ge), antimony (Sb), and tellurium (Te) as its constituent elements, desirable composition ranges of the recording layer 52 is depicted by two composition ternary diagrams illustrated in FIG. 23 and FIG. 24.

Figure 26:
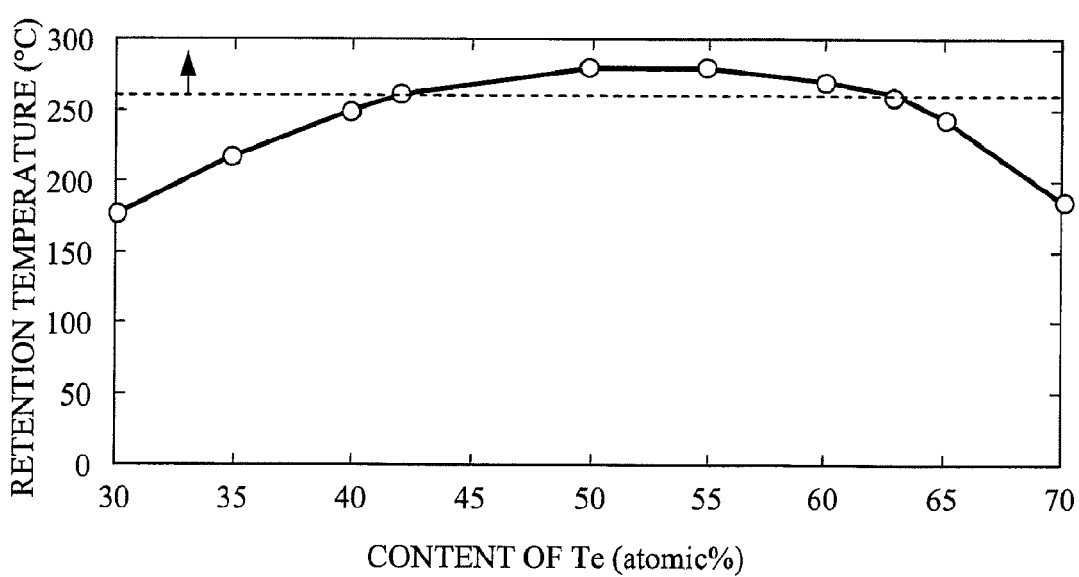
FIG. 26 is a graph illustrating a composition dependency of retention temperature of the phase change memory.
Figure 27:
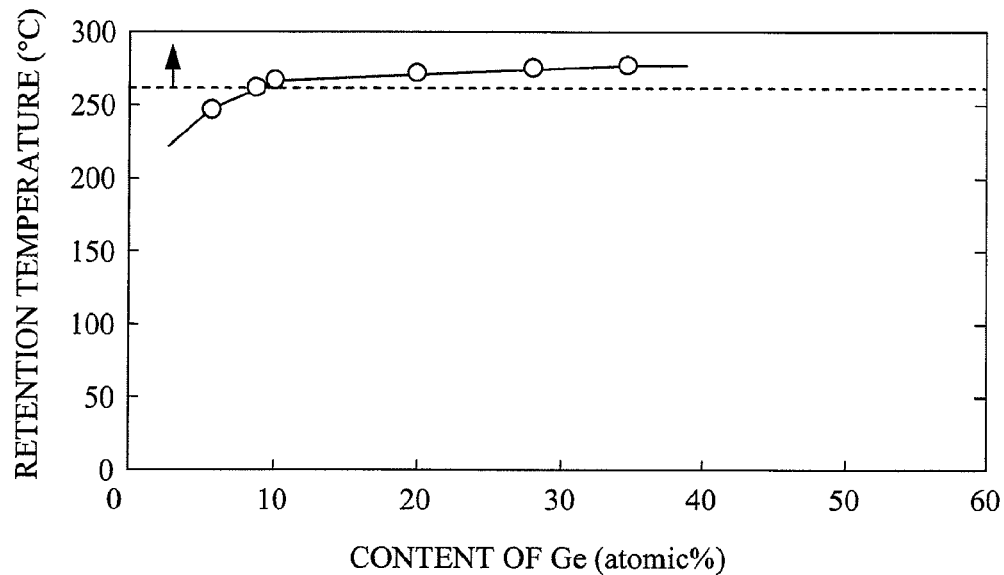
FIG. 27 is a graph illustrating a composition dependency of retention temperature of the phase change memory.
Figure 28:
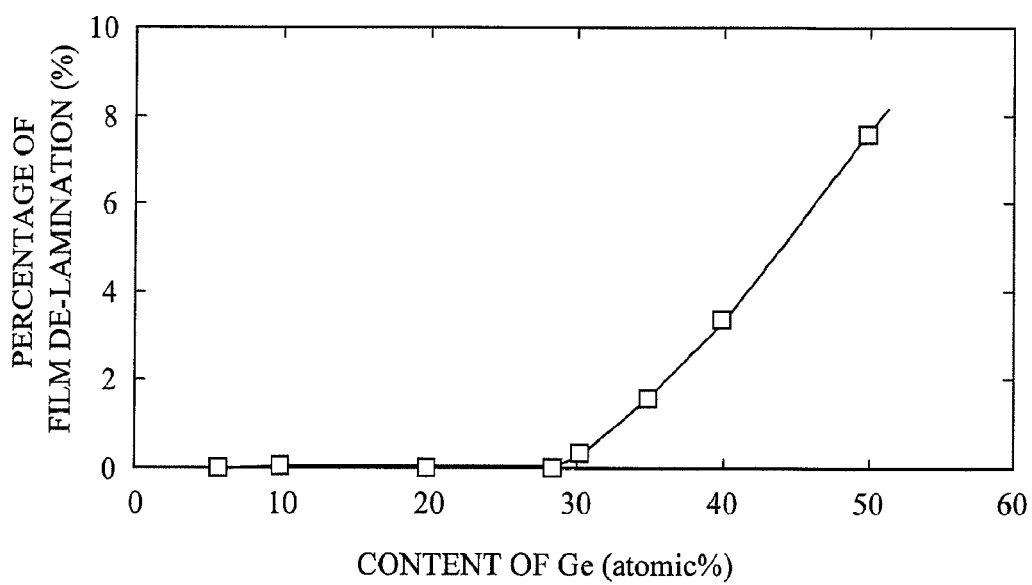
FIG. 28 is a graph illustrating a composition dependency of a percentage of film de-lamination of the recording layer of a phase change memory.
Figure 29:
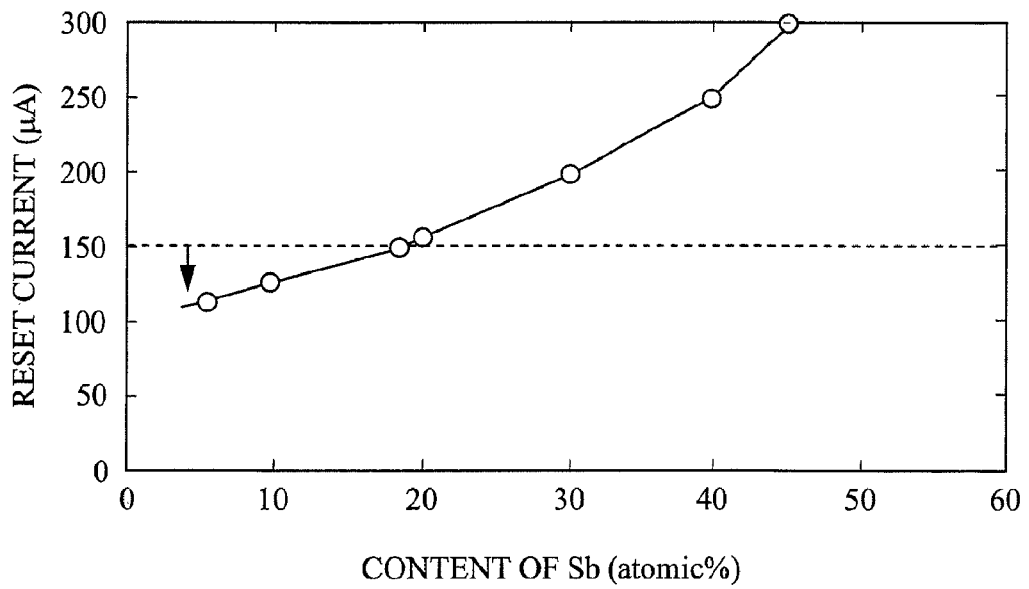
FIG. 29 is a graph illustrating a composition dependency of reset current of the phase change memory.
Figure 30:
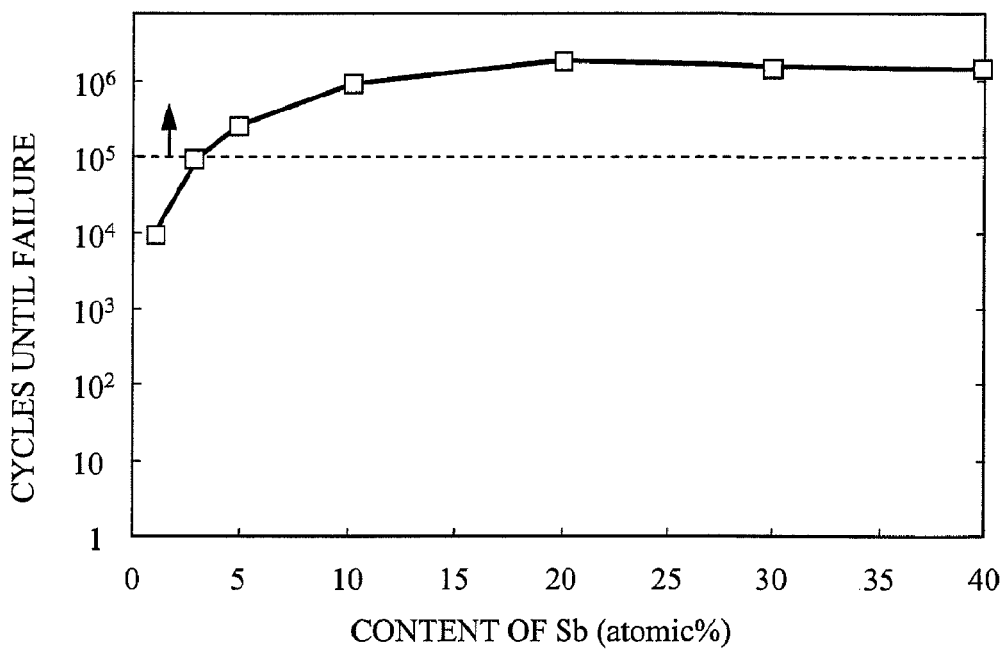
FIG. 30 is a graph illustrating a composition dependency of cycles until failure of a phase change memory.

Typical examples of composition dependency of the solid state properties of the phase-change memories examined by the present inventors are illustrated in FIG. 25 to FIG. 31. FIG. 25, FIG. 26, FIG. 27, and FIG. 31 of these figures are graphs illustrating composition dependencies of a retention temperature (an operation-guaranteed temperature) of a phase change memory. FIG. 28 is a graph illustrating composition dependency of a percentage of film de-lamination of the recording layer 52. FIG. 29 is a graph illustrating composition dependency of reset current of the phase change memory. FIG. 30 is a graph illustrating composition dependency of the number of cycles until failure of the phase change memory.

Incidentally, the retention temperature (the operation-guaranteed temperature) of the phase change memory on a vertical axis on the graphs illustrated in FIG. 25, FIG. 26, FIG. 27, and FIG. 31 corresponds to the upper temperature limit until which data written in the phase change memory can be held stably. Here, for examining the retention temperature (the operation-guaranteed temperature) of the phase change memory, after data was written in the phase change memory, the phase change memory was left under high temperature environment for about three minutes, and it was confirmed about whether lowering of a resistance of the phase change memory (the resistance element 54), rising of the resistance, or rising of the set voltage has occurred by holding the high temperature. The upper temperature limit until which lowering of resistance of the phase change memory, rising of the resistance, and rising of the set voltage can be suppressed to very small values is defined as the retention temperature (the operation-guaranteed temperature) of the phase change memory. Therefore, after data has been written in the phase change memory, even when heating to the retention temperature (the operation-guaranteed temperature) or lower is performed, lowering of resistance of the phase change memory, rising of the resistance, and rising of the set voltage due to the heating hardly occurs so that the data written in the phase change memory can be held stably. However, when heating is performed up to a temperature higher than the retention temperature (the operation-guaranteed temperature) after data has been written in the phase change memory, lowering of resistance of the phase change memory, rising of the resistance, or rising of the set voltage occurs due to the heating, so that the data written in the phase change memory cannot be held stably.

The percentage of film de-lamination of the recording layer 52 on the vertical axis on the graph illustrated in FIG. 28 corresponds to a ratio of samples having the recording layer de-laminated after the recording layer 52 is formed and mechanically de-laminated by a tape-like adhesive. Reliability of the phase change memory becomes higher as the percentage of film de-lamination of the recording layer 52 lowers.

The reset current of the phase change memory on a horizontal axis on the graph illustrated in FIG. 29 corresponds to a current value required for performing a reset operation (amorphization of the recording layer 52) of the phase change memory. The phase change memory can be rewritten with lower power (lower current) as the reset current lowers.

The number of cycles until failure of the phase change memory on the vertical axis on the graph illustrated in FIG. 30 corresponds to the number of rewritable times of the phase change memory, where, when the number of cycles of rewrite performed is equal to or less than the number of cycles until failure, rewrite of the phase change memory can be performed without causing rewrite failure. Rewrite performance (rewrite reliability) of the phase change memory becomes higher as the number of cycles until failure of the phase change memory increases.

With reference to each graph on FIG. 25 to FIG. 31, a desirable composition of the recording layer 52 will be described. Incidentally, in the graphs illustrated in FIG. 25 to FIG. 31, contents of respective elements are changed taking $In_{0.3}Ge_{0.15}Sb_{0.05}Te_{0.5}$ as the base composition.

Figure 25:
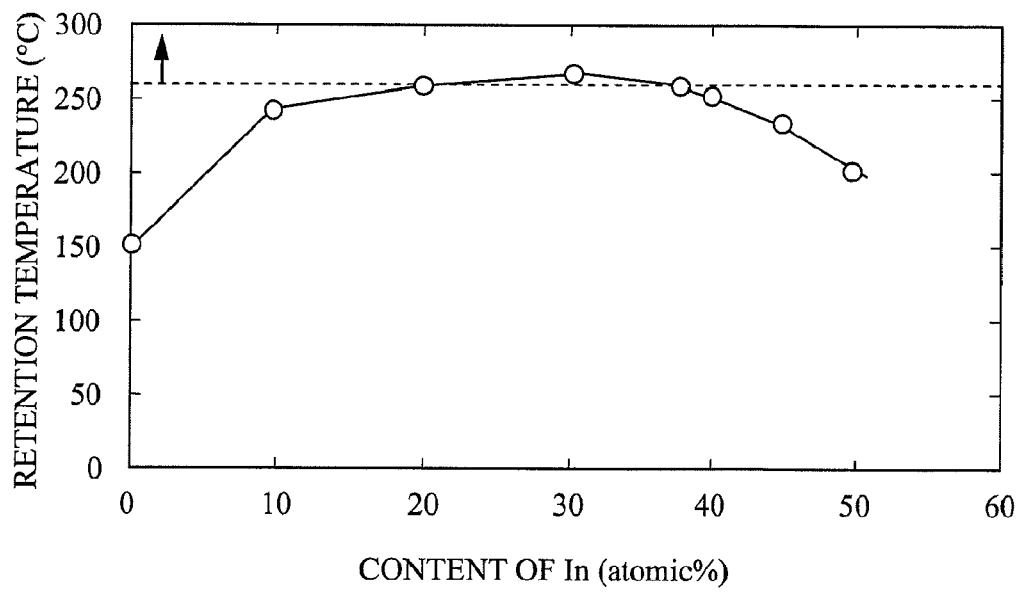
FIG. 25 is a graph illustrating a composition dependency of retention temperature of the phase change memory.

FIG. 25 is a graph showing dependency of an retention temperature of a phase change memory to the content of In in the recording layer 52, where a horizontal axis corresponds to the content of In (indium) in the recording layer 52 while a vertical axis corresponds to retention temperature (operation-guaranteed temperature) of the phase change memory. Incidentally, in case of the graph illustrated in FIG. 25, an atomic ratio of Ge, Sb, and Te in the recording layer 52 is fixed to 15:5:50 (Ge:Sb:Te=15:5:50), and the content of In in the recording layer 52 is varied. That is, when the atomic number of In in the recording layer 52 is represented as $M_{In}$, the atomic number of Ge in the recording layer 52 is represented as $M_{Ge}$, the atomic number of Sb in the recording layer 52 is represented as $M_{Sb}$, and the atomic number of Te in the recording layer 52 is represented as $M_{Te}$, the case of FIG. 25 depicts that "$M_{In}/(M_{In}+M_{Ge}+M_{Sb}+M_{Te})$" corresponds to the horizontal axis of the graph, where $M_{Ge}:M_{Sb}:M_{Te}=15:5:50$.

As illustrated in FIG. 25, when the content of In (indium) in the recording layer 52 is too little and when it is too much, the retention temperature of the phase change memory is low. Therefore, it is preferable that the content (atomic ratio) of In (indium) in the recording layer 52 is set in a range from 20 atomic % (at. %: atomic %) to 38 atomic % (at. %). Thereby, the retention temperature (the operation-guaranteed temperature) of the phase change memory can be made high and the retention temperature (the operation-guaranteed temperature) can be set to 260° C. or higher.

FIG. 26 is a graph illustrating dependency of retention temperature of a phase change memory to the content of Te in the recording layer 52, where a horizontal axis corresponds to the content rate of Te (tellurium) in the recording layer 52 while a vertical axis corresponds to retention temperature (operation-guaranteed temperature) of the phase change memory. Incidentally, in the case of the graph illustrated in FIG. 26, an atomic ratio of In, Ge, and Sb in the recording layer 52 is fixed to 30:15:5 (In:Ge:Sb=30:15:5), and the content of Te in the recording layer 52 is varied. That is, "$M_{Te}/(M_{In}+M_{Ge}+M_{Sb}+M_{Te})$" corresponds to the horizontal axis of the graph, where $M_{In}:M_{Ge}:M_{Sb}=30:15:5$ in the case shown in FIG. 26.

As illustrated in FIG. 26, when the content of Te in the recording layer 52 is too little and when it is too much, the retention temperature of the phase change memory is low. Therefore, it is preferable that the content (atomic ratio) of Te (tellurium) in the recording layer 52 is set in a range from 42 atomic % (at. %) to 63 atomic % (at. %). Thereby, the retention temperature (the operation-guaranteed temperature) of the phase change memory can be made high and the retention temperature (the operation-guaranteed temperature) can be set to 260° C. or higher.

FIG. 27 is a graph illustrating dependency of retention temperature of a phase change memory to content of Ge in the recording layer 52, where a horizontal axis corresponds to the content of Ge (germanium) in the recording layer 52 while a vertical axis corresponds to retention temperature (an operation-guaranteed temperature) of the phase change memory. Incidentally, in the case of the graph illustrated in FIG. 27, an atomic ratio of In, Sb, and Te in the recording layer 52 is fixed to 30:5:50 (In:Sb:Te=30:5:50), and the content of Ge in the recording layer 52 is varied. That is, in the case illustrated in FIG. 27, "$M_{Ge}/(M_{In}+M_{Ge}+M_{Sb}+M_{Te})$" corresponds to the horizontal axis of the graph, where $M_{In}$:$M_{Sb}$:$M_{Te}$=30:5:50.

As illustrated in FIG. 27, when the content of Ge in the recording layer 52 is too little and when it is too much, the retention temperature of the phase change memory is low. Therefore, it is preferable that the content (atomic ratio) of Ge (germanium) in the recording layer 52 is set to 9 atomic % (at. %) or higher. Thereby, the retention temperature (the operation-guaranteed temperature) of the phase change memory can be made high and the retention temperature (the operation-guaranteed temperature) can be set to 260° C. or higher.

FIG. 28 is a graph illustrating a dependency of an percentage of film de-lamination of the recording layer 52 to content of Ge in the recording layer 52, where a horizontal axis is the same as the horizontal axis on the graph illustrated in FIG. 27 and a vertical axis corresponds to an percentage of film de-lamination of the recording layer 52. Therefore, also in the case of the graph illustrated in FIG. 28, an atomic ratio of In, Sb, and Te in the recording layer 52 is fixed to 30:5:50 (In:Sb:Te=30:5:50) and the content of Ge in the recording layer 52 is varied in the same manner as the case of above-described FIG. 27.

As illustrated in FIG. 28, when the content of Ge in the recording layer 52 is too much, the recording layer 52 tends to be de-laminated, so that the percentage of film de-lamination of the recording layer 52 is high. Therefore, it is preferable that the content (atomic ratio) of Ge (germanium) in the recording layer 52 is set to be 28 atomic % (at. %) or lower. Thereby, the recording layer 52 is hardly de-laminated, so that reliability of the semiconductor device formed with the phase change memory having the recording layer 52 can be improved.

Accordingly, as considering the composition dependencies illustrated in FIG. 27 and FIG. 28, it is preferable that the content (the atomic ratio) of Ge (germanium) in the recording layer 52 is set in a range from 9 atomic % to 28 atomic %. Thereby, while de-lamination of the recording layer 52 is prevented, reliability of a semiconductor device formed with a phase change memory can be improved and the retention temperature (the operation-guaranteed temperature) of the phase change memory can be made high (260° C. or higher).

FIG. 29 is a graph illustrating a dependency of reset current of a phase change memory to content of Sb content in the recording layer 52, where a horizontal axis corresponds to the content of Sb (antimony) in the recording layer 52, and a vertical axis corresponds to reset current of the phase change memory. Incidentally, in the case of the graph illustrated in FIG. 29, an atomic ratio of In, Ge, and Te in the recording layer 52 is fixed to 30:15:50 (In:Ge:Te=30:15:50), and the content rate of Sb in the recording layer 52 is varied. That is, "$M_{Sb}/(M_{In}+M_{Ge}+M_{Sb}+M_{Te})$" corresponds to the horizontal axis of the graph, where $M_{In}$:$M_{Ge}$:$M_{Te}$=30:15:50 in the case shown in FIG. 29.

As illustrated in FIG. 29, when the content rate of Sb in the recording layer 52 is too much, reset current of the phase change memory is large. It is important for improving the performance of the phase change memory to allow rewrite of the phase change memory to be achieved with low power (low current). Therefore, it is preferable that the content (the atomic ratio) of Sb (antimony) in the recording layer 52 is set to be 18 atomic % (at. %) or lower. Thereby, the reset current of the phase change memory can be reduced, and the phase change memory can be rewritten with low power (low current), so that performance of the semiconductor device including the phase change memory can be improved. When the reset current is large, for example, when the reset current is larger than 150 µA, it is necessary to enlarge the size of a transistor formed together with the phase change memory, which may result in increase of a planar size of the semiconductor device. In the embodiment, however, by setting the content of Sb (antimony) in the recording layer 52 to 18 atomic % or lower, the reset current can be reduced, for example, it can be reduced to 150 µA or lower, and the size of the transistor formed together with the phase change memory can be reduced, which is advantageous for size reduction (area reduction) of the semiconductor device.

FIG. 30 is a graph illustrating a dependency of the number of cycles until failure of the phase change memory to the content of Sb in the recording layer 52, where a horizontal axis is the same as that in above-described FIG. 29 and a vertical axis corresponds to the number of cycles until failure of the phase change memory. Therefore, in the case illustrated in FIG. 30, an atomic ratio of In, Ge, and Te in the recording layer 52 is fixed 30:15:50 (In:Ge:Te=30:15:50), and the content rate of Sb in the recording layer 52 is varied in the same manner as FIG. 29.

As illustrated in FIG. 30, when the content of Sb in the recording layer 52 is too little, the number of cycles until failure of the phase change memory is reduced. It is important for a memory element such as the phase change memory to increase the number of cycles until failure for improving performance of the memory element, and the number of cycles until failure equal to at least 100,000 times is generally required. Therefore, it is preferable that the content (atomic ratio) of Sb (antimony) in the recording layer 52 is set to 3 atomic % (at. %) or larger. Thereby, the number of cycles until failure of the phase change memory can be increased, for example, the available write cycles equal to at least 100,000 times are made possible, so that performance of the semiconductor device including the phase change memory can be improved.

Therefore, with considering the composition dependencies illustrated in FIG. 29 and FIG. 30, it is preferable that the content (the atomic ratio) of Sb (antimony) in the recording layer 52 is set in a range from 3 atomic % to 18 atomic %. Thereby, both reduction of the set current of the phase change memory and improvement of the number of cycles until failure of the phase change memory can be achieved.

Figure 31:
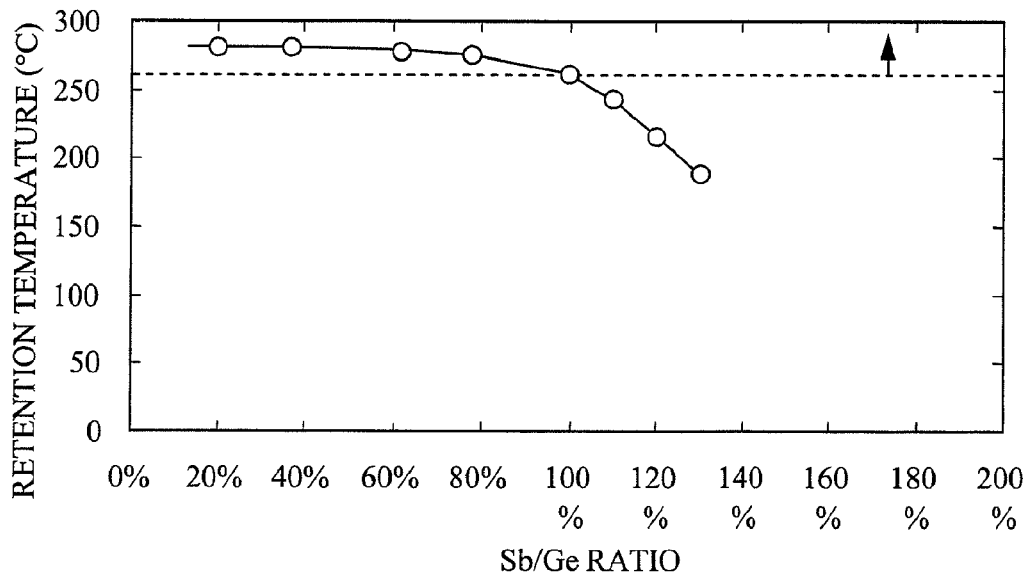
FIG. 31 is a graph illustrating a composition dependency of retention temperature of a phase change memory.
Figure 32:
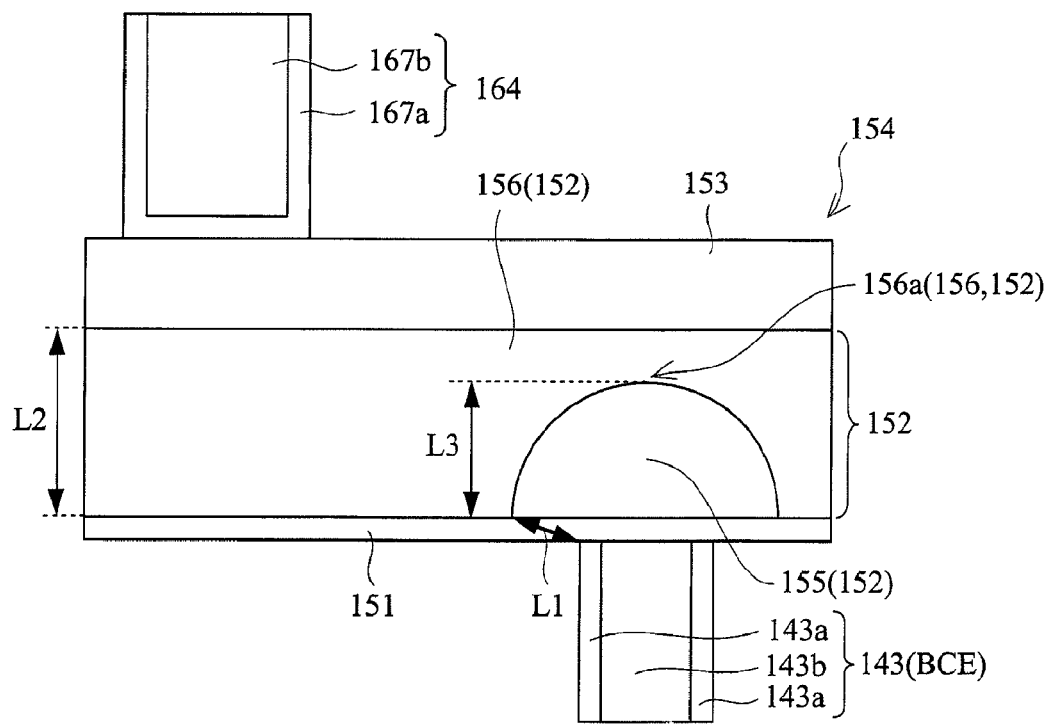
FIG. 32 is a sectional view of main parts illustrating a phase-change region of a resistance element of a phase change memory in the vicinity of a bottom contact electrode of phase-change region

FIG. 31 is a graph illustrating a dependency of the retention temperature of the phase change memory to the content rates of Sb and Ge in the recording layer 52, where a horizontal axis corresponds to a ratio (Sb/Ge) of the content of Sb (antimony) and Ge (germanium) in the recording layer 52, and a vertical axis corresponds to retention temperature (operation-guaranteed temperature) of the phase change memory. Incidentally, in the case of the graph illustrated in FIG. 31, the content of In in the recording layer 51 is fixed to 30 atomic %, the content of Te therein is fixed to 50 atomic %, and the content of the sum of both of Sb and Ge is fixed to 20 atomic %, and a ratio (Sb/Ge) of the content of Sb and the content rate of Ge in the recording layer 52 is varied. That is, "$M_{Sb}/M_{Ge}$" corresponds to the horizontal axis in the graph, where $M_{In}/(M_{In}+M_{Ge}+M_{Sb}+M_{Te})$=0.3, $M_{Te}/(M_{In}+M_{Ge}+M_{Sb}+M_{Te})$=0.5, and $(M_{Ge}+M_{Sb})/(M_{In}+M_{Ge}+M_{Sb}+M_{Te})$=0.2 in the case of FIG. 31.

As illustrated in FIG. 31, when the content of Sb is too much larger than the content of Ge in the recording layer 52, the retention temperature of the phase change memory is low. Therefore, it is preferable that the content rate Ge (germanium) in the recording layer 52 is equal to or larger than the content of Sb (antimony). That is, it is preferable that the content of Ge (germanium) in the recording layer 52 is equal to or larger than the content of Sb (antimony) in the recording layer 52, and it is more preferable that the former is larger than the latter. Thereby, the retention temperature (the operation-guaranteed temperature) of the phase change memory can be made high, so that the retention temperature (the operation-guaranteed temperature) can be increased to 260° C. or higher.

Accordingly, with considering the composition dependencies illustrated in FIG. 25 to FIG. 31, a desirable composition of the recording layer 52 satisfies that it contains indium (In), germanium (Ge), antimony (Sb), and tellurium (Te), and indium (In) is in a range from 20 atomic % to 38 atomic %, germanium (Ge) is in a range from 9 atomic % to 28 atomic %, antimony (Sb) is in a range from 3 atomic % to 18 atomic %, and tellurium (Te) is in a range from 42 atomic % to 63 atomic %. In this case, the composition (the average composition of the recording layer 52 in the film thickness direction thereof) of the chalcogenide material composing the recording layer 52 can be represented by the following composition formula, $In_\alpha Ge_X Sb_Y Te_Z$, here, $0.20 \leq \alpha \leq 0.38$, $0.09 \leq X \leq 0.28$, $0.03 \leq Y \leq 0.18$, $0.42 \leq Z \leq 0.63$, and $\alpha + X + Y + Z = 1$. Further, it is preferable that the content of Ge (germanium) in the recording layer 52 is equal to or larger than the content of Sb (antimony) in the recording layer 52, which corresponds to satisfaction of $X \geq Y$ in the abovementioned composition formula $In_\alpha Ge_X Sb_Y Te_Z$ of the chalcogenide constituting the recording layer 52. It is more preferable that $X > Y$ is satisfied in the abovementioned composition formula $In_\alpha Ge_X Sb_Y Te_Z$.

In experiments in further details performed by the present inventors, as illustrated in the composition diagram of FIG. 24, it is more preferable that the sum of the contents of Te (tellurium) and In (indium) (the sum of the content of Te and the content of In) in the recording layer 52 is in a range from 62 atomic % to 80 atomic % (namely, $0.62 \leq \alpha + Z \leq 0.80$ in the abovementioned composition formula), so that the retention temperature (the operation-guaranteed temperature) of the phase change memory can be increased (to 260° C. or higher) more adequately. As illustrated in FIG. 31, it is preferable that the content of Sb (antimony) in the recording layer 52 is smaller than the content of Ge (germanium) in the same, but, as illustrated in FIG. 30, the recording layer 52 is required to contain Sb (antimony) in an amount of at least 3 atomic %. When the content of Ge (germanium) in the recording layer 52 is large (when the sum of the contents of Ge and Sb is equal to or more than 20 atomic %), Sb (antimony) of less than 5 atomic % to larger than or equal to 3 atomic % ($0.03 \leq Y < 0.05$ in the abovementioned composition formula) can be used, but it is more preferable that the content of Ge (germanium) in the recording layer 52 is equal to or more than 5 atomic % ($Y \geq 0.05$ in the abovementioned composition formula), so that effects of improvement of the heat resistance and improvement of the number of cycles until failure can be enhanced.

Such a desirable composition range of the recording layer 52 corresponds to the composition ranges hatched in FIG. 23 and FIG. 24.

Such a tendency appears that a grain size of the crystalline state and a size of morphology of the amorphous state become small according to increase of the content of In (indium) in the recording layer 52 so that resistance of the recording layer 52 becomes high correspondingly. In the invention corresponding to the present embodiment, the grain size of the crystalline state and the size of morphology of the amorphous state are reduced by increasing the content of In (indium) in the recording layer 52 to 20 atomic % or more and increasing the content of Ge (germanium) (to 9 atomic % or more), so that resistance of the crystalline state and resistance of the amorphous state are made high. Therefore, the resistance ratio is difficult to be small. In the set operation, it is difficult for current to flow through a portion of a peripheral portion which has initially been in a crystalline state (the crystalline region 56) and current flows straightly between electrodes (here, the plug electrode 43 and the upper contact electrode film 53), so that centrally symmetrical phase change takes place. Accordingly, in the next reset operation, fluctuation or instability of the reset state become hard to occur. Therefore, the heat resistance (the retention temperature) is improved. Even if change of atomic arrangement occurs from fine composition variation (composition unevenness) originally present and the cycle of the composition unevenness becomes large at a high temperature time, or even if change of the atomic arrangement occurs due to influence of ion movement, a change rate of the resistance is small and a set voltage rising due to high temperature holding remains in a small rate. Therefore, excellent heat resistance (high retention temperature) can be obtained.

Elements which can be added to the recording layer 52 in the semiconductor device 1 of the embodiment in a small amount include nitrogen (N) and oxygen (O), where it is preferable that the addition amount is 5 atomic % or less.

By setting the composition of the recording layer 52 configuring the phase change memory to fall within such a composition range, improvement of the retention temperature (operation-guaranteed temperature) of the phase change memory, reduction of the reset current, improvement of the number of cycles until failure, de-lamination prevention of the recording layer are made possible, so that the performance of the semiconductor device having the phase change memory can be improved. Accordingly, both high heat resistance and high performance of the phase change memory can be achieved.

The phase change memory is a non-volatile memory which stores information according to change of atomic arrangement in the recording layer 52 of each memory cell, where a high-resistance state having a high resistance value and a low-resistance state having a low resistance value can be stored by causing atomic arrangement change such as phase change between a crystalline state and an amorphous state by Joule heat of current flowing in the resistance element 54 to change the resistance value of the resistance element 54 (the recording layer 52). Therefore, there is such a possibility that, when the semiconductor device having the phase change memory is put under a high temperature environment, even if Joule heat is not produced, change of the atomic arrangement in the recording layer 52 such as change of the amorphous state to crystallization takes place, and the resistance value of the resistance element 54 (the recording layer 52) changes, so that information stored in the phase change memory disappears (changes) unintentionally. Accordingly, it is required to improve the retention temperature (the operation-guaranteed temperature) of the phase change memory to improve data holding characteristic of the phase change memory under a high temperature environment.

The semiconductor device 1 of the embodiment can be used while it is mounted on a wiring board (a mounting board) or the like. Solder is frequently used for mounting step of the semiconductor device 1. In a mounting process of the semiconductor device 1, solder reflow process is performed. During the solder reflow process, the semiconductor device 1 provided with the phase change memory is exposed to a high-temperature environment such as that beyond an ordinary operation environment. In the soldering, with considering influence to the environment, it is recommended to use solder (lead-free solder) which does not contain lead, and it is preferable that solder (lead-free solder) which does not contain lead is used upon mounting the semiconductor device 1 formed with the phase change memory. However, since lead-free solder which is solder which does not contain lead is higher in melting temperature than solder containing lead, when lead-free solder is used upon mounting the semiconductor device 1, it is necessary to set solder reflow temperature to be higher than that in the case of using lead-containing solder, for example, about 260° C.

There is such a case that, after information (a program or the like) has been stored in a portion of the phase change memory region 2 of the semiconductor device 1, a mounting step of the semiconductor device 1 is required to be performed (for example, application of a microcomputer mounted with a phase change memory or the like). In this case, in order to prevent data written in the phase change memory in the semiconductor device 1 from disappearing (changing) during a solder reflow process in a mounting process of the semiconductor device 1, it is necessary to set the retention temperature (the operation-guaranteed temperature) of the phase change memory to a solder reflow temperature or higher. In order to allow use of lead-free solder upon mounting the semiconductor device 1 formed with the phase change memory, it is necessary to set the retention temperature (the operation-guaranteed temperature) of the phase change memory to high temperature, preferably, 260° C. or higher.

In the embodiment, by setting the contents (atomic ratios) of In, Ge, Sb, and Te in the recording layer 52 to fall within a range from 20 atomic % to 38 atomic %, a range from 9 atomic % to 28 atomic %, a range from 3 atomic % to 18 atomic %, and a range from 42 atomic % to 63 atomic %, respectively, (further preferably, setting the Ge content rate in the recording layer 52 to be equal to or higher than the Sb content rate), the retention temperature (the operation-guaranteed temperature) of the phase change memory can be made high in addition to improvement of the performance of the semiconductor device, and the retention temperature (the operation-guaranteed temperature) can be increased to 260° C. or higher. Therefore, even if the solder reflow temperature is high, for example, increased to about 260° C., data written in the phase change memory in the semiconductor device 1 in advance can be prevented from disappearing (changing) during solder reflow upon mounting the semiconductor device 1 formed with the phase change memory. Therefore, the solder reflow temperature can be made high, and it is made possible to use lead-free solder which does not contain lead when the semiconductor device 1 formed with the phase change memory is mounted. Further, information written in the phase change memory in the semiconductor device 1 before the semiconductor device 1 is mounted can be used after the mounting.

In addition, since the embodiment is configured such that the retention temperature (the operation-guaranteed temperature) of the memory element (the phase change memory) can be made high, for example, increased to 260° C. or higher by setting the composition of the recording layer 52 to fall within the abovementioned range, when it is used for a semiconductor device which is mounted using solder whose solder reflow temperature is required to be high, such as lead-free solder (solder which does not contain lead), the effect is further increased.

Further, since the embodiment is configured such that the retention temperature (the operation-guaranteed temperature) of the memory element (the phase change memory) can be made high by setting the composition of the recording layer 52 to fall within the abovementioned range, so that data written in the memory element (the phase change memory) in advance can be prevented from disappearing during solder reflow upon mounting the semiconductor device, when it is used for a semiconductor device where solder reflow process is performed after information is stored in the memory element (the phase change memory, the recording layer 52), the effect is further increased.

Furthermore, since the embodiment is configured such that the retention temperature (the operation-guaranteed temperature) of the memory element (the phase change memory) can be made high, for example, increased to 260° C. or higher by setting the composition of the recording layer 52 to fall within the abovementioned range, when it is used for a semiconductor device to be used in a high temperature environment (for example, a microcomputer for automobile engine control or the like), the effect is further increased.

Moreover, the embodiment can be widely applied to a high-density integrated memory circuit including a memory cell formed of phase change material or a logic-embedding type memory where a memory circuit and a logic circuit are provided on the same semiconductor substrate, and it is further beneficial when such a product is used under a high temperature condition.

In the foregoing, the invention made by the inventors of the present invention has been concretely described based on the embodiments, while it is needless to say that the present invention is not limited to the foregoing embodiments and various modifications and alterations can be made within the scope of the present invention.

For example, regarding the amorphous state and the crystalline state described in the embodiment above, the whole region under a memory operation is not necessary to be put in these states evenly, and crystal grains may be present in a region put in the amorphous state or an amorphous portion may be present in a region put in the crystalline state. That is, a resistance value can be changed according to change between a state including relatively much amorphous portion and a state including relatively little amorphous portion.

Such a fact that chalcogenide material (a recording layer) with the composition described in the embodiment is material having crystallization involving crystalline nucleation taking place instead of growth of crystal from an amorphous region can be known from a structure of a film. When at most three or more grains in a film thickness direction of a chalcogenide material layer, more preferably, at most six or more grains can be seen in the chalcogenide material film by the scanning electron microscope (SEM) or the transmission electron microscope (TEM), the chalcogenide material can be determined to be material having crystallization involving crystalline nucleation taking place. Even if the material has a composition in the composition range of the present invention, not only phase change but also resistance change may take place depending on the composition due to that atoms of metal or semi-metal or atom groups including them move according to electric field and a conductive path including a high concentration region thereof is formed and vanished. That is, unless crystal growth from outside to inside which is made difficult by addition of indium (In) is utilized as a mechanism of set, only phase change caused by crystalline nucleation and growth from cores is not necessarily used as the mechanism of set.

INDUSTRIAL APPLICABILITY

The present invention is suitably applied to a semiconductor device including, for example a phase change memory.

The invention claimed is:

1. A semiconductor device comprising a memory element including a recording layer, and a first electrode and a second electrode formed on both surfaces of the recording layer, respectively, the memory element being formed on a semiconductor substrate, wherein
the recording layer is formed of material containing indium in a range from 20 atomic % to 38 atomic %, germanium in a range from 9 atomic % to 28 atomic %, antimony in a range from 3 atomic % to 18 atomic %, and tellurium in a range from 42 atomic % to 63 atomic %.

2. The semiconductor device according to claim 1, wherein the content of germanium in the recording layer is equal to or larger than the content of antimony.

3. The semiconductor device according to claim 1, wherein a sum of the contents of tellurium and indium in the recording layer is in a range from 62 atomic % to 80 atomic %.

4. The semiconductor device according to claim 1, wherein the content of antimony in the recording layer is larger than or equal to 5 atomic %.

5. The semiconductor device according to claim 1, wherein an interface layer is formed between the second electrode and the recording layer.

6. The semiconductor device according to claim 5, wherein the interface layer is formed of metal oxide or metal nitride.

7. The semiconductor device according to claim 5, wherein the interface layer is formed of tantalum oxide or chromium oxide.

8. The semiconductor device according to claim 1, wherein,
after the semiconductor device causes the memory element to store information, solder reflow process is performed to the semiconductor device.

9. The semiconductor device according to claim 1, wherein mounting of the semiconductor device is performed using lead-free solder.

10. The semiconductor device according to claim 1, wherein
information is stored in the memory element according to a high-resistance state where an electric resistance value of the recording layer is high and a low-resistance state where the electric resistance value of the recording layer is low.

11. The semiconductor device according to claim 1, wherein
information is stored in the memory element according to change of atomic arrangement in the recording layer.

12. The semiconductor device according to claim 1, wherein
the memory element is a phase change memory.

13. A semiconductor device comprising a memory element including a recording layer, and a first electrode and a second electrode formed on both surfaces of the recording layer, respectively, the memory element being formed on a semiconductor substrate, wherein
the recording layer is formed of chalcogenide material having an average composition in a film thickness direction of the recording layer represented by $In_\alpha Ge_X Sb_Y Te_Z$, where $0.20 \leq \alpha \leq 0.38$, $0.09 \leq X \leq 0.28$, $0.03 \leq Y \leq 0.18$, $0.42 \leq Z \leq 0.63$, and $\alpha+X+Y+Z=1$.

14. A semiconductor device comprising:
a semiconductor substrate;
a first insulating film formed on the semiconductor substrate;
a bottom contact electrode buried within an opening formed in the first insulating film;
an interface layer formed on the first insulating film in which the bottom contact electrode is buried;
a recording layer formed of a chalcogenide layer formed on the interface layer; and
an upper contact electrode formed on the recording layer, wherein
the recording layer is formed of material containing indium in a range from 20 atomic % to 38 atomic %, germanium in a range from 9 atomic % to 28 atomic %, antimony in a range from 3 atomic % to 18 atomic %, and tellurium in a range from 42 atomic % to 63 atomic %.

15. The semiconductor device according to claim 14, wherein the content of germanium in the recording layer is larger than or equal to the content of antimony.

16. The semiconductor device according to claim 14, wherein
the interface layer is formed of metal oxide or metal nitride.

17. The semiconductor device according to claim 14, wherein
the interface layer is formed of tantalum oxide or chromium oxide.

18. The semiconductor device according to claim 14, wherein,
after the semiconductor device causes the memory element to store information, solder reflow process is performed to the semiconductor device.

19. The semiconductor device according to claim 14, wherein
mounting of the semiconductor device is performed using lead-free solder.

* * * * *